(12) United States Patent
Sato et al.

(10) Patent No.: US 12,704,741 B2
(45) Date of Patent: Aug. 11, 2026

(54) LIQUID CRYSTAL DIFFRACTION ELEMENT, IMAGE DISPLAY APPARATUS, AND HEAD MOUNTED DISPLAY

(71) Applicant: FUJIFILM Corporation, Tokyo (JP)

(72) Inventors: Hiroshi Sato, Minamiashigara (JP); Naoyoshi Yamada, Minamiashigara (JP); Yukito Saitoh, Minamiashigara (JP); Takashi Yonemoto, Minamiashigara (JP)

(73) Assignee: FUJIFILM Corporation, Tokyo (JP)

( * ) Notice: Subject to any disclaimer, the term of this patent is extended or adjusted under 35 U.S.C. 154(b) by 375 days.

(21) Appl. No.: 18/482,072

(22) Filed: Oct. 6, 2023

(65) Prior Publication Data

US 2024/0036343 A1 Feb. 1, 2024

Related U.S. Application Data

(63) Continuation of application No. PCT/JP2022/017354, filed on Apr. 8, 2022.

(30) Foreign Application Priority Data

Apr. 9, 2021 (JP) ................................ 2021-066655

(51) Int. Cl.
*G02B 27/42* (2006.01)
*H10K 59/80* (2023.01)

(52) U.S. Cl.
CPC ......... *G02B 27/42* (2013.01); *H10K 59/8791* (2023.02)

(58) Field of Classification Search
None
See application file for complete search history.

(56) References Cited

U.S. PATENT DOCUMENTS

2007/0182915 A1* 8/2007 Osawa ................. G11B 7/1378
2013/0077040 A1 3/2013 Escuti et al.
(Continued)

FOREIGN PATENT DOCUMENTS

EP 3 546 992 A1 10/2019
JP 2010-525394 A 7/2010
(Continued)

OTHER PUBLICATIONS

International Preliminary Report on Patentability and English translation of the Written Opinion of the International Searching Authority (Forms PCT/IB/326, PCT/IB/373 and PCT/ISA/237) for International Application No. PCT/JP2022/017354, dated Oct. 19, 2023.
(Continued)

*Primary Examiner* — Robert E. Tallman
(74) *Attorney, Agent, or Firm* — Birch, Stewart, Kolasch & Birch, LLP

(57) ABSTRACT

There is provided a liquid crystal diffraction element in which chromatic aberration is small and diffraction efficiency is high in the liquid crystal diffraction element, and an image display apparatus and a head mounted display which use this diffraction element. The liquid crystal diffraction element includes an optically anisotropic layer that is formed of a liquid crystal composition containing a liquid crystal compound, where the optically anisotropic layer has a liquid crystal alignment pattern in which a direction of an optical axis derived from the liquid crystal compound changes while continuously rotating along at least one in-plane direction, and the optically anisotropic layer has at least a curved surface portion.

31 Claims, 13 Drawing Sheets

(56) References Cited

U.S. PATENT DOCUMENTS

| | | | | |
|---|---|---|---|---|
| 2018/0074315 | A1 | 3/2018 | Yanai et al. | |
| 2019/0377184 | A1* | 12/2019 | Sharp | G02B 5/3058 |
| 2021/0041610 | A1 | 2/2021 | Saitoh et al. | |
| 2021/0063760 | A1 | 3/2021 | Ishioka et al. | |
| 2021/0149095 | A1* | 5/2021 | Sato | G02B 1/11 |
| 2021/0149256 | A1 | 5/2021 | Sato et al. | |
| 2021/0208316 | A1 | 7/2021 | Sato et al. | |
| 2021/0302744 | A1 | 9/2021 | Saitoh et al. | |
| 2022/0283351 | A1* | 9/2022 | Shibata | C09J 133/066 |

FOREIGN PATENT DOCUMENTS

| | | | | |
|---|---|---|---|---|
| JP | 2017-187685 | A | 10/2017 | |
| WO | WO 2018/096879 | A1 | 5/2018 | |
| WO | WO 2019/017274 | A1 | 1/2019 | |
| WO | WO 2020/022501 | A1 | 1/2020 | |
| WO | WO-2020022504 | A1* | 1/2020 | G02B 5/18 |
| WO | WO 2020/066429 | A1 | 4/2020 | |
| WO | WO 2020/075702 | A1 | 4/2020 | |

OTHER PUBLICATIONS

International Search Report (Form PCT/ISA/210) for International Application No. PCT/JP2022/017354, dated Jun. 28, 2022, with English translation.

Japanese Office Action for corresponding Japanese Application No. 2023-513057, dated Mar. 10, 2026, with English translation.

Chinese Office Action and Search Report for corresponding Chinese Application No. 202280027327.0, dated Mar. 25, 2026, with English translation.

* cited by examiner

LIQUID CRYSTAL DIFFRACTION ELEMENT, IMAGE DISPLAY APPARATUS, AND HEAD MOUNTED DISPLAY

CROSS-REFERENCE TO RELATED APPLICATIONS

This application is a Continuation of PCT International Application No. PCT/JP2022/017354 filed on Apr. 8, 2022, which claims priority under 35 U.S.C. § 119(a) to Japanese Patent Application No. 2021-066655 filed on Apr. 9, 2021. The above applications are hereby expressly incorporated by reference, in their entirety, into the present application.

BACKGROUND OF THE INVENTION

1. Field of the Invention

The present invention relates to a liquid crystal diffraction element that diffracts incident light, and an image display apparatus and a head mounted display which use the liquid crystal diffraction element.

2. Description of the Related Art

An optical element that controls a direction of light is used in various optical devices or systems.

For example, the optical element that controls a direction of light is used in various optical devices that display a virtual projected image, various information, or the like to be superimposed on a backlight of a liquid crystal display device and a scene that is actually being viewed, for example, a head mounted display (HMD) such as Augmented Reality (AR) glasses, Virtual Reality (VR) glasses, or Mixed Reality (MR) glasses, a projector, a head up display (HUD), a beam steering device, or a sensor for detecting a thing or measuring the distance to a thing.

As the optical element that controls a direction of light, a liquid crystal diffraction element including an optically anisotropic layer that is formed of a liquid crystal composition containing a liquid crystal compound is proposed.

JP2010-525394A discloses a polarization diffraction grating including a substrate and a first polarization diffraction grating layer on the substrate. The first polarization diffraction grating layer includes a molecular structure that is twisted according to a first twist sense over a first thickness defined between opposing faces of the first polarization diffraction grating layer. JP2010-525394A describes that the polarization diffraction grating layer can align liquid crystal molecules in a predetermined alignment pattern to diffract light.

SUMMARY OF THE INVENTION

However, a liquid crystal diffraction element that changes a liquid crystal alignment pattern in a plane to diffract light is expected to be applied as an optical member for various optical devices. However, the liquid crystal diffraction element that changes a liquid crystal alignment pattern in a plane to diffract light has a problem that a difference in the diffraction angle for each wavelength increases in a case where the diffraction angle increases, and thus the chromatic aberration increases. In particular, there is a problem that a difference in the diffraction angle for each wavelength increases as the diffraction angle increases, and thus the chromatic aberration increases. In addition, in the liquid crystal diffraction element, there is a problem that in a case where the diffraction angle increases, the diffraction efficiency decreases, that is, the intensity of diffracted light decreases.

An object of the present invention is to solve such problems of the related art and to provide a liquid crystal diffraction element in which chromatic aberration is small and diffraction efficiency is high in the liquid crystal diffraction element, and an image display apparatus and a head mounted display which use this diffraction element.

For solving the above problems, the present invention has the following configurations.

[1] A liquid crystal diffraction element comprising:

an optically anisotropic layer that is formed of a liquid crystal composition containing a liquid crystal compound, in which the optically anisotropic layer has a liquid crystal alignment pattern in which a direction of an optical axis derived from the liquid crystal compound changes while continuously rotating along at least one in-plane direction, and the optically anisotropic layer has at least a curved surface portion.

[2] The liquid crystal diffraction element according to [1], in which in an image captured by observing a cross section of the optically anisotropic layer with a scanning electron microscope, the cross sections being cut in a thickness direction along the one in-plane direction, the optically anisotropic layer has bright portions and dark portions, which extend from one main surface to the other main surface, and has a region in which in the thickness direction, the dark portions are tilted with respect to the main surface.

[3] The liquid crystal diffraction element according to [1] or [2], in which in an image captured by observing a cross section of the optically anisotropic layer with a scanning electron microscope, the cross sections being cut in a thickness direction along the one in-plane direction, the optically anisotropic layer has bright portions and dark portions, which extend from one main surface to the other main surface, and the dark portions have one or more inflection points of angle.

[4] The liquid crystal diffraction element according to any one of [1] to [3], in which in an image captured by observing a cross section of the optically anisotropic layer with a scanning electron microscope, the cross sections being cut in a thickness direction along the one in-plane direction, the optically anisotropic layer has bright portions and dark portions, which extend from one main surface to the other main surface, and the dark portions have two or more inflection points of angle.

[5] The liquid crystal diffraction element according to any one of [1] to [4], in which in the liquid crystal alignment pattern, in a case where a length over which the direction of the optical axis derived from the liquid crystal compound rotates by 180° in a plane is set as a single period, regions in which lengths of the single periods are different from each other are provided in a plane direction.

[6] The liquid crystal diffraction element according to [5], in which a region in which the length of the single period in the liquid crystal alignment pattern gradually changes along the one in-plane direction is provided.

[7] The liquid crystal diffraction element according to [3] or [4], in which in an image captured by observing a cross section of the optically anisotropic layer with a scanning electron microscope, the cross sections being cut in a thickness direction along the one in-plane direction, the optically anisotropic layer has bright portions and dark portions, which extend from one main surface to the other main surface, and has regions in which tilt directions of the dark portions of the optically anisotropic layer are different from each other in a plane direction.

[8] The liquid crystal diffraction element according to any one of [3], [4], and [7], in which a region in which an average tilt angle of the dark portion gradually changes along the one in-plane direction is provided.

[9] The liquid crystal diffraction element according to any one of [3], [4], [7], and [8], in which in the liquid crystal alignment pattern, in a case where a length over which the direction of the optical axis derived from the liquid crystal compound rotates by 180° in a plane is set as a single period, a region in which an average tilt angle of the dark portion increases as the length of the single period decreases is provided in a plane direction.

[10] The liquid crystal diffraction element according to any one of [1] to [9], in which in the liquid crystal alignment pattern of the optically anisotropic layer, the one direction in which the direction of the optical axis derived from the liquid crystal compound changes while continuously rotating is provided in a radial shape directed from an inner side toward an outer side.

[11] The liquid crystal diffraction element according to [10], in which in an image captured by observing a cross section of the optically anisotropic layer with a scanning electron microscope, the cross sections being cut in a thickness direction along the one in-plane direction, the optically anisotropic layer has bright portions and dark portions, which extend from one main surface to the other main surface, and in the optically anisotropic layer, shapes of the bright portions and the dark portions in a cross section of a radial center portion are symmetrical with respect to the center line of the optically anisotropic layer in the thickness direction, and shapes of the bright portions and the dark portions in a cross section of a radial end part are asymmetrical with respect to the center line of the optically anisotropic layer in the thickness direction.

[12] The liquid crystal diffraction element according to [10], in which in an image captured by observing a cross section of the optically anisotropic layer with a scanning electron microscope, the cross sections being cut in a thickness direction along the one in-plane direction, the optically anisotropic layer has bright portions and dark portions, which extend from one main surface to the other main surface, and in the optically anisotropic layer, shapes of the bright portions and the dark portions in a cross section of a radial center portion are asymmetrical with respect to the center line of the optically anisotropic layer in the thickness direction, and shapes of the bright portions and the dark portions in a cross section of a radial end part are asymmetrical with respect to the center line of the optically anisotropic layer in the thickness direction.

[13] The liquid crystal diffraction element according to any one of [1] to [12], in which in the optically anisotropic layer, the liquid crystal compound is cholesterically aligned in a thickness direction.

[14] The liquid crystal diffraction element according to any one of [1] to [13], in which a refractive index difference $\Delta n_{550}$ associated with a refractive index anisotropy of the optically anisotropic layer is 0.2 or more.

[15] The liquid crystal diffraction element according to any one of [1] to [14], in which at least a part of the optically anisotropic layer in a plane has the curved surface portion having a curvature radius of 20 mm to 2,500 mm.

[16] The liquid crystal diffraction element according to any one of [1] to [15], in which the liquid crystal diffraction element consists of a substrate having at least a curved surface portion and the optically anisotropic layer which is disposed on a substrate and has a curved surface portion along the curved surface portion of the substrate.

[17] The liquid crystal diffraction element according to [16], in which the substrate, an alignment film, and the optically anisotropic layer are disposed in this order.

[18] The liquid crystal diffraction element according to [16] or [17], in which the substrate, an adhesive layer, and the optically anisotropic layer are disposed in this order.

[19] An optical element comprising:

the liquid crystal diffraction element according to any one of [1] to [18]; and a retardation layer having at least a curved surface portion.

[20] The optical element according to [19], in which the retardation layer has a/4 phase difference.

[21] The optical element according to [19] comprising:

a linear polarizer having at least a curved surface portion, and the liquid crystal diffraction element according to any one of [1] to [18].

[22] The optical element according to [21], comprising in the following order:

the liquid crystal diffraction element;

a retardation layer; and the linear polarizer.

[23] The optical element according to [21], comprising in the following order:

the liquid crystal diffraction element;

a first retardation layer;

the linear polarizer; and a second retardation layer.

[24] The optical element according to [21], comprising in the following order:

a first linear polarizer;

a first retardation layer;

the liquid crystal diffraction element;

a second retardation layer; and a second linear polarizer.

[25] The optical element according to [21], comprising in the following order:

a first linear polarizer;

a first retardation layer;

the liquid crystal diffraction element;

a second retardation layer;

a second linear polarizer; and a third retardation layer.

[26] An image display apparatus comprising:

the liquid crystal diffraction element according to any one of [1] to [18]; and a display panel.

[27] The image display apparatus according to [26], in which the display panel has at least a curved surface portion.

[28] Ahead mounted display comprising:

the image display apparatus according to any one of [26] and [27].

According to the present invention, it is possible to solve such problems of the related art and to provide a liquid crystal diffraction element in which chromatic aberration is small and diffraction efficiency is high in the liquid crystal diffraction element, and an image display apparatus and a head mounted display which use this diffraction element.

DESCRIPTION OF THE PREFERRED EMBODIMENTS

Hereinafter, a liquid crystal diffraction element, an image display apparatus, and a head mounted display according to the embodiment of the present invention will be described in detail with reference to suitable embodiments shown in the accompanying drawings.

In the present specification, a numerical value range represented by "to" means a range including numerical values before and after "to" as a lower limit value and an upper limit value.

In the present specification, "(meth)acrylate" is used to mean "any one or both of acrylate and methacrylate".

In the present specification, visible light refers to light that can be observed by human eyes among electromagnetic waves and refers to light in a wavelength range of 380 to 780 nm. Invisible light is light in a wavelength range of less than 380 nm and in a wavelength range of more than 780 nm.

In the present specification, Re(λ) represents an in-plane retardation at a wavelength λ. Unless otherwise specified, the wavelength λ refers to 550 nm.

In this specification, Re(λ) is a value measured at the wavelength λ using AxoScan (manufactured by Axometrics, Inc.). In a case of inputting an average refractive index ((nx+ny+nz)/3) and a film thickness (d (m)) to AxoScan, the following slow axis direction can be calculated.

Slow axis direction (°)

$$Re(\lambda)=R0(\lambda)$$

It is noted that R0(λ) is expressed as a numerical value calculated by AxoScan and means Re(λ).

Liquid Crystal Diffraction Element

The liquid crystal diffraction element according to the embodiment of the present invention is;

a liquid crystal diffraction element including an optically anisotropic layer that is formed of a liquid crystal composition containing a liquid crystal compound, in which the optically anisotropic layer has a liquid crystal alignment pattern in which a direction of an optical axis derived from the liquid crystal compound changes while continuously rotating along at least one in-plane direction, and the optically anisotropic layer has at least a curved surface portion.

Figure 1:
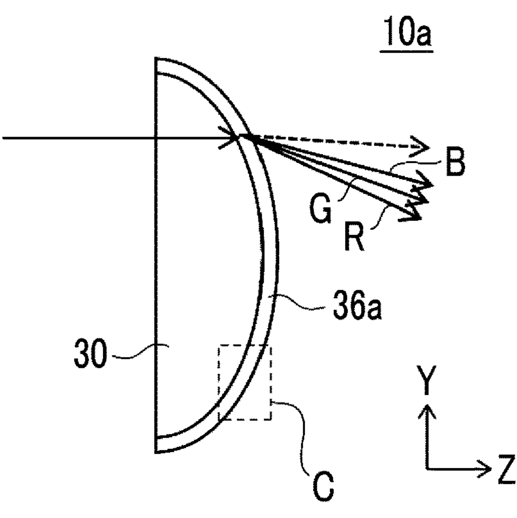
FIG. 1 is a view conceptually showing an example of a liquid crystal diffraction element according to the present invention.
Figure 2:
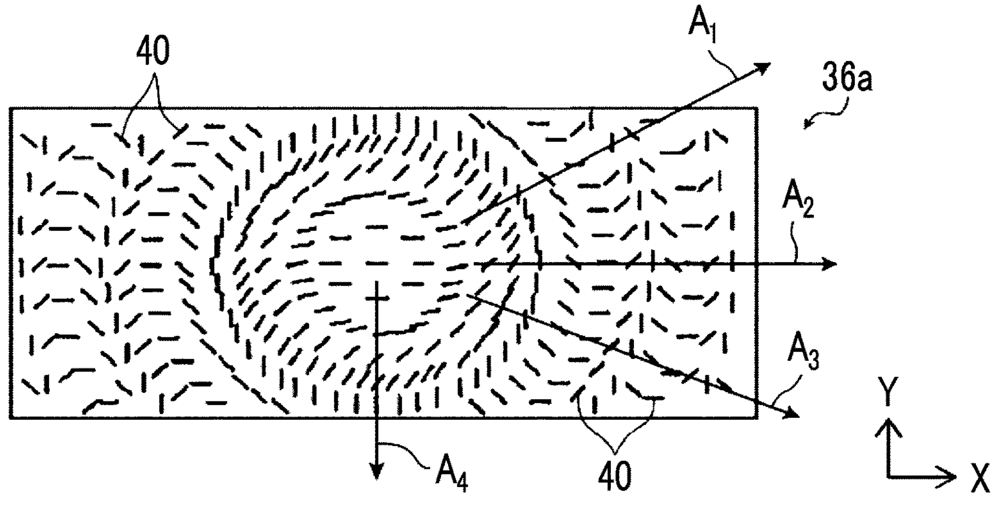
FIG. 2 is a plan view of an optically anisotropic layer shown in FIG. 1.

FIG. 1 conceptually shows an example of the liquid crystal diffraction element according to the embodiment of the present invention. FIG. 2 shows a front view (a view in which FIG. 1 is viewed from the right side) of an optically anisotropic layer included in the liquid crystal diffraction element of FIG. 1.

A liquid crystal diffraction element 10*a* shown in FIG. 1 and FIG. 2 includes an optically anisotropic layer 36*a* that is formed of a composition containing a liquid crystal compound and includes a support 30.

One surface of the support 30 has a curved surface shape. In the example shown in the drawing, the curved surface shape of the support 30 is a substantially spherical crown shape and is a convex curved surface.

The optically anisotropic layer 36*a* is disposed in the curved surface portion of the support 30.

The support may have any shape as long as the surface on which the optically anisotropic layer is disposed can support the optically anisotropic layer, and it is preferable that the surface on which the optically anisotropic layer is disposed substantially matches with the curved surface shape of the optically anisotropic layer.

Figure 3:
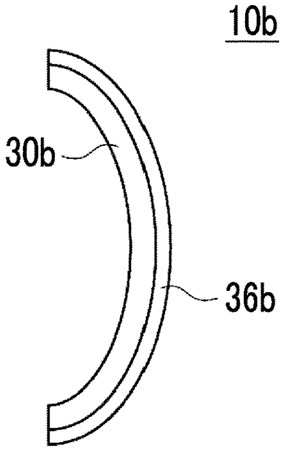
FIG. 3 is a view conceptually showing another example of the liquid crystal diffraction element according to the present invention.

In addition, although the surface of the support 30 opposite to the surface on which the optically anisotropic layer 36*a* is disposed has a planar shape in the example shown in FIG. 1, the present invention is not limited thereto. For example, as in a support 30*b* included in the liquid crystal diffraction element 10*b* shown in FIG. 3, a surface opposite to the surface on which the optically anisotropic layer 36*a* is disposed may have a curved surface shape curved in the substantially same shape as the surface on which the optically anisotropic layer 36*a* is disposed.

The optically anisotropic layer 36*a* is disposed to be curved along the curved surface portion of the support 30. That is, the optically anisotropic layer 36*a* has at least a curved surface portion. In the example shown in FIG. 1, the entire region of the optically anisotropic layer 36*a* is a curved surface portion, and the optically anisotropic layer 36*a* has a curved surface having a substantially spherical crown shape, which is convex on the side opposite to the support 30.

The optically anisotropic layer 36*a* is formed of a composition containing a liquid crystal compound and has a predetermined liquid crystal alignment pattern in which an optical axis derived from the liquid crystal compound changes while continuously rotating along at least one in-plane direction.

In the example shown in FIG. 2, the liquid crystal alignment pattern of the optically anisotropic layer 36*a* is a pattern having a radial shape, in which one direction (each of arrows $A_1$ to $A_4$) in which a direction of an optical axis derived from a liquid crystal compound 40 changes while continuously rotating is provided in a radial shape directed from an inner side toward an outer side. This pattern is a pattern in which a line that connects liquid crystal compounds of which optical axes face the same direction has a circular shape and circular line segments have a concentric circular shape.

In the optically anisotropic layer 36*a* shown in FIG. 2, the optical axis (not shown) of the liquid crystal compound 40 is a longitudinal direction of the liquid crystal compound 40.

In the optically anisotropic layer 36*a* shown in FIG. 2, the direction of the optical axes of the liquid crystal compounds 40 continuously changes rotationally along multiple directions from the center of the optically anisotropic layer 36*a* toward the outer side, for example, a direction indicated by an arrow $A_1$, a direction indicated by an arrow $A_2$, a direction indicated by an arrow $A_3$, a direction indicated by an arrow $A_4$, and so on. The arrow $A_1$, the arrow $A_2$, the arrow $A_3$, and the arrow $A_4$ are arrangement axes described later.

In FIG. 2, in a case where the direction along the arrow $A_2$ is denoted as the X direction and the direction along the arrow $A_4$ orthogonal to the X direction is denoted as the Y direction, FIG. 1 is a cross-sectional view taken along the Y direction (the arrow $A_4$).

As will be described in detail later, the optically anisotropic layer 36*a* has a predetermined liquid crystal alignment pattern in which an optical axis derived from the liquid crystal compound changes while continuously rotating along at least one in-plane direction, and thus, in a case of transmitting incident light, it has an action of diffusing (bending) the incident light so that the azimuth direction is directed in a direction along the one in-plane direction. In the liquid crystal alignment pattern, such an action of diffraction due to the optically anisotropic layer 36*a* depends on a length (a single period Λ) over which a direction of an optical axis derived from the liquid crystal compound rotates by 180° in a plane, and the diffraction angle increases as the single period Λ decreases.

In the example shown in FIG. 2, the optically anisotropic layer 36*a* has a radial liquid crystal alignment pattern, and thus it is possible to collect transmitted light in a case where the incident light is diffracted along each of the arrangement axes (A1 to $A_4$ and the like) so that the azimuth direction is directed toward the center side. Alternatively, it is possible to diffuse transmitted light in a case where the incident light is diffracted along each of the arrangement axes ($A_1$ to $A_4$) so that the azimuth direction is directed toward the outer side. Whether the transmitted light is diffracted toward the center side or diffracted toward the outer side depends on the polarized state of the incident light and the rotation direction of the optical axis in the liquid crystal alignment pattern. This point will be described later.

Here, in the liquid crystal diffraction element according to the embodiment of the present invention, the optically anisotropic layer 36*a* has a curved surface portion. In the example shown in FIG. 1, a curved surface that is convex toward the side opposite to the support 30 is provided. Due to such a shape, the optically anisotropic layer 36*a* acts as a so-called convex lens with respect to the light incident from the support 30 side. That is, the optically anisotropic layer 36*a* refracts the incident light depending on the shape of the curved surface portion so that the azimuth direction is directed toward the center side.

As a result, the liquid crystal diffraction element according to the embodiment of the present invention refracts light by the action of both the diffraction of light due to the action of the liquid crystal alignment pattern included in the optically anisotropic layer 36*a* and the refraction of light due to the action of the curved surface portion of the optically anisotropic layer 36*a*. For example, in the examples shown in FIG. 1 and FIG. 2, the incident light is collected by the radial liquid crystal alignment pattern, and the light is collected by the action of the convex lens due to the curved surface portion of the optically anisotropic layer 36*a*. That is, the azimuth direction of the diffraction due to the liquid crystal alignment pattern and the azimuth direction of the refraction of light due to the curved surface portion of the optically anisotropic layer 36*a* substantially matches with each other.

Figure 24:
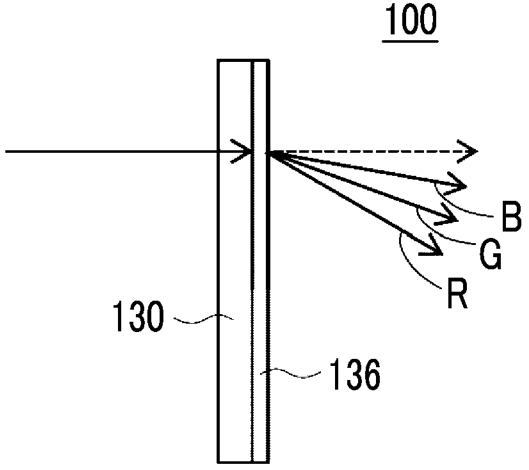
FIG. 24 is a conceptual view for describing an action of a liquid crystal diffraction element in the related art.

Here, as shown in FIG. 24, in a case where the optically anisotropic layer 136 having a liquid crystal alignment pattern is a liquid crystal diffraction element 100 having a flat shape, there is a problem that chromatic aberration occurs in a case of diffracting the incident light since the diffraction angle changes depending on the wavelength as indicated by the arrows of R, G, and B. In particular, in a case where the diffraction angle increases, a difference in the diffraction angle for each wavelength increases, and thus the chromatic aberration is further increases. In addition, in a case where the diffraction angle is increased, there is a problem that such zero-order light as indicated by the arrow of the dotted line in FIG. 24 which is transmitted without being diffracted increases, and the diffraction efficiency is reduced.

On the other hand, as described above, the liquid crystal diffraction element according to the embodiment of the present invention refracts light by the action of both the diffraction of light due to the action of the liquid crystal alignment pattern included in the optically anisotropic layer 36*a* and the refraction of light due to the action of the curved surface portion of the optically anisotropic layer 36*a*. In order to diffract light by superimposing these two actions, the diffraction angle in the liquid crystal diffraction element according to the embodiment of the present invention is to be a substantially total angle of the diffraction angle of light due to the liquid crystal alignment pattern of the optically anisotropic layer 36*a* and the refraction angle of light due to the action of the curved surface portion of the optically anisotropic layer 36*a*. It is noted that in the present specification, the diffraction of light due to the liquid crystal alignment pattern and the refraction of light due to the curved surface portion are also collectively referred to as "diffraction" due to the liquid crystal diffraction element.

Therefore, in a case where the optically anisotropic layer 36*a* has a flat shape and light is diffracted at the same angle as in a case where the light is diffracted only by the diffraction action of light due to the liquid crystal alignment pattern, the liquid crystal diffraction element according to the embodiment of the present invention can further decrease the diffraction angle of light due to the liquid crystal alignment pattern. Therefore, a difference in diffraction angle for each wavelength decreases, which can reduce chromatic aberration. In addition, since the liquid crystal diffraction element according to the embodiment of the present invention can further decrease the diffraction angle of light due to the liquid crystal alignment pattern, it is possible to reduce the zero-order light, and it is possible to increase the diffraction efficiency.

In addition, the diffraction angle of light due to the liquid crystal alignment pattern of the optically anisotropic layer 36*a* increases as the wavelength of light increases. On the other hand, the refraction angle of light due to the curved surface portion of the optically anisotropic layer 36*a* increases as the wavelength of light decreases. That is, there is an inversive wavelength dependence between the diffraction of light due to the liquid crystal alignment pattern and the refraction of light due to the curved surface portion. For example, in the light having a long wavelength, the diffraction angle increases due to the action of the liquid crystal alignment pattern of the optically anisotropic layer 36*a*, whereas the refraction angle decreases due to the action of the curved surface portion. On the other hand, in the light having a short wavelength, the diffraction angle decreases due to the action of the liquid crystal alignment pattern of the optically anisotropic layer 36*a*, whereas the refraction angle increases due to the action of the curved surface portion. Therefore, the difference in the total diffraction angle due to the two actions is small between the long-wavelength light and the short-wavelength light. That is, it is possible to cancel out, with each other, the chromatic aberration associated with the diffraction of light due to the liquid crystal alignment pattern of the optically anisotropic layer 36*a* and the chromatic aberration associated with the refraction of light due to the curved surface portion of the optically anisotropic layer 36*a*, and it is possible to further reduce the chromatic aberration in the diffraction of light due to the liquid crystal diffraction element according to the embodiment of the present invention.

It is noted that in the example shown in FIG. 1, although the liquid crystal diffraction element 10*a* has, as a suitable aspect, a configuration in which the support 30 is provided, the liquid crystal diffraction element 10*a* is not limited thereto, and it suffices that at least the optically anisotropic layer 36*a* is provided. In addition, an alignment film that aligns the liquid crystal compound 40 in the optically anisotropic layer 36*a* in a predetermined liquid crystal alignment pattern may be provided between the support 30 and the optically anisotropic layer 36*a*.

In addition, in the example shown in FIG. 1, although the optically anisotropic layer 36*a* included in the liquid crystal diffraction element 10*a* has a convex and substantially spherical crown shape on the side opposite to the support 30, the optically anisotropic layer 36*a* is not limited thereto, the present invention is not limited thereto, and it suffices that a shape having an action of refracting incident light is provided.

The curvature radius or the like of the curved surface portion of the optically anisotropic layer 36*a* may be set as appropriate according to a magnitude of chromatic aberration associated with the diffraction of light due to the liquid crystal alignment pattern of the optically anisotropic layer 36*a*, an optical element of the device, a size of an image display apparatus, and the like. The curvature radius of the curved surface portion of the optically anisotropic layer 36*a* is preferably 20 mm to 2,500 mm, more preferably 20 mm to 1,000 mm, and still more preferably 30 mm to 200 mm. In addition, the curvature radius of the curved surface portion of the optically anisotropic layer 36*a* may be constant, or the curvature radius may differ in the plane direction.

Figure 4:
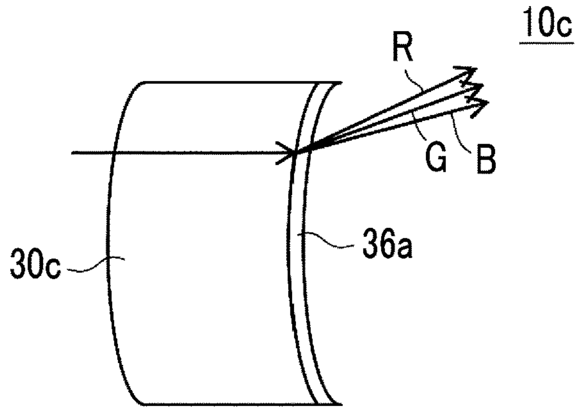
FIG. 4 is a view conceptually showing another example of the liquid crystal diffraction element according to the present invention.

FIG. 4 shows another example of the liquid crystal diffraction element according to the embodiment of the present invention. A liquid crystal diffraction element 10*c* shown in FIG. 4 has a support 30*c* and the optically anisotropic layer 36*a*.

In the support 30*c*, a surface on which the optically anisotropic layer 36*a* is disposed is a curved surface having a concave and substantially spherical crown shape.

The optically anisotropic layer 36*a* is disposed on the curved surface of the support 30*c* and has a substantially spherical crown shape which is concave on the side opposite to the support 30*c*, that is, a shape that acts as a so-called concave lens. Due to such a shape, the optically anisotropic layer 36*a* acts as a so-called concave lens with respect to the light incident from the support 30 side. That is, the optically anisotropic layer 36*a* refracts (diffuses) the incident light depending on the shape of the curved surface portion so that the azimuth direction is directed toward the outer side.

In a case of the liquid crystal diffraction element 10*c* shown in FIG. 4, the optically anisotropic layer 36*a* has a radial liquid crystal alignment pattern as in the example shown in FIG. 2 and has an action of diffusing the incident light with the radial liquid crystal alignment pattern. As a result, the liquid crystal diffraction element 10*c* refracts light to be diffused by the action of both the diffraction of light due to the action of the liquid crystal alignment pattern included in the optically anisotropic layer 36*a* and the refraction of light due to the action of the curved surface portion of the optically anisotropic layer 36*a*.

In this way, even in the case of the liquid crystal diffraction element 10*c* shown in FIG. 4, since light is refracted by the action of both the diffraction of light due to the action of the liquid crystal alignment pattern included in the optically anisotropic layer 36*a* and the refraction of light due to the action of the curved surface portion of the optically anisotropic layer 36*a*, the chromatic aberration can be reduced, and the diffraction efficiency can be increased.

Alternatively, for example, the optically anisotropic layer included in the liquid crystal diffraction element may have a semicylindrical curved surface portion that is curved in one direction. In this case, the incident light is refracted in a direction along the curving direction due to the action of the curved surface portion. Accordingly, the optically anisotropic layer has a liquid crystal alignment pattern in which a direction of an optical axis derived from the liquid crystal compound changes while continuously rotating in at least one in-plane direction, and this one direction, that is, the direction of the arrangement axis configured to be parallel to the curving direction of the curved surface portion.

In this way, in the liquid crystal diffraction element according to the embodiment of the present invention, it is preferable to set the azimuth direction of the diffraction due to the liquid crystal alignment pattern of the optically anisotropic layer to be substantially parallel to the azimuth direction of the refraction due to the curved surface portion of the optically anisotropic layer. That is, it is preferable that the direction of the arrangement axis of the liquid crystal alignment pattern of the optically anisotropic layer is substantially parallel to the curving direction of the curved surface portion. It is noted that it suffices that the azimuth direction of the diffraction due to the liquid crystal alignment pattern of the optically anisotropic layer and the azimuth direction of the refraction due to the curved surface portion of the optically anisotropic layer are not orthogonal to each other, which are preferably closer to parallel and more preferably substantially parallel from the viewpoint of reducing chromatic aberration and increasing diffraction efficiency.

Figure 5:
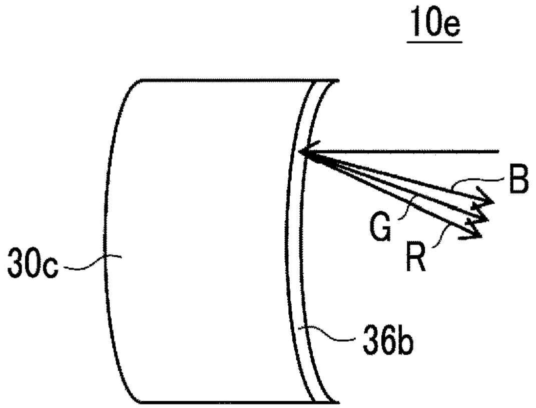
FIG. 5 is a view conceptually showing another example of the liquid crystal diffraction element according to the present invention.

Here, in the examples shown in FIG. 1 and FIG. 4, the optically anisotropic layer 36*a* transmits and diffracts light; however, the optically anisotropic layer 36*a* is not limited thereto. The optically anisotropic layer may be an optically anisotropic layer that reflects and diffracts light. FIG. 5 shows another example of the liquid crystal diffraction element according to the embodiment of the present invention.

A liquid crystal diffraction element 10*e* shown in FIG. 5 has a support 30*c* and the optically anisotropic layer 36*b*. The support 30*c* has the same configuration as the support 30*c* of the liquid crystal diffraction element 10*c* shown in FIG. 4. That is, In the support 30*c*, a surface on which the optically anisotropic layer 36*b* is disposed is a curved surface having a concave and substantially spherical crown shape.

The optically anisotropic layer 36*b* is disposed on the curved surface of the support 30*c* and has a substantially spherical crown shape which is concave on the side opposite to the support 30*c*.

The optically anisotropic layer 36*b* has a liquid crystal alignment pattern in which a direction of an optical axis derived from the liquid crystal compound changes while continuously rotating along at least one in-plane direction. Here, in the optically anisotropic layer 36*b*, the liquid crystal compound is cholesterically aligned in the thickness direction and reflects the incident light having the selective reflection wavelength. That is, the optically anisotropic layer 36*b* reflects the incident light while diffracting it. Accordingly, for example, in a case where the optically anisotropic layer 36*b* has a radial liquid crystal alignment pattern as in the example shown in FIG. 2, it is possible to collect reflected light in a case where the incident light is diffracted toward the center side along each of the arrangement axes ($A_1$ to $A_4$ and the like). The optically anisotropic layer 36*b* that diffracts light while reflecting it will be described in detail later.

In addition, due to having a concave and substantially spherical crown shape, the optically anisotropic layer 36*b* acts as a so-called concave mirror with respect to the light incident from the side opposite to the support 30*c*. That is, the optically anisotropic layer 36*b* reflects the incident light depending on the shape of the curved surface portion so that the azimuth direction is directed toward the center side.

In this way, even in a case where light is reflected as in the liquid crystal diffraction element 10*e* shown in FIG. 5, light is refracted by the action of both the diffraction of light due to the action of the liquid crystal alignment pattern included in the optically anisotropic layer 36*b* and the refraction of light due to the action of the curved surface portion of the optically anisotropic layer 36*b*, and thus the chromatic aberration can be reduced, and the diffraction efficiency can be increased.

It is noted that in the following description, in a case where it is not necessary to distinguish the optically anisotropic layer 36*a* that transmits and diffracts light and the optically anisotropic layer 36*b* that reflects and diffracts light from each other, they are collectively referred to as the optically anisotropic layer 36.

(Transmissive-Type Optically Anisotropic Layer)

The optically anisotropic layer 36*a* that transmits and diffracts light will be described with reference to FIG. 6 and FIG. 7.

Figure 6:
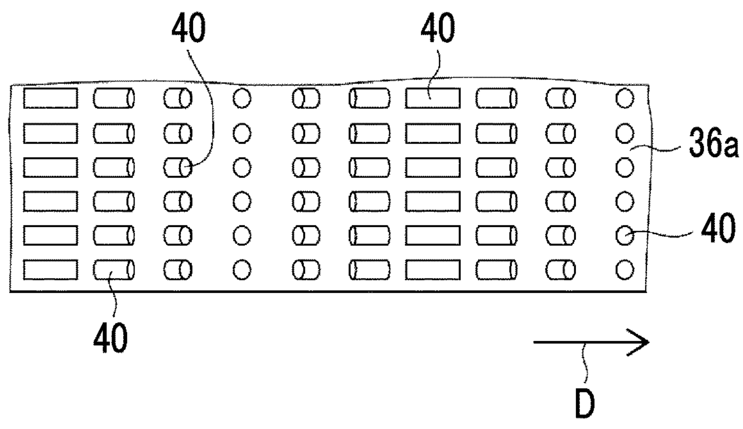
FIG. 6 is a partially enlarged cross-sectional view of an optically anisotropic layer shown in FIG. 1.
Figure 7:
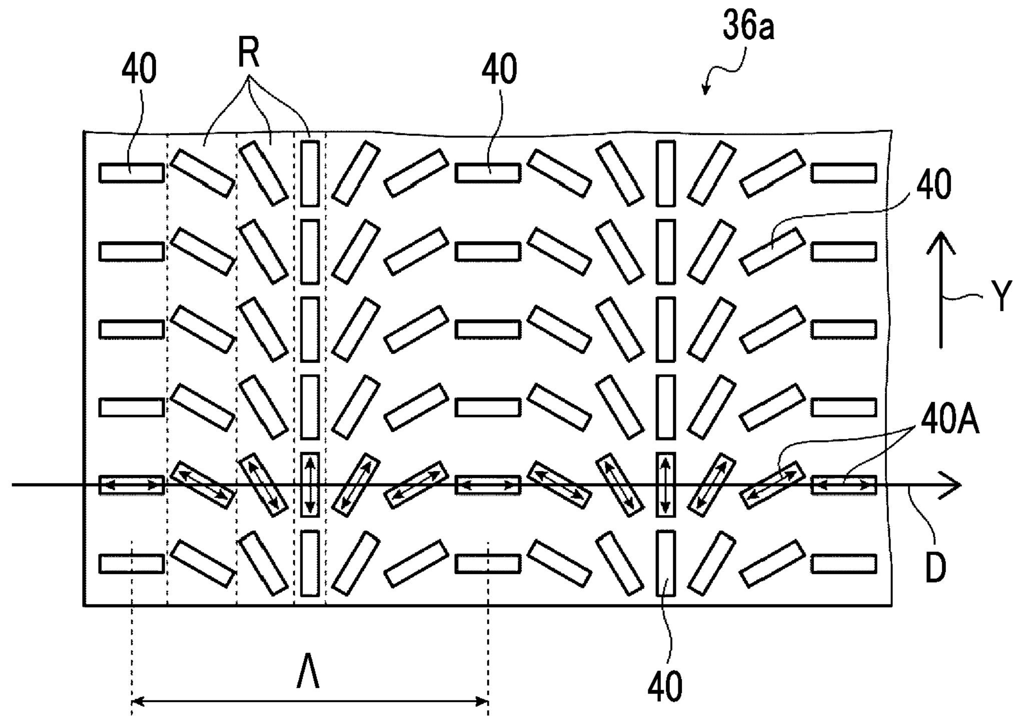
FIG. 7 is a partially enlarged plan view showing the optically anisotropic layer shown in FIG. 6.

The examples shown in FIG. 6 and FIG. 7 are optically anisotropic layers which are obtained by immobilizing a liquid crystal phase where a liquid crystal compound is aligned and has a liquid crystal alignment pattern in which a direction of an optical axis derived from the liquid crystal compound changes while continuously rotating along at least one in-plane direction.

In the example shown in FIG. 6, the optically anisotropic layer 36*a* is laminated on an alignment film 32 that is laminated on the support 30.

It is noted that in a case of being used as the liquid crystal diffraction element, the optically anisotropic layer 36*a* may be in a state of being laminated on the support 30 and the alignment film 32 as in the example shown in FIG. 6. That is, the liquid crystal diffraction element may have a configuration in which a substrate, an alignment film, and an optically anisotropic layer are disposed in this order. In this case, since the optically anisotropic layer 36*a* is formed directly on the alignment film 32 on the support 30, the support 30 has a curved surface portion. Alternatively, the liquid crystal diffraction element may be in a state where, for example, only the alignment film 32 and the optically anisotropic layer 36*a* are laminated after peeling off the support 30. Alternatively, the liquid crystal diffraction element may be in a state of, for example, only the optically anisotropic layer laminated after peeling off the support 30 and the alignment film 32.

In addition, after the optically anisotropic layer 36*a* is formed on a flat plate-shaped support (temporary support), the optically anisotropic layer 36*a* may be peeled and then adhered onto the support 30 having a curved surface portion by using an adhesive or a pressure sensitive adhesive to form a curved surface portion on the optically anisotropic layer 36*a*. That is, the liquid crystal diffraction element may have a configuration in which a substrate, an adhesive layer, and an optically anisotropic layer are disposed in this order. In this case, a configuration in which the support 30 having a curved surface portion, an adhesive layer, and the optically anisotropic layer 36*a* are provided may be adopted, or a configuration in which the support 30 having a curved surface portion, an adhesive layer, the alignment film 32, and the optically anisotropic layer 36*a* are provided may be adopted.

<Support>

The support 30 supports the alignment film 32 and the optically anisotropic layer 36.

As the support 30, various sheet-shaped materials (films or plate-shaped materials) can be used as long as they can support the alignment film 32 and the optically anisotropic layer 36. As described above, it is preferable that the surface of the support 30 on which the optically anisotropic layer 36 is disposed has a shape capable of supporting the curved surface shape of the optically anisotropic layer 36.

The transmittance of the support 30 with respect to the light to be diffracted is preferably 50% or more, more preferably 70% or more, and still more preferably 85% or more.

The thickness of the support 30 is not particularly limited and may be appropriately set depending on the use application of the liquid crystal diffraction element, a material for forming the support 30, and the like in a range where the alignment film 32 and the optically anisotropic layer 36 can be supported.

The thickness of the support 30 is preferably 1 to 1,000 m, more preferably 3 to 250 m, and still more preferably 5 to 150 km.

The support 30 may have a single layer structure or a multi-layer structure.

In a case where the support 30 has a single layer structure, examples thereof include the support 30 formed of glass, triacetyl cellulose (TAC), polyethylene terephthalate (PET), polycarbonates, polyvinyl chloride, acryl, and polyolefin. In a case where the support 30 has a multi-layer structure, examples thereof include a support including, as a substrate, any one of the above-described supports having a single layer structure and including another layer that is provided on a surface of this substrate.

<Alignment Film>

The alignment film 32 is formed on the surface of the support 30.

The alignment film 32 is an alignment film for aligning the liquid crystal compound 40 to the predetermined liquid crystal alignment pattern during the formation of the optically anisotropic layer 36.

As described above, in the present invention, the optically anisotropic layer 36*a* has a liquid crystal alignment pattern in which a direction of an optical axis 40A (refer to FIG. 7) derived from the liquid crystal compound 40 changes while continuously rotating along one in-plane direction. Accordingly, the alignment film 32 is formed such that the optically anisotropic layer 36 can form the liquid crystal alignment pattern.

In the following description, "the direction of the optical axis 40A rotates" will also be simply referred to as "the optical axis 40A rotates".

As the alignment film 32, various known films can be used.

Examples of the alignment film include a rubbed film formed of an organic compound such as a polymer, an obliquely deposited film formed of an inorganic compound, a film having a microgroove, and a film formed by lamination of Langmuir-Blodgett (LB) films formed with a Langmuir-Blodgett's method using an organic compound such as $\omega$-tricosanoic acid, dioctadecylmethyl ammonium chloride, or methyl stearate.

The alignment film 32 formed by a rubbing treatment can be formed by rubbing a surface of a polymer layer with paper or fabric in a given direction multiple times.

The material to be used in the alignment film 32 is preferably polyimide, polyvinyl alcohol, a polymer having a polymerizable group described in JP1997-152509A (JP-H9-152509A), or a material for forming the alignment film 32 or the like, such a material as described in JP2005-97377A, JP2005-99228A, or JP2005-128503A.

In the optically anisotropic layer, the alignment film 32 can be suitably used as a so-called photo-alignment film which is obtained as the alignment film 32 by irradiating a photo-alignable material with polarized light or non-polarized light. That is, in the optically anisotropic layer, a photo-alignment film that is formed by applying a photo-alignment material to the support 30 is suitably used as the alignment film 32.

The irradiation of polarized light can be carried out in a direction perpendicular or oblique to the photo-alignment film, and the irradiation of non-polarized light can be carried out in a direction oblique to the photo-alignment film.

Preferred examples of the photo-alignment material used in the alignment film that can be that is used in the present invention include: an azo compound described in JP2006-285197A, JP2007-76839A, JP2007-138138A, JP2007-94071A, JP2007-121721A, JP2007-140465A, JP2007-156439A, JP2007-133184A, JP2009-109831A, JP3883848B, and JP4151746B; an aromatic ester compound described in JP2002-229039A; a maleimide- and/or alkenyl-substituted nadiimide compound having a photo-alignable unit described in JP2002-265541A and JP2002-317013A; a photo-crosslinkable silane derivative described in JP4205195B and JP4205198B, a photo-crosslinkable polyimide, a photo-crosslinkable polyamide, or a photo-crosslinkable polyester described in JP2003-520878A, JP2004-529220A, and JP4162850B; and a photodimerizable compound, in particular, a cinnamate compound, a chalcone compound, or a coumarin compound described in JP1997-118717A (JP-H9-118717A), JP1998-506420A (JP-H10-506420A), JP2003-505561A, WO2010/150748A, JP2013-177561A, and JP2014-12823A.

Among them, an azo compound, a photo-crosslinkable polyimide, a photo-crosslinkable polyamide, a photo-crosslinkable polyester, a cinnamate compound, or a chalcone compound is suitably used.

The thickness of the alignment film 32 is not particularly limited. The thickness with which a required alignment function can be obtained may be appropriately set depending on the material for forming the alignment film 32.

The thickness of the alignment film 32 is preferably 0.01 to 5 μm and more preferably 0.05 to 2 μm.

A method of forming the alignment film 32 is not limited. Any one of various known methods depending on the material for forming the alignment film 32 can be used. One example includes a method of applying the alignment film 32 onto a surface of the support 30, drying the applied alignment film 32, which is subsequently exposed with laser light to form an alignment pattern.

Figure 8:
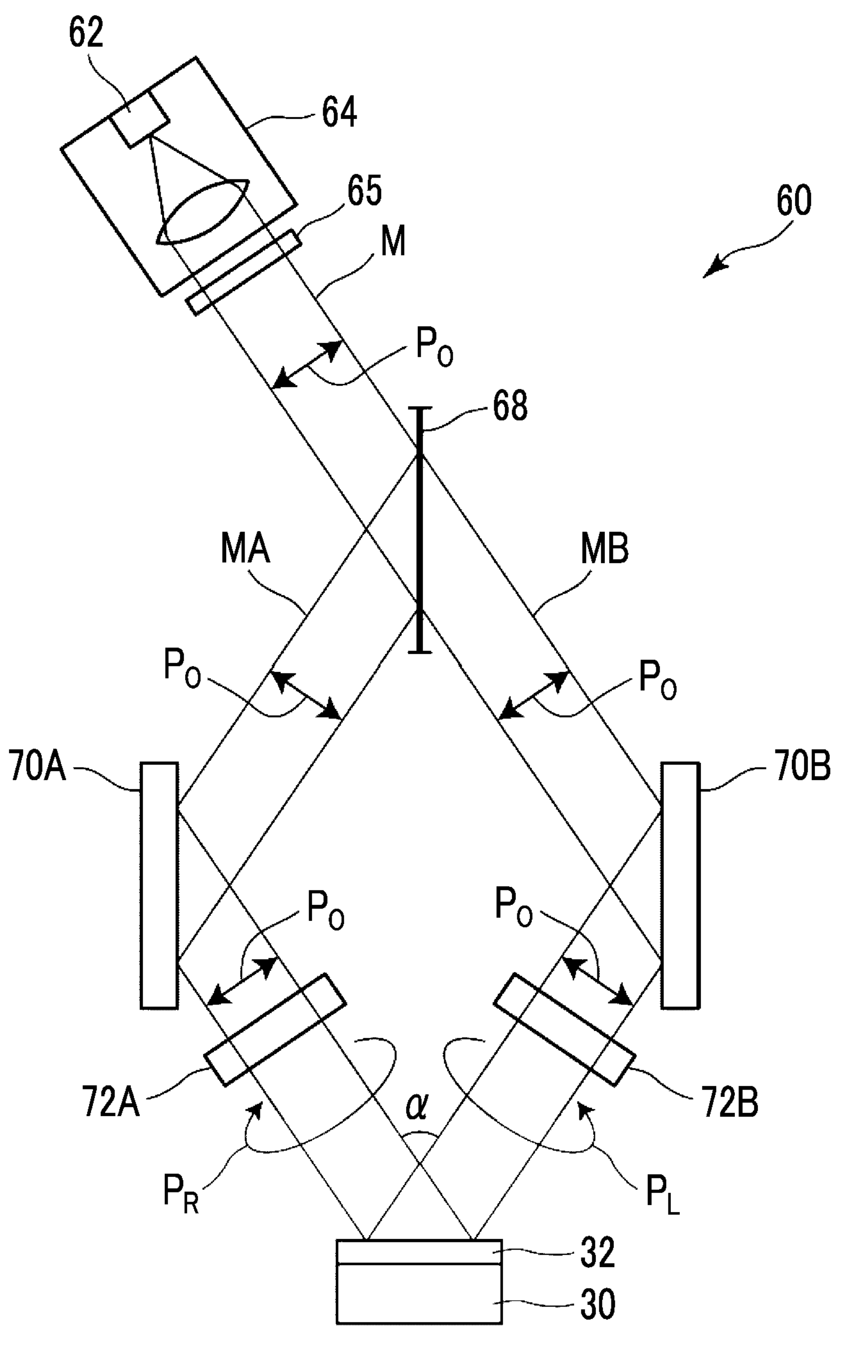
FIG. 8 is a view conceptually showing an example of an exposure device that exposes an alignment film.

FIG. 8 conceptually shows an example of an exposure device that exposes the alignment film 32 to form an alignment pattern.

An exposure device 60 shown in FIG. 8 includes: a light source 64 including a laser 62; an $\lambda/2$ plate 65 that changes the polarization direction of laser light M emitted from the laser 62; a polarization beam splitter 68 that splits the laser light M emitted from the laser 62 into two beams MA and MB; mirrors 70A and 70B that are disposed on optical paths of the two split beams MA and MB; and λ/4 plates 72A and 72B.

The light source 64 emits linearly polarized light $P_0$. The λ/4 plate 72A converts the linearly polarized light $P_0$ (beam MA) into dextrorotatory circularly polarized light $P_R$, and the λ/4 plate 72B converts the linearly polarized light $P_0$ (beam MB) into levorotatory circularly polarized light $P_L$.

The support 30 including the alignment film 32 on which the alignment pattern is not yet formed is disposed at an exposed portion, the two beams MA and MB intersect and interfere with each other on the alignment film 32, and the alignment film 32 is irradiated with and exposed with the interference light.

Due to the interference in this case, the polarized state of light with which the alignment film 32 is irradiated periodically changes according to interference fringes. As a result, an alignment film (hereinafter, also referred to as "patterned alignment film") having an alignment pattern in which the alignment state changes periodically is obtained.

In the exposure device 60, in a case of changing an intersecting angle α between the two beams MA and MB, the period of the alignment pattern can be adjusted. That is, in a case of adjusting the intersecting angle α in the exposure device 60, in the alignment pattern in which the optical axis 40A derived from the liquid crystal compound 40 continuously rotates in the one in-plane direction, it is possible to adjust the length of the single period over which the optical axis 40A rotates by 180° in the one in-plane direction in which the optical axis 40A rotates.

In a case of forming the optically anisotropic layer on the alignment film 32 having the alignment pattern in which the alignment state periodically changes, as described later, it is possible to form the optically anisotropic layer 36 having the liquid crystal alignment pattern in which the optical axis 40A derived from the liquid crystal compound 40 continuously rotates in the one in-plane direction.

In addition, by rotating the optical axes of the λ/4 plates 72A and 72B by 90°, respectively, the rotation direction of the optical axis 40A can be reversed.

Figure 9:
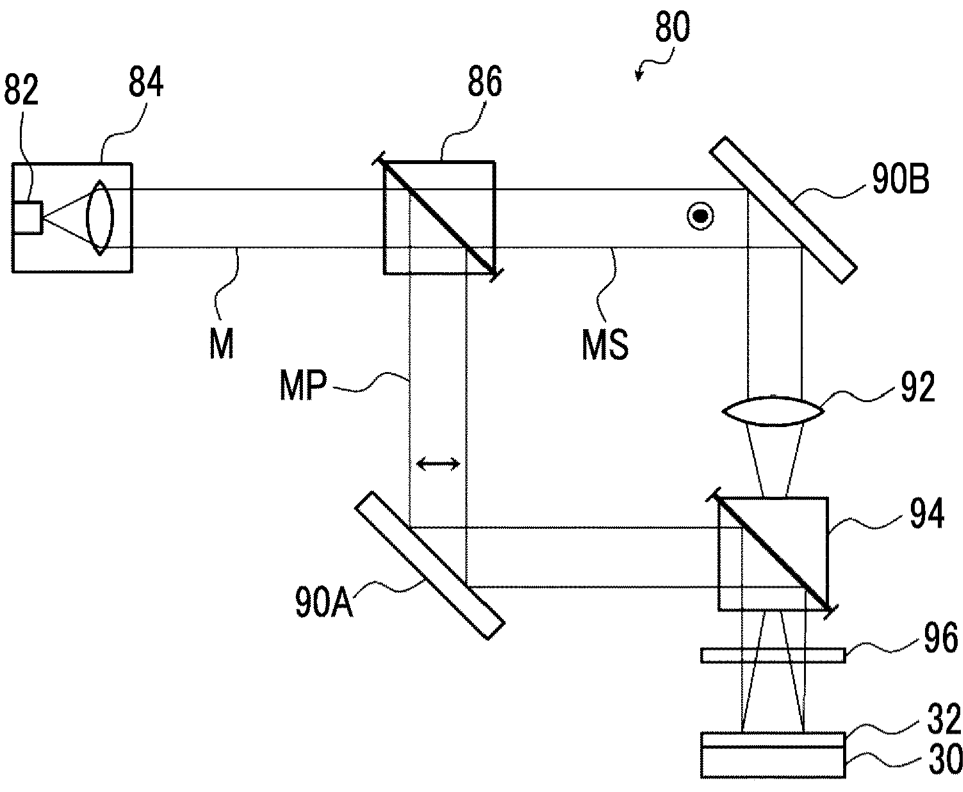
FIG. 9 is a view conceptually showing another example of the exposure device that exposes an alignment film.

In addition, FIG. 9 shows such an example of an exposure device that forms a radial liquid crystal alignment pattern as shown in FIG. 2.

An exposure device 80 includes: a light source 84 that includes a laser 82; a polarization beam splitter 86 that splits the laser light M emitted from the laser 82 into S polarized light MS and P polarized light MP; a mirror 90A that is disposed on an optical path of the P polarized light MP; a mirror 90B that is disposed on an optical path of the S polarized light MS; a lens 92 that is disposed on the optical path of the S polarized light MS; a polarization beam splitter 94; and a λ/4 plate 96.

The P polarized light MP that is split by the polarization beam splitter 86 is reflected from the mirror 90A to be incident into the polarization beam splitter 94. On the other hand, the S polarized light MS that is split by the polarization beam splitter 86 is reflected from the mirror 90B and is collected by the lens 92 to be incident into the polarization beam splitter 94.

The P polarized light MP and the S polarized light MS are combined by the polarization beam splitter 94, are converted into dextrorotatory circularly polarized light and levorotatory circularly polarized light by the λ/4 plate 96 depending on the polarization direction, and are incident into the alignment film 32 on the support 30.

Here, due to interference between the dextrorotatory circularly polarized light and the levorotatory circularly polarized light, the polarized state of light with which the alignment film 32 is irradiated periodically changes according to interference fringes. The intersecting angle between the dextrorotatory circularly polarized light and the levorotatory circularly polarized light changes from the inner side to the outer side of the concentric circle. Therefore, an exposure pattern in which the period changes from the inner side to the outer side can be obtained. As a result, in the alignment film 32, a radial alignment pattern in which the alignment state periodically changes can be obtained.

In the exposure device 80, the length Λ of the single period in the liquid crystal alignment pattern in which the optical axis of the liquid crystal compound 40 continuously rotates by 180° can be controlled by changing the refractive power of the lens 92 (the F number of the lens 92), the focal length of the lens 92, the distance between the lens 92 and the alignment film 32.

In addition, in a case of adjusting the refractive power of the lens 92 (the F number of the lens 92), it is possible to change the length Λ of the single period in the liquid crystal alignment pattern in the one in-plane direction in which the optical axis continuously rotates. Specifically, in addition, the length Λ of the single period in the liquid crystal alignment pattern in the one in-plane direction in which the optical axis continuously rotates can be changed depending on a light spread angle at which light is spread by the lens 92 due to interference with parallel light. More specifically, in a case where the refractive power of the lens 92 is weak, light is approximated to parallel light. Therefore, the length Λ of the single period in the liquid crystal alignment pattern gradually decreases from the inner side toward the outer side, and the F number increases. Conversely, in a case where the refractive power of the lens 92 becomes stronger, the length Λ of the single period in the liquid crystal alignment pattern rapidly decreases from the inner side toward the outer side, and the F number decreases.

As described above, the patterned alignment film has an alignment pattern to obtain the liquid crystal alignment pattern in which the liquid crystal compound is aligned such that the direction of the optical axis of the liquid crystal compound in the optically anisotropic layer formed on the patterned alignment film changes while continuously rotating along at least one in-plane direction. In a case where an axis in the direction in which the liquid crystal compound is aligned is an alignment axis, it can be said that the patterned alignment film has an alignment pattern in which the direction of the alignment axis changes while continuously rotating along at least one in-plane direction. The alignment axis of the patterned alignment film can be detected by measuring absorption anisotropy. For example, in a case where the amount of light transmitted through the patterned alignment film is measured by irradiating the patterned alignment film with linearly polarized light while rotating the patterned alignment film, it is observed that a direction in which the light amount is the maximum or the minimum gradually changes in the one in-plane direction.

In the present invention, the alignment film 32 is provided as a preferred aspect and is not an essential component.

For example, it is possible to adopt a configuration in which, by forming the alignment pattern on the support 30 using a method of rubbing the support 30, a method of processing the support 30 with laser light or the like, or the like, the optically anisotropic layer has the liquid crystal alignment pattern in which the direction of the optical axis 40A derived from the liquid crystal compound 40 changes while continuously rotating along at least one in-plane direction. That is, in the present invention, the support 30 may be made to act as the alignment film.

<Optically Anisotropic Layer>

The optically anisotropic layer 36*a* is formed on a surface of the alignment film 32. As described above, the optically anisotropic layer 36*a* is formed by immobilizing a liquid crystal phase where a liquid crystal compound is aligned and has a liquid crystal alignment pattern in which a direction of an optical axis derived from the liquid crystal compound changes while continuously rotating along at least one in-plane direction.

As conceptually shown in FIG. 6, the liquid crystal compound 40 is not helically twisted and rotated in the thickness direction in the optically anisotropic layer 36, and the liquid crystal compounds 40 at the same position in a plane direction are aligned such that the directions of the optical axes 40A thereof are directed in the same direction.

<<Method of Forming Optically Anisotropic Layer>>

The optically anisotropic layer can be formed by immobilizing a liquid crystal phase in a layer shape, the liquid crystal phase being aligned in a liquid crystal alignment pattern in which a direction of an optical axis derived from the liquid crystal compound changes while continuously rotating along at least one in-plane direction.

The structure in which a liquid crystal phase is immobilized may be a structure in which the alignment of the liquid crystal compound as a liquid crystal phase is maintained. Typically, the structure in which a liquid crystal phase is immobilized is preferably a structure which is obtained by aligning the polymerizable liquid crystal compound in the liquid crystal alignment pattern, polymerizing and curing the polymerizable liquid crystal compound with ultraviolet irradiation, heating, or the like to form a layer having no fluidity, and concurrently changing the state of the polymerizable liquid crystal compound into a state where the alignment state is not changed by an external field or an external force.

The structure in which a liquid crystal phase is immobilized is not particularly limited as long as the optical characteristics of the liquid crystal phase are maintained, and the liquid crystal compound 40 in the optically anisotropic layer does not necessarily exhibit liquid crystallinity. For example, the molecular weight of the polymerizable liquid crystal compound may be increased by a curing reaction such that the liquid crystallinity thereof is lost.

Examples of the material to be used for forming the optically anisotropic layer obtained by immobilizing a liquid crystal phase include a liquid crystal composition containing a liquid crystal compound. It is preferable that the liquid crystal compound is a polymerizable liquid crystal compound.

In addition, the liquid crystal composition to be used for forming the optically anisotropic layer may further include a surfactant and a polymerization initiator.

—Polymerizable Liquid Crystal Compound—

The polymerizable liquid crystal compound may be a rod-like liquid crystal compound or a disk-like liquid crystal compound.

Examples of the rod-like polymerizable liquid crystal compound for forming an optically anisotropic layer include a rod-like nematic liquid crystal compound. As the rod-like nematic liquid crystal compound, an azomethine compound, an azoxy compound, a cyanobiphenyl compound, a cyanophenyl ester compound, a benzoate compound, a phenyl cyclohexanecarboxylate compound, a cyanophenylcyclohexane compound, a cyano-substituted phenylpyrimidine compound, an alkoxy-substituted phenylpyrimidine compound, a phenyldioxane compound, a tolan compound, or an alkenylcyclohexylbenzonitrile compound is preferably used. Not only a low-molecular-weight liquid crystal compound but also a polymer liquid crystal compound can be used.

It is preferable that the alignment of the rod-like liquid crystal compound is immobilized by polymerization. Examples of the polymerizable rod-like liquid crystal compound include compounds described in *Makromol. Chem*., (1989), Vol. 190, p. 2255, Advanced Materials (1993), Vol. 5, p. 107, U.S. Pat. Nos. 4,683,327A, 5,622,648A, 5,770,107A, WO95/22586A, WO95/24455A, WO97/00600A, WO98/23580A, WO98/52905A, JP1989-272551A (JP-H1-272551A), JP1994-16616A (JP-H6-16616A), JP1995-110469A (JP-H7-110469A), JP1999-80081A (JP-H11-80081A), and JP2001-64627. Further, as the rod-like liquid crystal compound, for example, compounds described in JP1999-513019A (JP-H11-513019A) and JP2007-279688A can also be preferably used. In addition, two or more kinds of polymerizable liquid crystal compounds may be used in combination. In a case of using two or more kinds of polymerizable liquid crystal compounds in combination, it is possible to decrease the alignment temperature.

Examples of the polymerizable group include an unsaturated polymerizable group, an epoxy group, and an aziridinyl group. Among these, an unsaturated polymerizable group is preferable, and an ethylenically unsaturated polymerizable group is more preferable. The polymerizable group can be introduced into the molecules of the liquid crystal compound using various methods. The number of polymerizable groups included in the polymerizable liquid crystal compound is preferably 1 to 6 and more preferably 1 to 3.

In addition, as a polymerizable liquid crystal compound other than the above-described examples, for example, such a cyclic organopolysiloxane compound having a cholesteric phase as described in JP1982-165480A (JP-S57-165480A) can be used. Further, as the above-described polymer liquid crystal compound, for example, a polymer in which a liquid crystal mesogenic group is introduced into a main chain, a side chain, or both a main chain and a side chain, a polymer cholesteric liquid crystal in which a cholesteryl group is introduced into a side chain, such a liquid crystal polymer as described in JP1997-133810A (JP-H9-133810A), and such a liquid crystal polymer as described in JP1999-293252A (JP-H11-293252A) can be used.

—Disk-Like Liquid Crystal Compound—

As the disk-like liquid crystal compound, for example, compounds described in JP2007-108732A and JP2010-244038A can be preferably used.

In a case where the disk-like liquid crystal compound is used in the optically anisotropic layer, the liquid crystal compound 40 rises in the thickness direction in the optically anisotropic layer, and the optical axis 40A derived from the liquid crystal compound is defined as an axis perpendicular to a disk surface, that is so-called, a fast axis.

In addition, the adding amount of the polymerizable liquid crystal compound in the liquid crystal composition is preferably 75 to 99.9% by mass, more preferably 80 to 99% by mass, and still more preferably 85 to 90% by mass with respect to the solid content mass (mass excluding a solvent) of the liquid crystal composition.

In order to obtain a high diffraction efficiency, it is preferable that a liquid crystal compound having high refractive index anisotropy Δn is used as the liquid crystal compound.

—Surfactant—

The liquid crystal composition to be used for forming the optically anisotropic layer may include a surfactant.

The surfactant is preferably a compound which can function as an alignment control agent contributing to the alignment of the liquid crystal compound in a stable or rapid manner. Examples of the surfactant include a silicone-based surfactant and a fluorine-based surfactant. Among these, a fluorine-based surfactant is preferable.

Specific examples of the surfactant include compounds described in paragraphs [0082] to [0090] of JP2014-119605A, compounds described in paragraphs [0031] to [0034] of JP2012-203237A, compounds exemplified in paragraphs [0092] and [0093] of JP2005-99248A, compounds exemplified in paragraphs [0076] to [0078] and paragraphs [0082] to [0085] of JP2002-129162A, and fluorine (meth)acrylate polymers described in paragraphs [0018] to [0043] and the like of JP2007-272185A.

The surfactant may be used alone or in a combination of two or more kinds thereof.

The fluorine-based surfactant is preferably a compound described in paragraphs "0082" to "0090" of JP2014-119605A.

The adding amount of the surfactant in the liquid crystal composition is preferably 0.01 to 10% by mass, more preferably 0.01 to 5% by mass, and still more preferably 0.02 to 1% by mass with respect to the total mass of the liquid crystal compound.

—Polymerization Initiator—

In a case where the liquid crystal composition contains a polymerizable compound, it is preferable that the liquid crystal composition contains a polymerization initiator. In an aspect in which a polymerization reaction progresses with ultraviolet irradiation, it is preferable that the polymerization initiator is a photopolymerization initiator which initiates a polymerization reaction with ultraviolet irradiation.

Examples of the photopolymerization initiator include an α-carbonyl compound (described in U.S. Pat. Nos. 2,367,661A and 2,367,670A), an acyloin ether (described in U.S. Pat. No. 2,448,828A), an α-hydrocarbon-substituted aromatic acyloin compound (described in U.S. Pat. No. 2,722,512A), a polynuclear quinone compound (described in U.S. Pat. Nos. 3,046,127A and 2,951,758A), a combination of a triarylimidazole dimer and p-aminophenyl ketone (described in U.S. Pat. No. 3,549,367A), an acridine compound and a phenazine compound (described in JP1985-105667A (JP-S60-105667A) and U.S. Pat. No. 4,239,850A), and an oxadiazole compound (described in U.S. Pat. No. 4,212,970A).

The content of the photopolymerization initiator in the liquid crystal composition is preferably 0.1 to 20% by mass and more preferably 0.5 to 12% by mass with respect to the content of the liquid crystal compound.

—Crosslinking Agent—

In order to improve the film hardness after curing and to improve durability, the liquid crystal composition may optionally include a crosslinking agent. As the crosslinking agent, a curing agent which can carry out curing with ultraviolet rays, heat, moisture, or the like can be suitably used.

The crosslinking agent is not particularly limited and can be appropriately selected depending on the purpose. Examples of the crosslinking agent include: a polyfunctional acrylate compound such as trimethylol propane tri(meth)acrylate or pentaerythritol tri(meth)acrylate; an epoxy compound such as glycidyl (meth)acrylate or ethylene glycol diglycidyl ether; an aziridine compound such as 2,2-bis hydroxymethyl butanol-tris[3-(1-aziridinyl)propionate] or 4,4-bis(ethyleneiminocarbonylamino)diphenylmethane; an isocyanate compound such as hexamethylene diisocyanate or a biuret type isocyanate; a polyoxazoline compound having an oxazoline group at a side chain thereof, and an alkoxysilane compound such as vinyl trimethoxysilane or N-(2-aminoethyl)-3-aminopropyltrimethoxysilane. In addition, depending on the reactivity of the crosslinking agent, a known catalyst can be used, and not only film hardness and durability but also productivity can be improved. The crosslinking agents may be used alone or in a combination of two or more kinds.

The content of the crosslinking agent is preferably 3% to 20% by mass, and more preferably 5% to 15% by mass with respect to the mass of solid content of the liquid crystal composition. In a case where the content of the crosslinking agent is within the above-described range, an effect of improving crosslinking density can be easily obtained, and the stability of the liquid crystal phase is further improved.

—Other Additives—

Optionally, a polymerization inhibitor, an antioxidant, an ultraviolet absorber, a light stabilizer, a coloring material, metal oxide fine particles, or the like can be added to the liquid crystal composition in a range where optical performance and the like do not deteriorate.

It is preferable that the liquid crystal composition is used as a liquid during the formation of the optically anisotropic layer.

The liquid crystal composition may include a solvent. The solvent is not particularly limited and can be appropriately selected depending on the purpose. An organic solvent is preferable.

The organic solvent is not particularly limited and can be appropriately selected depending on the purpose. Examples of the organic solvent include a ketone, an alkyl halide, an amide, a sulfoxide, a heterocyclic compound, a hydrocarbon, an ester, and an ether. The crosslinking agents may be used alone or in a combination of two or more kinds. Among these, a ketone is preferable in consideration of an environmental burden.

In a case where the optically anisotropic layer **36*a* is formed, it is preferable that the optically anisotropic layer 36*a* is formed by applying the liquid crystal composition to a surface where the optically anisotropic layer 36*a*** is to be formed, aligning the liquid crystal compound to a state the liquid crystal phase aligned in the predetermined liquid crystal alignment pattern, and curing the liquid crystal compound.

That is, in a case where the optically anisotropic layer **36*a* is formed on the alignment film 32, it is preferable that the optically anisotropic layer 36*a* obtained by immobilizing a liquid crystal phase is formed by applying the liquid crystal composition to the alignment film 32**, aligning the liquid crystal compound in the predetermined liquid crystal alignment pattern, and curing the liquid crystal compound.

For the application of the liquid crystal composition, a printing method such as ink jet or scroll printing or a known method such as spin coating, bar coating, or spray coating capable of uniformly applying liquid to a sheet-shaped material can be used.

The applied liquid crystal composition is optionally dried and/or heated and then cured to form the optically anisotropic layer **36*a***. In the drying and/or heating step, the liquid crystal compound in the liquid crystal composition only has to be aligned in the predetermined liquid crystal alignment pattern. In the case of heating, the heating temperature is preferably 200° C. or lower and more preferably 130° C. or lower.

The aligned liquid crystal compound is optionally further polymerized. Regarding the polymerization, thermal polymerization or photopolymerization using light irradiation may be carried out, and photopolymerization is preferable. Regarding the light irradiation, ultraviolet rays are preferably used. The irradiation energy is preferably 20 $mJ/cm^2$ to 50 $J/cm^2$ and more preferably 50 to 1,500 $mJ/cm^2$. In order to promote a photopolymerization reaction, light irradiation may be carried out under heating conditions or in a nitrogen atmosphere. The wavelength of ultraviolet rays to be applied is preferably 250 to 430 nm.

The thickness of the optically anisotropic layer 36*a* is not particularly limited, and the thickness with which a required light reflectivity can be obtained may be appropriately set depending on the use application of the optically anisotropic layer 36*a*, the light reflectivity required for the optically anisotropic layer 36*a*, the material for forming the optically anisotropic layer 36*a*.

The method of forming a curved surface portion on the optically anisotropic layer 36*a* may be a method in which, as described above, after a flat plate-shaped optically anisotropic layer formed by the above-described method on a flat plate-shaped support, the flat plate-shaped optically anisotropic layer is peeled and then adhered onto the support 30 having a curved surface portion by using an adhesive or a pressure sensitive adhesive to form a curved surface portion on the optically anisotropic layer 36*a*, or an optically anisotropic layer having a curved surface portion may be directly formed by the above-described method on the support 30 having a curved surface portion (or the alignment film 32 on the support 30).

In addition, the method of forming the support 30 having a curved surface portion is not particularly limited either, and the support 30 may be formed by any of the various known methods. For example, in a case where the support 30 consists of a resin material, the support 30 having a curved surface portion may be produced by any known method such as injection molding, vacuum molding, cutting, extrusion molding, or blow molding.

<<Liquid Crystal Alignment Pattern of Optically Anisotropic Layer>>

As described above, the optically anisotropic layer 36*a* has the liquid crystal alignment pattern in which the direction of the optical axis 40A derived from the liquid crystal compound 40 changes while continuously rotating in the one in-plane direction in a plane of the optically anisotropic layer 36*a*.

The optical axis 40A derived from the liquid crystal compound 40 is an axis having the highest refractive index in the liquid crystal compound 40, that is, a so-called slow axis. For example, in a case where the liquid crystal compound 40 is a rod-like liquid crystal compound, the optical axis 40A is parallel to a rod-like major axis direction. In the following description, the optical axis 40A derived from the liquid crystal compound 40 will also be referred to as "the optical axis 40A of the liquid crystal compound 40" or "the optical axis 40A".

FIG. 7 conceptually shows a plan view of the optically anisotropic layer 36*a* that is locally enlarged.

It is noted that the plan view is a view in a case where the optically anisotropic layer 36*a* is viewed from the top in FIG. 6, that is, a view in a case where the optically anisotropic layer 36*a* is viewed from a thickness direction (laminating direction of the respective layers (films)).

In addition, in FIG. 6, in order to clarify the configuration of the optically anisotropic layer 36*a*, only the liquid crystal compound 40 on the surface of the alignment film 32 is shown as the liquid crystal compound 40.

As shown in FIG. 7, on the surface of the alignment film 32, the liquid crystal compound 40 that forms the optically anisotropic layer 36*a* has the liquid crystal alignment pattern in which the direction of the optical axis 40A changes while continuously rotating in the predetermined one in-plane direction indicated by arrow D (hereinafter, referred to as the arrangement axis D) in a plane of the optically anisotropic layer 36*a* according to the alignment pattern formed on the alignment film 32 as the lower layer. In the example shown in the drawing, the liquid crystal compound 40 has the liquid crystal alignment pattern in which the optical axis 40A of the liquid crystal compound 40 changes while continuously rotating clockwise in the arrangement axis D direction.

The liquid crystal compound 40 that forms the optically anisotropic layer 36*a* is two-dimensionally arranged in a direction perpendicular to the arrangement axis D and the one in-plane direction (arrangement axis D direction).

In the following description, the direction perpendicular to the arrangement axis D direction will be referred to as "Y direction" for convenience of description. That is, the arrow Y direction is a direction perpendicular to the one in-plane direction in which the direction of the optical axis 40A of the liquid crystal compound 40 changes while continuously rotating in a plane of the optically anisotropic layer. Accordingly, in FIG. 1, FIG. 2, and FIG. 10 and FIG. 11 described later, the Y direction is a direction perpendicular to the paper plane.

Specifically, the description that the direction of the optical axis 40A of the liquid crystal compound 40 changes while continuously rotating in the arrangement axis D direction (the predetermined one in-plane direction) means that an angle between the optical axis 40A of the liquid crystal compound 40, which is arranged in the arrangement axis D direction, and the arrangement axis D direction varies depending on positions in the arrangement axis D direction, and the angle between the optical axis 40A and the arrangement axis D direction sequentially changes from $\theta$ to $\theta+180°$ or $\theta-180°$ in the arrangement axis D direction. A difference between the angles of the optical axes 40A of the liquid crystal compounds 40 adjacent to each other in the arrangement axis D direction is preferably 45° or less, more preferably 15° or less, and still more preferably less than 15°.

In addition, in the present invention, the liquid crystal compound rotates in the direction in which an angle formed between the optical axes 40A of the liquid crystal compounds 40 adjacent to each other in the arrangement axis D direction decreases. Accordingly, in the optically anisotropic layer shown in FIG. 6 and FIG. 7, the optical axis 40A of the liquid crystal compound 40 rotates to the right (clockwise) in the direction indicated by the arrow of the arrangement axis D.

On the other hand, in the liquid crystal compound 40 that forms the optically anisotropic layer 36*a*, the directions of the optical axes 40A are the same in the Y direction perpendicular to the arrangement axis D direction, that is, the Y direction perpendicular to the one in-plane direction in which the optical axis 40A continuously rotates.

In other words, in the liquid crystal compound 40 that forms the optically anisotropic layer 36*a*, angles between the optical axes 40A of the liquid crystal compound 40 and the arrangement axis D direction are the same in the Y direction.

In the liquid crystal compound arranged in the Y direction in the optically anisotropic layer 36*a*, the angles between the optical axes 40A and the arrangement axis D direction (the one in-plane direction in which the direction of the optical axis of the liquid crystal compound 40 rotates) are the same.

Regions in which the liquid crystal compounds 40 in which the angles between the optical axes 40A and the arrangement axis D direction are the same are disposed in the Y direction will be referred to as "regions R".

In this case, it is preferable that an in-plane retardation (Re) value of each of the regions R is a half wavelength, that is, λ/2. The in-plane retardation is calculated from the product of a refractive index difference Δn associated with the refractive index anisotropy of the region R and the thickness of the optically anisotropic layer. Here, the refractive index difference associated with the refractive index anisotropy of the region R in the optically anisotropic layer is defined by a difference between a refractive index of a direction of an in-plane slow axis of the region R and a refractive index of a direction orthogonal to the direction of the slow axis. That is, the refractive index difference Δn associated with the refractive index anisotropy of the region R is the same as the difference between the refractive index of the liquid crystal compound 40 in the direction of the optical axis 40A and the refractive index of the liquid crystal compound 40 in a direction perpendicular to the optical axis 40A in a plane of the region R. That is, the refractive index difference Δn is the same as the refractive index difference of the liquid crystal compound 40.

In the optically anisotropic layer 36*a*, it is preferable that the in-plane retardation value of the plurality of regions R is a half wavelength. It is preferable that an in-plane retardation $Re(550)=\Delta n_{550}\times d$ of the plurality of regions R of the optically anisotropic layer 36*a* with respect to the incidence light having a wavelength of 550 nm is in a range defined by the following Expression (1). Here, $\Delta n_{550}$ represents a refractive index difference associated with the refractive index anisotropy of the region R in a case where the wavelength of incidence light is 550 nm, and d represents the thickness of the optically anisotropic layer 36*a*.

$$200\ \text{nm}\leq\Delta n_{550}\times d\leq 350\ \text{nm} \quad (1)$$

That is, in a case where the in-plane retardation $Re(550)=\Delta n_{550}\times d$ of the plurality of regions R of the optically anisotropic layer 36*a* satisfies Expression (1), a sufficient amount of a circularly polarized light component in the light incident into the optically anisotropic layer 36*a* can be converted into circularly polarized light that travels in a direction tilted in a forward direction or reverse direction with respect to the arrangement axis D direction. It is more preferable that the in-plane retardation $Re(550)=\Delta n_{550}\times d$ satisfies $225\ \text{nm}\leq\Delta n_{550}\times d\leq 340\ \text{nm}$, and it is still more preferable that the in-plane retardation $Re(550)=\Delta n_{550}\times d$ satisfies $250\ \text{nm}\leq\Delta n_{550}\times d\leq 330\ \text{nm}$.

Expression (1) is a range with respect to incidence light having a wavelength of 550 nm. However, an in-plane retardation $Re(550)=\Delta nm_{\lambda}\times d$ of the plurality of regions R of the optically anisotropic layer with respect to incidence light having a wavelength of λ nm is preferably in a range defined by the following Expression (1-2) and can be set as appropriate.

$$0.7\times(\lambda/2)\ \text{nm}\leq\Delta n_{\lambda}\times d\leq 1.3\times(\lambda/2)\ \text{nm} \quad (1\text{-}2)$$

In addition, the value of the in-plane retardation of the plurality of regions R of the optically anisotropic layer 36*a* in a range outside the range of Expression (1) can also be used. Specifically, in a case of satisfying $\Delta n_{550}\times d<200$ nm or $350\ \text{nm}<\Delta n_{550}\times d$, the light can be classified into light that travels in the same direction as a traveling direction of the incidence light and light that travels in a direction different from a traveling direction of the incidence light. In a case where $\Delta n_{550}\times d$ approaches 0 nm or 550 nm, the amount of the light component that travels in the same direction as a traveling direction of the incidence light increases, and the amount of the light component that travels in a direction different from a traveling direction of the incidence light decreases.

Further, it is preferable that an in-plane retardation $Re(450)=\Delta n_{450}\times d$ of each of the plurality of regions R of the optically anisotropic layer 36*a* with respect to incidence light having a wavelength of 450 nm and an in-plane retardation $Re(550)=\Delta n_{550}\times d$ of each of the plurality of regions R of the optically anisotropic layer 36*a* with respect to incidence light having a wavelength of 550 nm satisfy Expression (2). Here, $\Delta n_{450}$ represents a refractive index difference associated with the refractive index anisotropy of the region R in a case where the wavelength of incidence light is 450 nm.

$$(\Delta n_{450}\times d)/(\Delta n_{550}\times d)<1.0 \quad (2)$$

Expression (2) represents that the liquid crystal compound 40 in the optically anisotropic layer 36*a* has reverse dispersibility. That is, in a case of satisfying Expression (2), the optically anisotropic layer 36*a* can cope with the incidence light having wavelengths in a wide range.

In addition, the refractive index difference $\Delta n_{550}$ associated with the refractive index anisotropy of the optically anisotropic layer is preferably 0.2 or more, more preferably 0.24 to 1.0, and still more preferably 0.3 to 0.8. In a case of setting the refractive index difference $\Delta n_{550}$ of the optically anisotropic layer to be equal to or larger than the lower limit value, it is possible to reduce the thickness of the optically anisotropic layer that satisfies Expression (1). In addition, in a case of setting the refractive index difference $\Delta n_{550}$ to be equal to or larger than the lower limit value and reducing the thickness of the optically anisotropic layer, the distance of the diffraction element (optically anisotropic layer), through which the light that obliquely passes through the end part of the optically anisotropic layer passes, is shortened, and thus the diffraction efficiency is increased, and the in-plane dependency of the diffraction efficiency can be reduced.

In addition, in a case of setting the refractive index difference $\Delta n_{550}$ to be equal to or smaller than the upper limit value, it is possible to prevent the interface reflection due to a large refractive index difference between the optically anisotropic layer and the functional layer, for example, in a case where another functional layer is provided in contact with the optically anisotropic layer.

Although the optically anisotropic layer functions as a so-called λ/2 plate, the present invention also includes an aspect in which a laminate including the support and the alignment film that are integrated functions as a so-called λ/2 plate.

In the optically anisotropic layer 36*a*, in such a liquid crystal alignment pattern of the liquid crystal compound 40, the length (distance) over which the optical axis 40A of the liquid crystal compound 40 rotates by 180° in the arrangement axis D direction in which the optical axis 40A changes while continuously rotating in a plane is defined as the length A of the single period in the liquid crystal alignment pattern.

That is, the distance between centers of two liquid crystal compounds 40 in the arrangement axis D direction is the length A of the single period, the two liquid crystal compounds having the same angle in the arrangement axis D direction. Specifically, as shown in FIG. 7, the distance between centers in the arrangement axis D direction of two liquid crystal compounds 40 in which the arrangement axis D direction and the direction of the optical axis 40A match with each other is the length Λ of the single period. In the following description, the length Λ of the single period will also be referred to as "single period Λ".

In the liquid crystal alignment pattern of the optically anisotropic layer 36*a*, the single period Λ is repeated in the arrangement axis D direction, that is, in the one in-plane direction in which the direction of the optical axis 40A changes while continuously rotating.

In a case where circularly polarized light is incident into such an optically anisotropic layer 36*a*, the light is refracted such that the direction of the circularly polarized light is converted.

Figure 10:
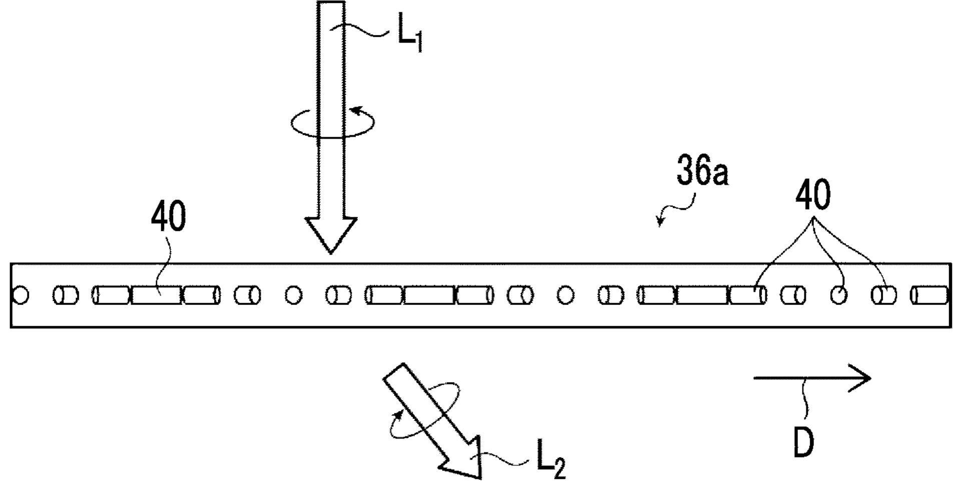
FIG. 10 is a conceptual view for describing an action of the optically anisotropic layer.
Figure 11:
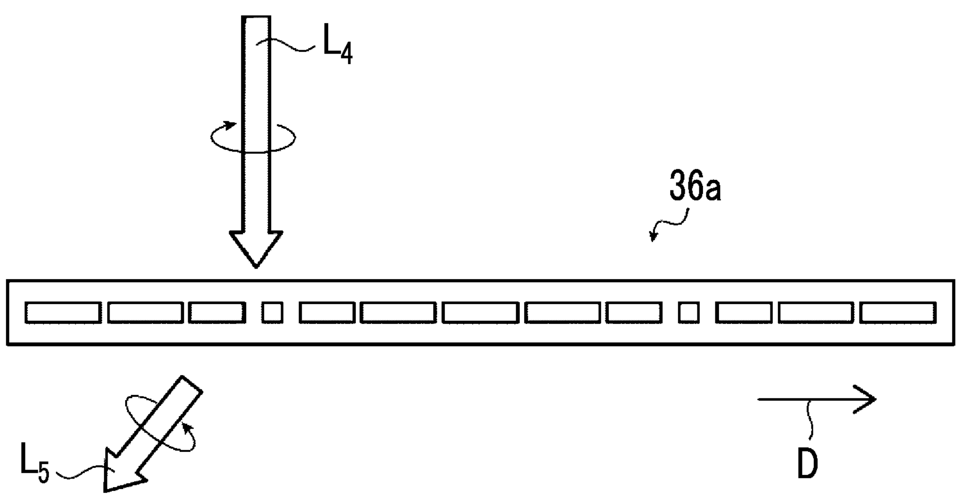
FIG. 11 is a conceptual view for describing an action of the optically anisotropic layer.

This action is conceptually shown in FIG. 10 and FIG. 11. It is noted that in the optically anisotropic layer 36*a*, the value of the product of the refractive index difference of the liquid crystal compound and the thickness of the optically anisotropic layer is λ/2.

As shown in FIG. 10, in a case where the value of the product of the refractive index difference of the liquid crystal compound and the thickness of the optically anisotropic layer 36*a* in the optically anisotropic layer 36*a* is λ/2 and incidence light $L_1$ as levorotatory circularly polarized light is incident into the optically anisotropic layer 36*a*, the incidence light $L_1$ passes through the optically anisotropic layer 36*a* to be imparted with a retardation of 180°, and the transmitted light $L_2$ is converted into dextrorotatory circularly polarized light.

In addition, the liquid crystal alignment pattern formed in the optically anisotropic layer 36*a* is a pattern that is periodic in the arrangement axis D direction. Therefore, the transmitted light $L_2$ travels in a direction different from a traveling direction of the incidence light $L_1$. In this way, the incidence light $L_1$ of the levorotatory circularly polarized light is converted into the transmitted light $L_2$ of dextrorotatory circularly polarized light that is tilted by a predetermined angle in the arrangement axis D direction with respect to an incidence direction. In the example shown in FIG. 10, the transmitted light $L_2$ is diffracted to travel in the lower right direction.

On the other hand, as shown in FIG. 11, in a case where the value of the product of the refractive index difference of the liquid crystal compound and the thickness of the optically anisotropic layer 36*a* in the optically anisotropic layer 36*a* is λ/2 and incidence light $L_4$ as dextrorotatory circularly polarized light is incident into the optically anisotropic layer 36*a*, the incidence light $L_4$ passes through the optically anisotropic layer 36*a* to be imparted with a retardation of 180° and is converted into transmitted light $L_5$ of levorotatory circularly polarized light.

In addition, the liquid crystal alignment pattern formed in the optically anisotropic layer 36*a* is a pattern that is periodic in the arrangement axis D direction. Therefore, the transmitted light $L_5$ travels in a direction different from a traveling direction of the incidence light $L_4$. In this case, the transmitted light $L_5$ travels in a direction different from the transmitted light $L_2$, that is, in a direction opposite to the arrow direction of the arrangement axis D with respect to the incidence direction. In this way, the incidence light $L_4$ is converted into the transmitted light $L_5$ of levorotatory circularly polarized light that is tilted by a predetermined angle in a direction opposite to the arrangement axis D direction with respect to an incidence direction. In the example shown in FIG. 11, the transmitted light $L_5$ is diffracted to travel in the lower left direction.

Here, refraction angles of the transmitted light $L_2$ and the transmitted light $L_5$ can be adjusted depending on the length of the single period Λ of the liquid crystal alignment pattern formed in the optically anisotropic layer 36*a*. Specifically, in the optically anisotropic layer 36*a*, the beams of light that have passed through the liquid crystal compounds 40 adjacent to each other more strongly interfere with each other as the single period Λ of the liquid crystal alignment pattern decreases. Therefore, the transmitted light $L_2$ and the transmitted light $L_5$ can be refracted much larger.

In addition, in a case of reversing the rotation direction of the optical axis 40A of the liquid crystal compound 40 that rotates in the arrangement axis D direction, the refraction direction of transmitted light can be reversed. That is, in the example FIG. 10 and FIG. 11, the rotation direction of the optical axis 40A toward the arrangement axis D direction is clockwise. In a case of setting this rotation direction to be counterclockwise, the refraction direction of transmitted light can be reversed. Specifically, in FIG. 10 and FIG. 11, in a case where the rotation direction of the optical axis 40A toward the arrangement axis D direction is counterclockwise, the levorotatory circularly polarized light incident into the optically anisotropic layer 36*a* from the upper side in the drawing passes through the optically anisotropic layer 36*a* such that the transmitted light is converted into dextrorotatory circularly polarized light and is diffracted to travel in the lower left direction in the drawing. In addition, the dextrorotatory circularly polarized light incident into the optically anisotropic layer 36*a* from the upper side in the drawing passes through the optically anisotropic layer 36*a* such that the transmitted light is converted into levorotatory circularly polarized light and is diffracted to travel in the lower right direction in the drawing.

Here, in the transmissive-type optically anisotropic layer 36*a*, it is preferable that (the optical axis of) the liquid crystal compound is subjected to a twisted alignment in the thickness direction. The description that "the liquid crystal compound (the optical axis) is subjected to a twisted alignment in the thickness direction" refers to a state where the direction of the optical axis arranged in the thickness direction from one main surface to another main surface of the optically anisotropic layer relatively changes and is subjected to a twisted alignment in the one in-plane direction. The twisting property may be right-twisted or left-twisted and may be applied depending on a desired diffraction direction. The optical axis in the thickness direction is twisted by less than one turn, that is, the twisted angle is less than 360°. The twisted angle of the liquid crystal compound in the thickness direction is preferably about 10° to 200° and more preferably about 200 to 180°. In a case of a cholesteric alignment, the twisted angle is 360° or greater, and the optically anisotropic layer has selective reflectivity in which specific circularly polarized light in a specific wavelength range is reflected. In the present specification, "twisted alignment" does not include cholesteric alignment, and selective reflectivity does not occur in the liquid crystal layer having the twisted alignment.

The optically anisotropic layer 36*a* subjected to a twisted alignment in the thickness direction has the same configuration as the optically anisotropic layer 36*a* shown in FIG. 6 and FIG. 7, except that the liquid crystal compound is subjected to a twisted alignment in the thickness direction. That is, in a case of being viewed from the thickness direction, as shown in FIG. 7, the optically anisotropic layer 36*a* has a liquid crystal alignment pattern in which the direction of the optical axis 40A changes while continuously rotating along the arrangement axis D in a plane of the optically anisotropic layer 36*a*.

the optically anisotropic layer 36*a* which is subjected to a twisted alignment in the thickness direction has a twisted structure in which the liquid crystal compound 40 is turned and laminated in the thickness direction, and a total rotation angle between the liquid crystal compound 40 present on one main surface side of the optically anisotropic layer 36*a* and the liquid crystal compound 40 present on another main surface side of thereof is less than 360°.

In the optically anisotropic layer 36*a*, the twisted angle in the thickness direction may be appropriately set according to the single period Λ of the liquid crystal alignment pattern in a plane.

In this way, in order for the optically anisotropic layer to have the configuration in which the liquid crystal compound is subjected to a twisted alignment in the thickness direction, the liquid crystal composition for forming the optically anisotropic layer may contain a chiral agent.

—Chiral Agent (Optically Active Compound)—

The chiral agent has a function of causing a helical structure of a liquid crystal phase to be formed. The chiral agent may be selected depending on the purposes because a helical twisted direction and a helical twisting power (HTP) to be induced vary depending on the compounds.

The chiral agent is not particularly limited, and a known compound (for example, *Liquid Crystal Device Handbook* (No. 142 Committee of Japan Society for the Promotion of Science, 1989), Chapter 3, Article 4-3, chiral agent for twisted nematic (TN) or super twisted nematic (STN), p. 199), isosorbide, or an isomannide derivative can be used.

In general, the chiral agent includes an asymmetric carbon atom. However, an axially chiral compound or a planar chiral compound not having an asymmetric carbon atom can also be used as the chiral agent. Examples of the axially chiral compound or the planar chiral compound include binaphthyl, helicene, paracyclophane, and derivatives thereof. The chiral agent may include a polymerizable group. In a case where both the chiral agent and the liquid crystal compound have a polymerizable group, a polymer which includes a repeating unit derived from the polymerizable liquid crystal compound and a repeating unit derived from the chiral agent can be formed due to a polymerization reaction of a polymerizable chiral agent and the polymerizable liquid crystal compound. In this aspect, it is preferable that the polymerizable group in the polymerizable chiral agent is the same as the polymerizable group in the polymerizable liquid crystal compound. Accordingly, the polymerizable group of the chiral agent is preferably an unsaturated polymerizable group, an epoxy group, or an aziridinyl group, more preferably an unsaturated polymerizable group, and still more preferably an ethylenically unsaturated polymerizable group.

Further, the chiral agent may be a liquid crystal compound.

In a case where the chiral agent includes a photoisomerization group, a desired twisted alignment corresponding to a luminescence wavelength can be formed by irradiation of an actinic ray or the like through a photomask after coating and alignment, which is preferable. The photoisomerization group is preferably an isomerization portion of a photochromic compound, an azo group, an azoxy group, or a cinnamoyl group. Specific examples of the compound include compounds described in JP2002-80478A, JP2002-80851A, JP2002-179668A, JP2002-179669A, JP2002-179670A, JP2002-179681A, JP2002-179682A, JP2002-338575A, JP2002-338668A, JP2003-313189A, and JP2003-313292A.

The content of the chiral agent in the liquid crystal composition is preferably 0.01 to 200% by mole and more preferably 1 to 30% by mole with respect to the content molar amount of the liquid crystal compound.

Figure 12:
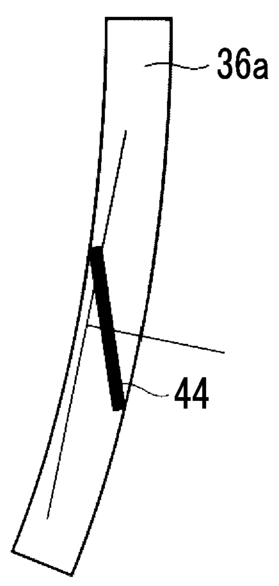
FIG. 12 is a cross-sectional view of a region indicated by C in FIG. 1.

In this way, in a case where the optically anisotropic layer 36*a* has a liquid crystal alignment pattern in which the direction of the optical axis 40A changes while continuously rotating along the arrangement axis D in a plane of the optically anisotropic layer 36*a*, and the liquid crystal compound 40 has a twisted structure in the thickness direction, in an image captured by observing a cross section parallel to the arrangement axis D with a scanning electron microscope (SEM), the optically anisotropic layer 36*a* has bright portions and dark portions, which extend from one main surface to the other main surface, and has a region in which in the thickness direction, the dark portions are tilted with respect to the main surface of the optically anisotropic layer 36*a*. Here, the optically anisotropic layer 36*a* has a curved surface portion. In this curved surface portion, the description that the dark portion is tilted with respect to the main surface means that the dark portion 44 is tilted (more than 0° and less than 90°) with respect to a tangential line at a point on a line that is drawn to be perpendicular to one main surface of the optically anisotropic layer 36*a* from a point passing through the center of the dark portion 44 extending from the one main surface to the other main surface, as shown in FIG. 12. The bright portions and the dark portions, which are observed in the SEM image of the cross section of the optically anisotropic layer, are derived from the direction of the optical axis of the liquid crystal compound.

In an image captured by observing a cross section of the optically anisotropic layer 36*a*, which is parallel to the arrangement axis D, with a scanning electron microscope (SEM), in a case where the optically anisotropic layer 36*a* has bright portions and dark portions, which extend from one main surface to the other main surface, and has a region in which in the thickness direction, the dark portions are tilted with respect to the main surface of the optically anisotropic layer 36*a*, it is possible to more suitably suppress a decrease in the diffraction efficiency of the refracted light. Therefore, it is preferable that the liquid crystal diffraction element has a region in which the optically anisotropic layer is twisted to rotate in the thickness direction.

In addition, it is preferable that in a case where a length over which the direction of the optical axis derived from the liquid crystal compound rotates by 180° in a plane is set as a single period in the liquid crystal alignment pattern, the optically anisotropic layer 36*a* has, in a plane direction, regions in which lengths of the single periods are different from each other, and it is more preferable that the optically anisotropic layer 36*a* has a region in which the length of the single period in the liquid crystal alignment pattern gradually changes along the one direction (the arrangement axis D).

As described above, the optically anisotropic layer 36*a* that is formed using the composition containing the liquid crystal compound and has the liquid crystal alignment pattern in which the direction of the optical axis 40A rotates in the arrangement axis D direction refracts circularly polarized light, in which as the single periods Λ of the liquid crystal alignment pattern decreases, the refraction angle is large.

Therefore, in a case where a pattern is formed such that the single periods Λ of the liquid crystal alignment patterns are different from each other in different in-plane regions, the light incident into the different in-plane regions is refracted at different angles.

For example, as shown in FIG. 2, in a case where the liquid crystal alignment pattern included in the optically anisotropic layer 36*a* has a radial shape, it is possible to largely refract the light incident into the end part side as compared with the light incident into the vicinity of the center of the liquid crystal diffraction element, and a more suitable function can be exhibited as a positive lens that collects light in a case where the liquid crystal alignment pattern A is shortened from the center side of the optically anisotropic layer 36*a* toward the end part side thereof.

Here, in the diffraction of light by the optically anisotropic layer having the liquid crystal alignment pattern in which the direction of the optical axis of the liquid crystal compound changes while continuously rotating in a plane, in a case where the diffraction angle increases, the diffraction efficiency may decrease.

Therefore, in a case where the optically anisotropic layer has a configuration in which regions having different lengths of the single periods over which the direction of the optical axis of the liquid crystal compound rotates by 180° in a plane, the diffraction angle varies depending on the light incidence position, and thus there is a concern that a difference in the amount of diffracted light depending on the in-plane incidence position is present. That is, there is a concern that a region in which the brightness of the light transmitted and diffracted is low depending on the in-plane incidence position is present.

On the other hand, in a case where the optically anisotropic layer has a region in which the optical axis is twisted to rotate in the thickness direction, it is possible to suppress a decrease in the diffraction efficiency of the refracted light. Accordingly, it is preferable that the optically anisotropic layer has a region in which the optical axis twisted to rotate in the thickness direction of the optically anisotropic layer and has regions in which magnitudes of twisted angles in the thickness direction are different from each other in the in-plane direction.

Specifically, in a case of setting the twisted angle in the thickness direction to be large in the region in which the length of the single period A of the liquid crystal alignment pattern is short, the amount of transmitted light can be made to be uniform irrespective of the in-plane incidence position.

In this way, in a case where in the in-plane direction, the optically anisotropic layer 36*a* has regions in which lengths of the single periods over which the direction of the optical axis of the liquid crystal compound rotates by 180° in a plane and has regions in which magnitudes of twisted angles in the thickness direction are different from each other in the in-plane direction, the optically anisotropic layer 36*a* is observed as an optically anisotropic layer in which in an image captured by observing a cross section of the optically anisotropic layer 36*a* along the arrangement axis D with a scanning electron microscope, the cross section being cut in a thickness direction along the one in-plane direction, the optically anisotropic layer 36*a* has bright portions and dark portions, which extend from one main surface to the other main surface, and has regions in which tilt directions of the dark portions are different from each other in a plane direction.

Further, it is preferable to have a region in which the average tilt angle of the dark portion with respect to the main surface of the optically anisotropic layer gradually changes along one direction (the arrangement axis D), and it is preferable to have a region in which the average tilt angle of the dark portion increases as the length of the single period of the liquid crystal alignment pattern decreases.

In a case where in the in-plane direction, such an optically anisotropic layer 36*a* as described above has regions in which lengths of the single periods over which the direction of the optical axis of the liquid crystal compound rotates by 180° in a plane and has regions in which magnitudes of twisted angles in the thickness direction are different from each other in the in-plane direction, and has a configuration in which the shorter single period A of the liquid crystal alignment pattern the region has, the larger the twisted angle in the thickness direction is, the optically anisotropic layer 36*a* is observed as an optically anisotropic layer in which in an image captured by observing a cross section of the optically anisotropic layer with a scanning electron microscope, the cross sections being cut in a thickness direction along the arrangement axis D, the average tilt angle of the dark portion increases as the length of the single period of the liquid crystal alignment pattern decreases.

The configuration in which the twisted angle of the thickness direction in the plane direction varies depending on in-plane regions can be formed by adding a photoreactive chiral agent to the liquid crystal composition, applying the liquid crystal composition to the alignment film, and irradiating the regions with light at different irradiation doses such that the helical twisting power (HTP) of the photoreactive chiral agent varies depending on the regions.

Specifically, the configuration of the optically anisotropic layer, in which the twisted angle of the thickness direction varies depending on in-plane regions, can be formed by using the chiral agent in which back isomerization, dimerization, isomerization, dimerization, or the like occurs due to light irradiation such that the helical twisting power (HTP) changes and irradiating the liquid crystal composition for forming the optically anisotropic layer with light having a wavelength at which the HTP of the chiral agent changes before or during the curing of the liquid crystal composition while changing the irradiation dose depending on the regions.

For example, in a case of using a chiral agent in which the HTP decreases during light irradiation, the HTP of the chiral agent decreases during light irradiation. Here, in a case of changing the irradiation dose of light for each region, the decrease in HTP is large, the induction of helix is small, and thus the twisted angle of the twisted structure decreases, for example, in a region that is irradiated with the light at a high irradiation dose. On the other hand, in a region that is irradiated with the light at a low irradiation dose, a decrease in HTP is small, and thus the twisted angle of the twisted structure increases.

The method of changing the irradiation dose of light for each of the regions is not particularly limited, and a method of irradiating light through a gradation mask, a method of changing the irradiation time for each of the regions, or a method of changing the irradiation intensity for each of the regions can be used.

The gradation mask refers to a mask in which a transmittance with respect to light for irradiation changes in a plane.

—Photoreactive Chiral Agent—

The photoreactive chiral agent is formed of, for example, a compound represented by the following Formula (I) and has properties capable of controlling an aligned structure of the liquid crystal compound and changing a helical pitch of the liquid crystal compound, that is, a helical twisting power (HTP) of a helical structure during light irradiation. That is, the photoreactive chiral agent is a compound that causes a helical twisting power of a helical structure derived from a liquid crystal compound, preferably, a nematic liquid crystal compound to change during light irradiation (ultraviolet rays to visible rays to infrared rays), and includes a portion including a chiral portion and a portion in which a structural change occurs during light irradiation as necessary portions (molecular structural units). However, the photoreactive chiral agent represented by the following Formula (I) can significantly change the HTP of liquid crystal molecules.

The above-described HTP indicates the helical twisting power of a helical structure of a liquid crystal, that is, HTP=1/(pitch×chiral agent concentration [mass fraction]). For example, the HTP can be obtained by measuring a helical pitch (single period of the helical structure; m) of a liquid crystal molecule at a given temperature and converting the measured value into a value [$\mu m^{-1}$] in terms of the concentration of the chiral agent. In a case where a selective reflection color is formed by the photoreactive chiral agent depending on the illuminance of light, a change ratio in HTP (HTP before irradiation/HTP after irradiation) is preferably 1.5 or higher and more preferably 2.5 or higher in a case where the HTP decreases after irradiation, and is preferably 0.7 or lower and more preferably 0.4 or lower in a case where the HTP increases after irradiation.

Next, the compound represented by Formula (I) will be described.

General Formula (I)

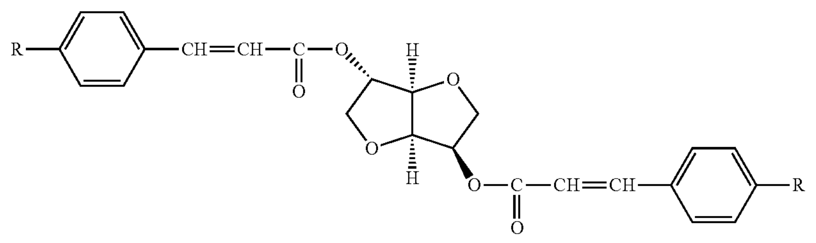

In the formula, R represents a hydrogen atom, an alkoxy group having 1 to 15 carbon atoms, an acryloyloxyalkyloxy group having 3 to 15 carbon atoms in total, or a methacryloyloxyalkyloxy group having 4 to 15 carbon atoms in total.

Examples of the alkoxy group having 1 to 15 carbon atoms include a methoxy group, an ethoxy group, a propoxy group, a butoxy group, a hexyloxy group, and a dodecyloxy group. Among them, an alkoxy group having 1 to 12 carbon atoms is preferable, and an alkoxy group having 1 to 8 carbon atoms is more preferable.

Examples of the acryloyloxyalkyloxy group having 3 to 15 carbon atoms in total include an acryloyloxyethyloxy group, an acryloyloxybutyloxy group, and an acryloyloxydecyloxy group. Among them, an acryloyloxyalkyloxy group having 5 to 13 carbon atoms is preferable, and an acryloyloxyalkyloxy group having 5 to 11 carbon atoms is more preferable.

Examples of the methacryloyloxyalkyloxy group having 4 to 15 carbon atoms in total include a methacryloyloxyethyloxy group, a methacryloyloxybutyloxy group, and a methacryloyloxydecyloxy group. Among them, a methacryloyloxyalkyloxy group having 6 to 14 carbon atoms is preferable, and a methacryloyloxyalkyloxy group having 6 to 12 carbon atoms is more preferable.

The molecular weight of the photoreactive chiral agent represented by Formula (I) is preferably 300 or higher. In addition, it is preferable that the solubility in the liquid crystal compound described later is high, and it is more preferable that the solubility parameter SP value is close to that of the liquid crystal compound.

Hereinafter, specific examples (exemplary compounds (1) to (15)) of the compound represented by Formula (I) will be shown, but the present invention is not limited thereto.

(1)

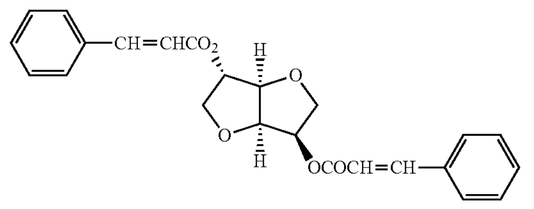

Right-twisted
Mw = 406.43

-continued
(2)
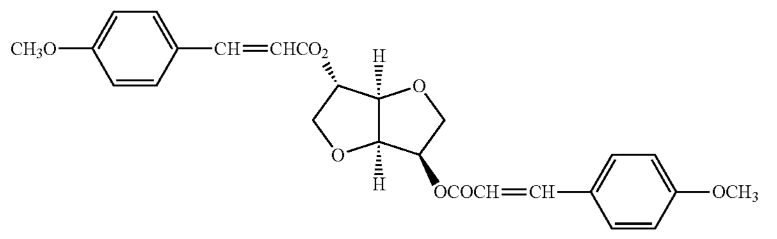
Right-twisted
Mw = 466.48
(3)
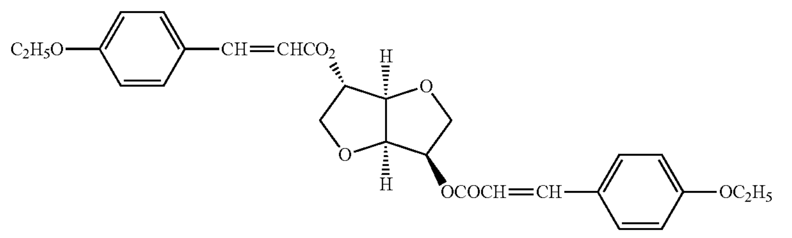
Right-twisted
Mw = 494.53
(4)
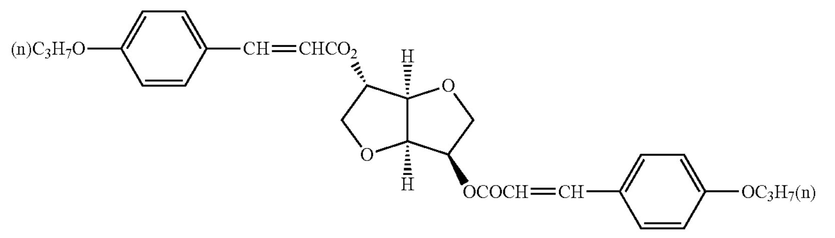
Right-twisted
Mw = 522.59
(5)
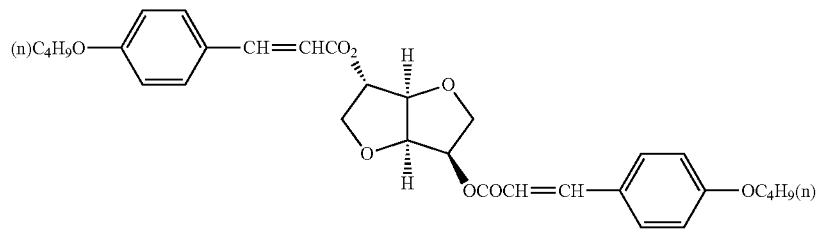
Right-twisted
Mw = 550.64
(6)
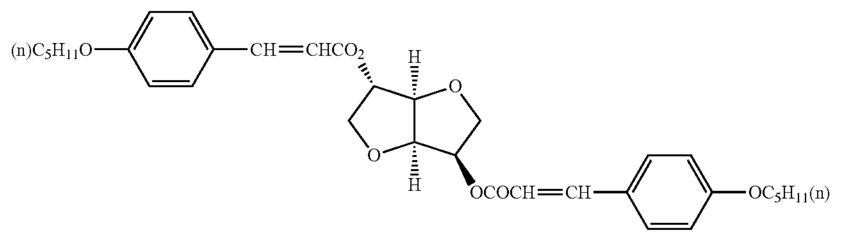
Right-twisted
Mw = 578.69

-continued
(7)
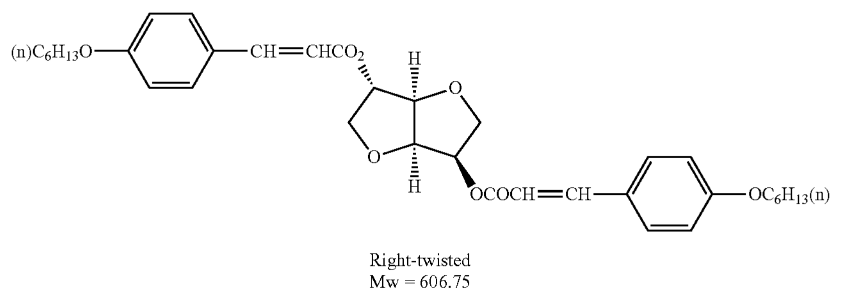
Right-twisted
Mw = 606.75
(8)
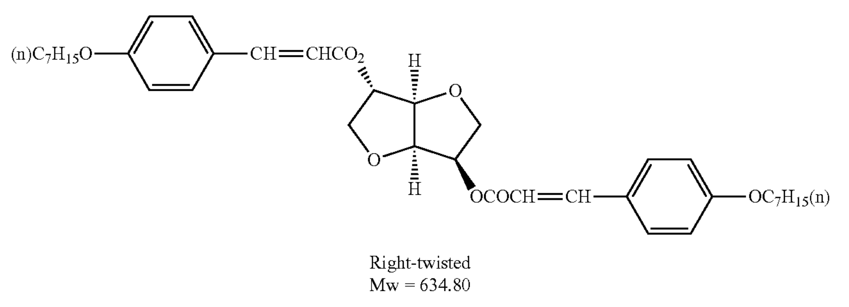
Right-twisted
Mw = 634.80
(9)
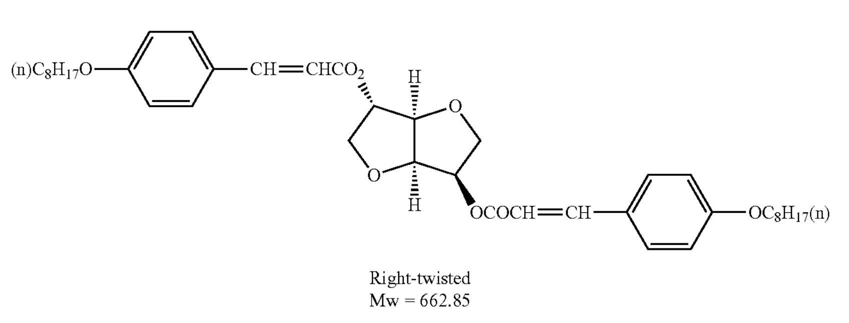
Right-twisted
Mw = 662.85
(10)
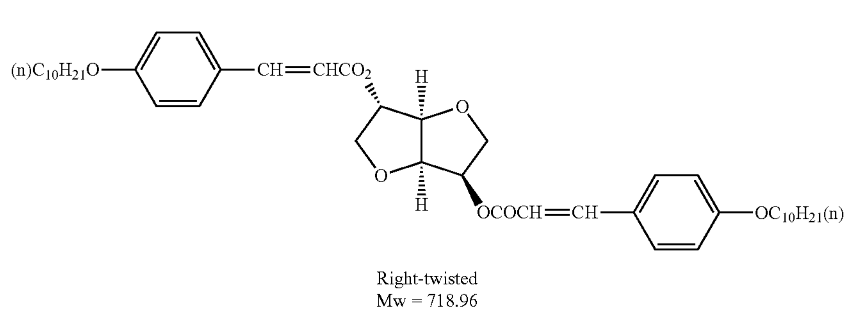
Right-twisted
Mw = 718.96
(11)
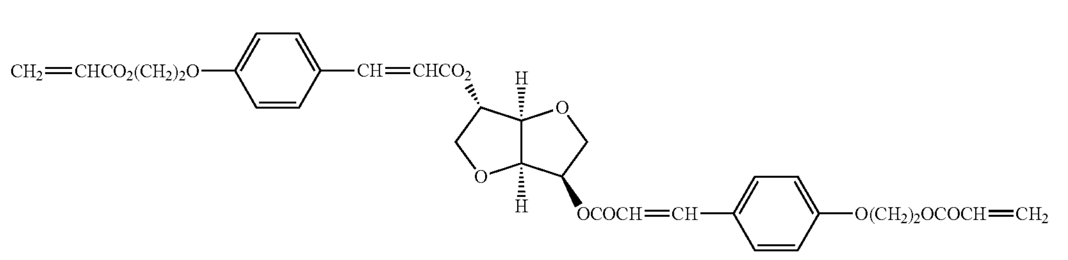

-continued (12)

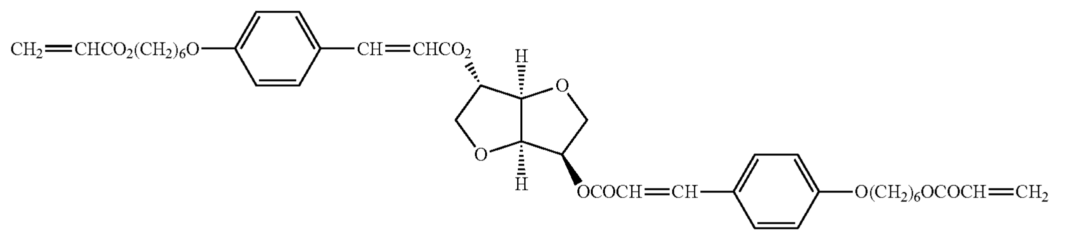

(13)

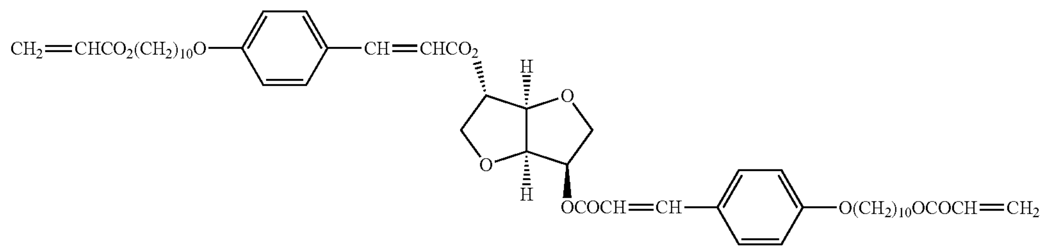

(14)

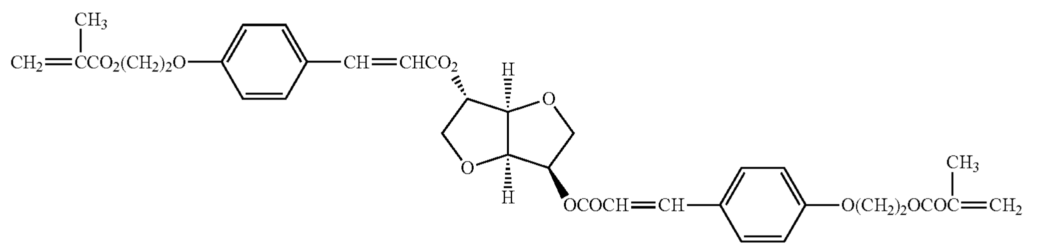

(15)

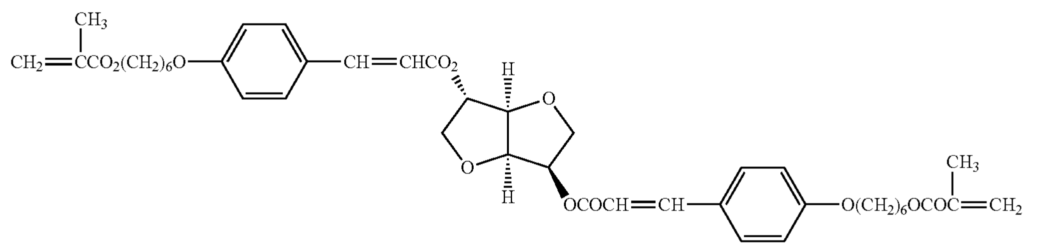

In the present invention, as the photoreactive chiral agent, for example, a photoreactive optically active compound represented by the following Formula (II) is also used.

General Formula (II)

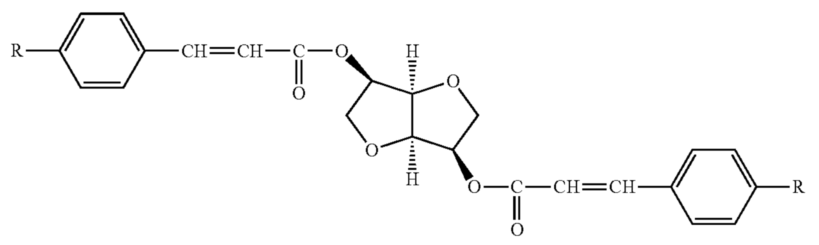

In the formula, R represents a hydrogen atom, an alkoxy group having 1 to 15 carbon atoms, an acryloyloxyalkyloxy group having 3 to 15 carbon atoms in total, or a methacryloyloxyalkyloxy group having 4 to 15 carbon atoms in total.

Examples of the alkoxy group having 1 to 15 carbon atoms include a methoxy group, an ethoxy group, a propoxy group, a butoxy group, a hexyloxy group, an octyloxy group, and a dodecyloxy group. Among them, an alkoxy group having 1 to 10 carbon atoms is preferable, and an alkoxy group having 1 to 8 carbon atoms is more preferable.

Examples of the acryloyloxyalkyloxy group having 3 to 15 carbon atoms in total include an acryloyloxy group, an acryloyloxyethyloxy group, an acryloyloxypropyloxy group, an acryloyloxyhexyloxy group, an acryloyloxybutyloxy group, and an acryloyloxydecyloxy group. Among them, an acryloyloxyalkyloxy group having 3 to 13 carbon atoms is preferable, and an acryloyloxyalkyloxy group having 3 to 11 carbon atoms is more preferable.

Examples of the methacryloyloxyalkyloxy group having 4 to 15 carbon atoms in total include a methacryloyloxy group, a methacryloyloxyethyloxy group, and a methacryloyloxyhexyloxy group. Among them, a methacryloyloxyalkyloxy group having 4 to 14 carbon atoms is preferable, and a methacryloyloxyalkyloxy group having 4 to 12 carbon atoms is more preferable.

The molecular weight of the photoreactive optically active compound represented by Formula (II) is preferably 300 or higher. In addition, it is preferable that the solubility in the liquid crystal compound described later is high, and it is more preferable that the solubility parameter SP value is close to that of the liquid crystal compound.

Hereinafter, specific examples (exemplary compounds (21) to (32)) of the photoreactive optically active compound represented by Formula (II) will be shown, but the present invention is not limited thereto.

(21)

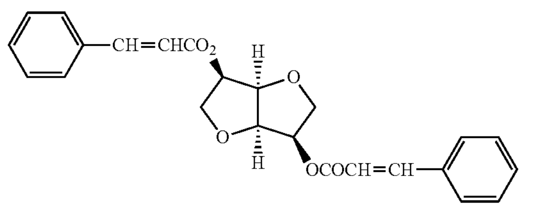

Left-twisted
Mw = 406.43

(22)

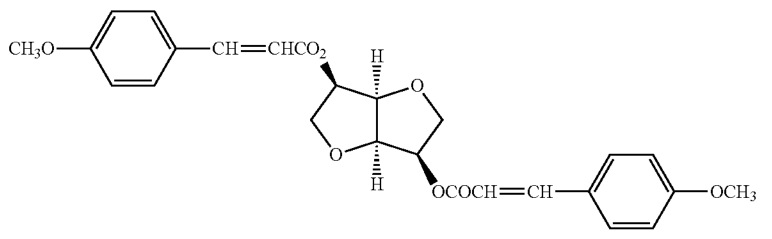

Left-twisted
Mw = 466.48

(23)

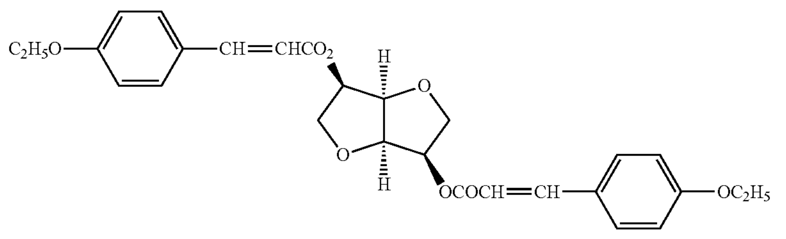

Left-twisted
Mw = 494.53

(24)

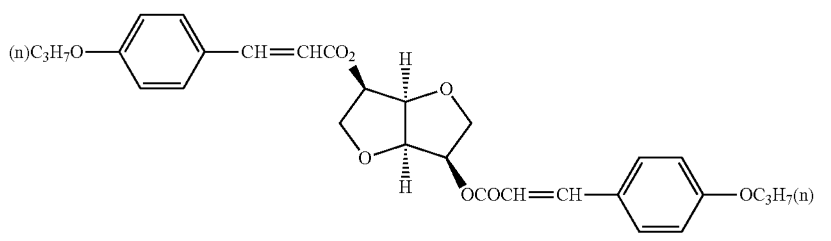

Left-twisted
Mw = 522.59

-continued
(25)
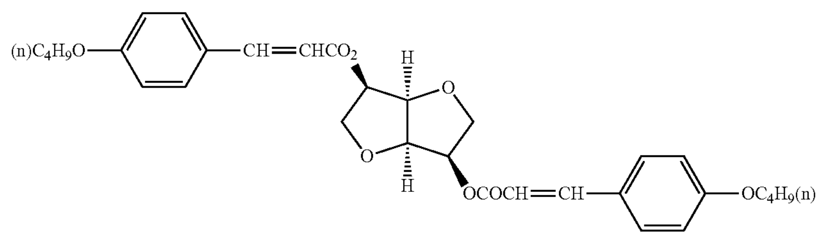
Left-twisted
Mw = 550.64
(26)
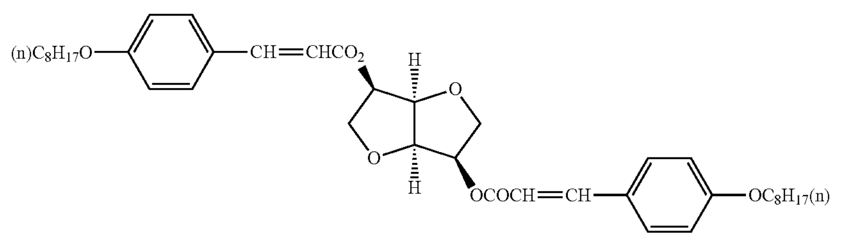
Left-twisted
Mw = 662.85
(27)
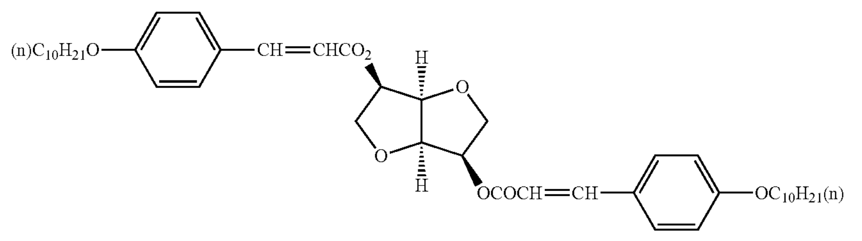
Left-twisted
Mw = 718.96
(28)
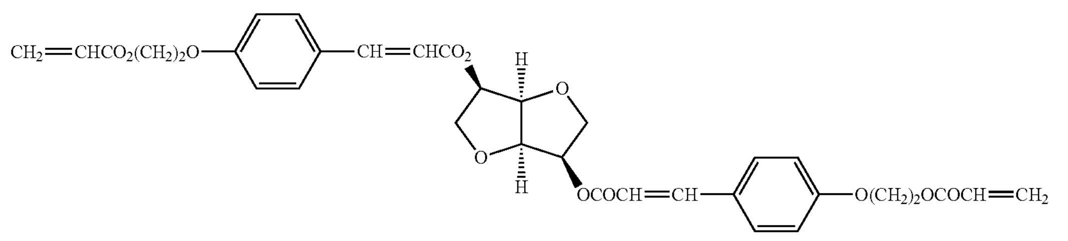
(29)
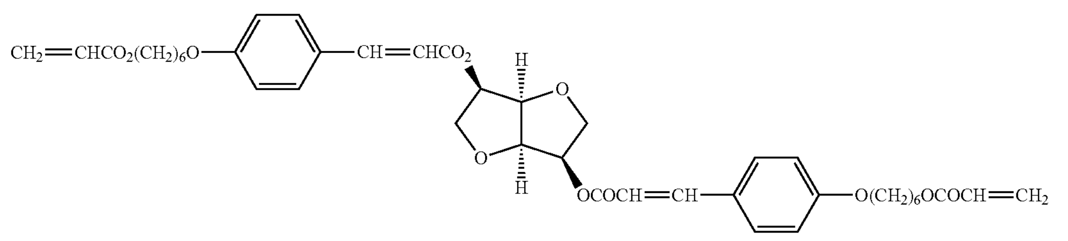
(30)
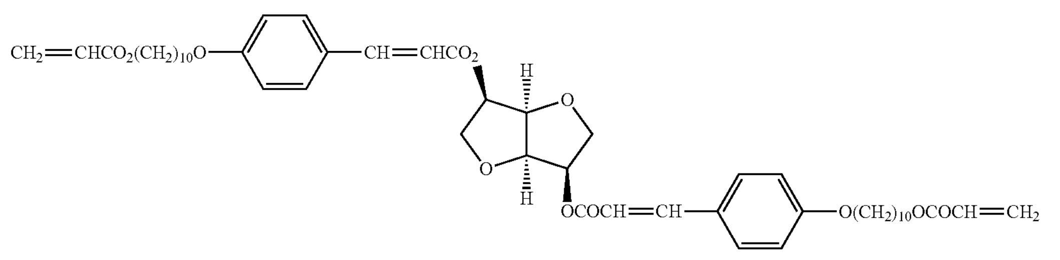

-continued (31)

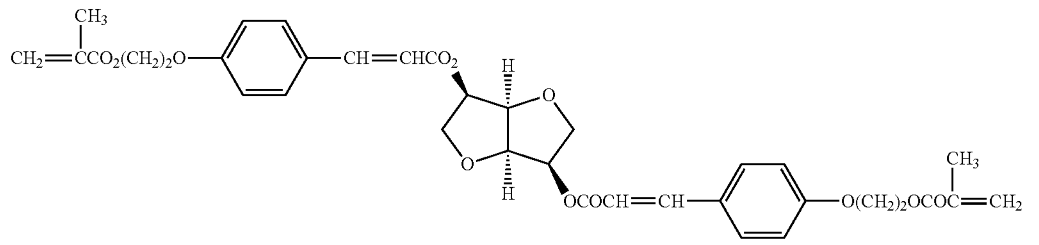

(32)

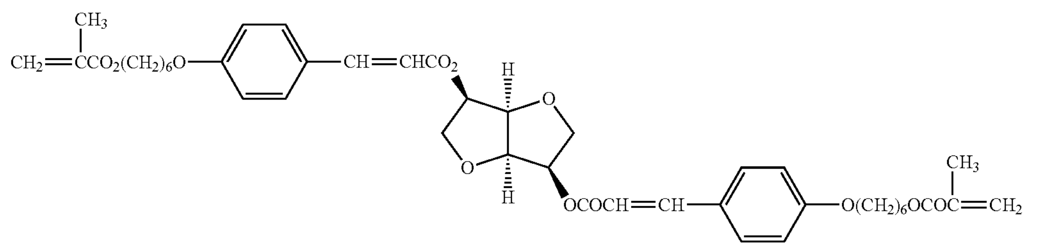

In addition, the photoreactive chiral agent can also be used in combination with a chiral agent having no photoreactivity such as a chiral compound having a large temperature dependence of the helical twisting power. Examples of the known chiral agent having no photoreactivity include chiral agents described in JP2000-44451A, JP1998-509726A (JP-H10-509726A), WO98/00428A, JP2000-506873A, JP1997-506088A (JP-H9-506088A), Liquid Crystals (1996, 21, 327), and Liquid Crystals (1998, 24, 219).

Here, in the optically anisotropic layer, it is preferable that bright portions and dark portions, which extend from one main surface to the other main surface, are observed in an image captured by observing a cross section of the optically anisotropic layer with a scanning electron microscope, the cross sections being cut in a thickness direction along the one in-plane direction in which the direction of the optical axis derived from the liquid crystal compound changes while continuously rotating, and the dark portions have one or more or two or more inflection points of angle.

Figure 13:
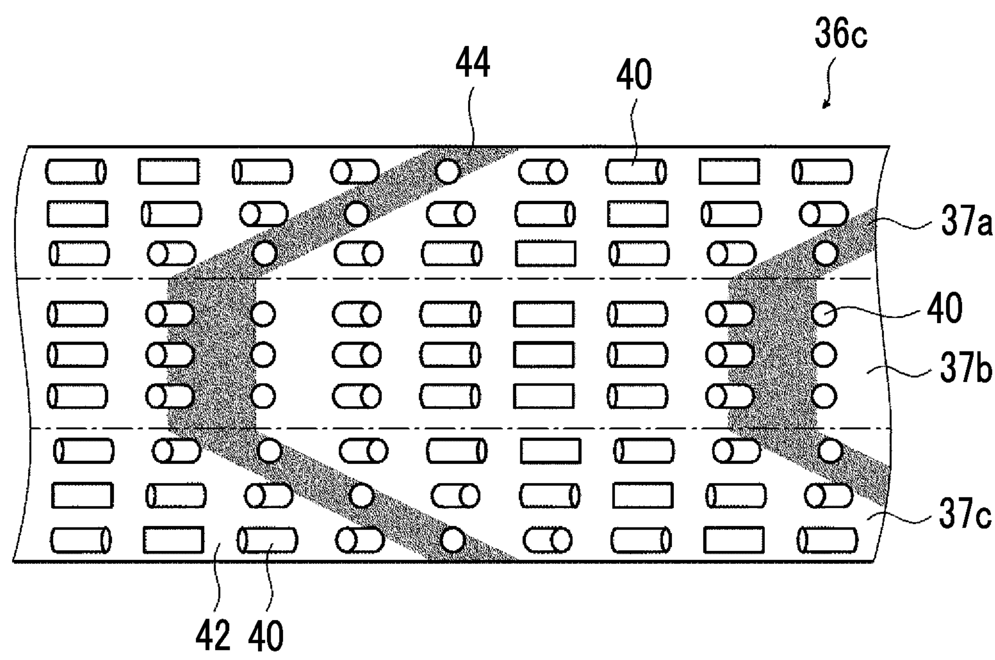
FIG. 13 is a view conceptually showing another example of the optically anisotropic layer included in the liquid crystal diffraction element according to the present invention.

An example of such an optically anisotropic layer is shown in FIG. 13. It is noted that in FIG. 13, a bright portion 42 and a dark portion 44 are shown to be overlapped on a cross section of the optically anisotropic layer 36*c*. In the following description, the image captured by observing cross sections of the optically anisotropic layer with SEM, the cross sections being cut in a thickness direction along the one in-plane direction in which the optical axis rotates, is also simply referred to as the "cross-sectional SEM image".

In the cross-sectional SEM image of the optically anisotropic layer 36*c* shown in FIG. 13, the dark portion 44 has two inflection points at which the angle changes. That is, the optically anisotropic layer 36*a* can also include three regions including a region 37*a*, a region 37*b*, and a region 37*c* corresponding to the inflection points of the dark portion 44 in the thickness direction.

The optically anisotropic layer 36*c* has, at any position in the thickness direction, the liquid crystal alignment pattern where the optical axis derived from the liquid crystal compound 40 rotates clockwise to the left direction in the drawing in the in-plane direction. In addition, the single period of the liquid crystal alignment pattern is constant in the thickness direction.

In addition, as shown in FIG. 13, in the lower region 37*c* in the thickness direction, the liquid crystal compound 40 is twisted and aligned to be helically twisted clockwise (to the right) from the upper side to the lower side in the drawing in the thickness direction.

In the middle region 37*b* in the thickness direction, the liquid crystal compound 40 is not twisted in the thickness direction, and the optical axes of the liquid crystal compounds 40 laminated in the thickness direction face the same direction. That is, it is preferable that the optical axes of the liquid crystal compounds 40 present at the same position in the in-plane direction face the same direction.

In the upper region 37*a* in the thickness direction, the liquid crystal compound 40 is twisted and aligned to be helically twisted counterclockwise (to the left) from the upper side to the lower side in the drawing in the thickness direction.

That is, in the region 37*a*, the region 37*b*, and the region 37*c* of the optically anisotropic layer 36*c* shown in FIG. 13, the states of twisting of the liquid crystal compounds 40 in the thickness direction are different from each other.

In the optically anisotropic layer having the liquid crystal alignment pattern in which the optical axis derived from the liquid crystal compound continuously rotates in the one in-plane direction, the bright portions and the dark portions in the cross-sectional SEM image of the optically anisotropic layer are observed such that the liquid crystal compounds facing the same direction are connected.

For example, in FIG. 13, the dark portions 44 are observed to connect the liquid crystal compounds 40 of which the optical axes face a direction perpendicular to the paper plane.

In the lowermost region 37*c* in the thickness direction, the dark portion 44 is tilted to the upper left side in the drawing. In the middle region 37*b*, the dark portion 44 extends in the thickness direction. In the uppermost region 37*a* in the thickness direction, the dark portion 44 is tilted to the upper right side in the drawing.

That is, the optically anisotropic layer 36*c* shown in FIG. 13 has two inflection points of angle where the angle of the dark portion 44 changes. In addition, in the uppermost region 37*a*, the dark portion 44 is tilted to the upper right side. In the lowermost region 37*b*, the dark portion 44 is tilted to the upper left side. That is, in the region 37*a* and the region 37*c*, the tilt directions of the dark portions 44 are different from each other.

Further, the optically anisotropic layer 36*c* shown in FIG. 13 has one inflection point at which the dark portion 44 is folded in a direction opposite to the tilt direction.

Specifically, regarding the dark portion 44 of the optically anisotropic layer 36*c*, the tilt direction in the region 37*a* and the tilt direction in the region 37*b* are opposite to each other. Therefore, at the inflection point positioned at the interface between the region 37*a* and the region 37*b*, the tilt direction is folded in the opposite direction. That is, the optically anisotropic layer 36*c* has one inflection point at which the tilt direction is folded in the opposite direction.

In addition, in the region 37*a* and the region 37*c* of the optically anisotropic layer 36*c*, for example, the thicknesses are the same, and the states of twisting of the liquid crystal compounds 40 in the thickness direction are different from each other. Therefore, as shown in FIG. 13, the bright portions 42 and the dark portions 44 in the cross-sectional SEM image are formed in a substantially C-shape.

Accordingly, in the optically anisotropic layer 36*c*, the shape of the dark portion 44 is symmetrical with respect to the center line in the thickness direction.

In the liquid crystal diffraction element according to the embodiment of the present invention, in such an optically anisotropic layer 36*c*, that is, in the cross-sectional SEM image, the optically anisotropic layer 36*c* has the bright portions 42 and the dark portions 44, which extend from one surface to another surface, each of the dark portions 44 has one or more or two or more inflection points of angle. As a result, the wavelength dependence of the diffraction efficiency can be reduced, and light can be diffracted with the same diffraction efficiency irrespective of wavelengths.

It is noted that although the example shown in FIG. 13 shows a configuration in which the dark portion 44 has two or more inflection points of angle, the dark portion 44 is not limited thereto, and a configuration in which the dark portion 44 has one inflection point of angle may be adopted, or a configuration in which the dark portion 44 has three or more inflection points of angle. For example, in a case of a configuration in which the dark portion 44 of the optically anisotropic layer has one inflection point of angle, the optically anisotropic layer may consist of the region 37*a* and the region 37*c* shown in FIG. 13 (see FIG. 23), may be configured to consist of the region 37*a* and the region 37*b*, or may be configured to consist of the region 37*b* and the region 37*c*. Alternatively, for, example, in a case of a configuration in which the dark portion 44 of the optically anisotropic layer has three inflection points of angle, the configuration may be any configuration in which two regions 37*a* and two regions 37*c* shown in FIG. 13 are alternately provided.

In addition, in a case where the optically anisotropic layer has a radial liquid crystal alignment pattern as shown in FIG. 2, it is preferable that in an image (cross-sectional SEM image) captured by observing a cross section of the optically anisotropic layer with a scanning electron microscope, the cross sections being cut in a thickness direction along the one in-plane direction, the optically anisotropic layer has bright portions and dark portions, which extend from one main surface to the other main surface, and in the optically anisotropic layer, shapes of the bright portions and the dark portions in a cross section of a radial center portion are symmetrical with respect to the center line of the optically anisotropic layer in the thickness direction, and shapes of the bright portions and the dark portions in a cross section of a radial end part are asymmetrical with respect to the center line of the optically anisotropic layer in the thickness direction.

Figure 14:
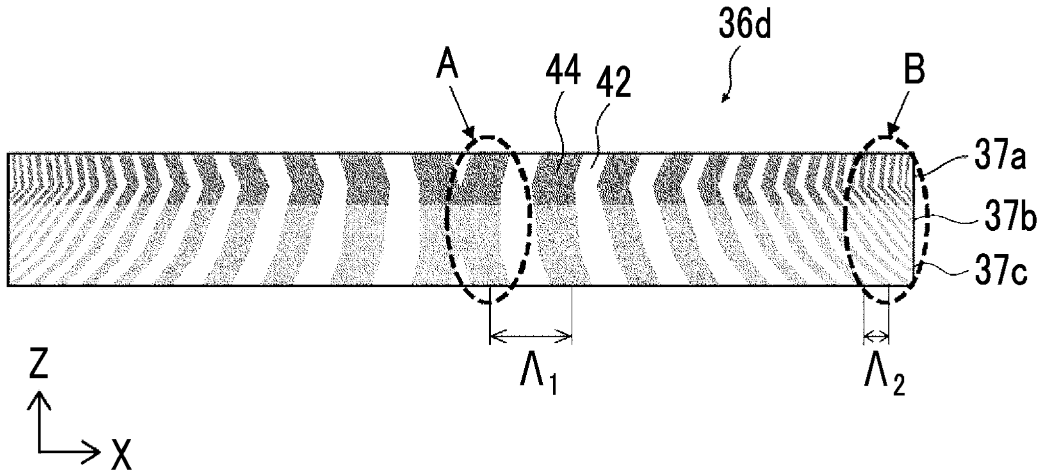
FIG. 14 is a view conceptually showing another example of the optically anisotropic layer included in the liquid crystal diffraction element according to the present invention.

An example of such an optically anisotropic layer is shown in FIG. 14.

An optically anisotropic layer 36*d* shown in FIG. 14 has a configuration in which in the liquid crystal alignment pattern, the one in-plane direction in which the direction of the optical axis of the liquid crystal compound 40 changes while continuously rotating is provided in a radial shape from the center of the optically anisotropic layer 36*a* and in which the single period Λ of the liquid crystal alignment pattern gradually decreases from the center toward the outer side in each of the one in-plane directions.

In addition, in the cross-sectional SEM image, the optically anisotropic layer 36*d* has a stripe pattern of the bright portions 42 and the dark portions 44, which extend from one surface to another surface, and each of the dark portions 44 has two inflection points. In addition, in all of the dark portions 44, a tilt direction in the upper region in the drawing and a tilt direction in the lower region in the drawing are opposite to each other. That is, each of the dark portions 44 has regions in which the tilt directions are different. Specifically, in a portion of the optically anisotropic layer 36*d* shown in FIG. 14 on the right side from the center, the dark portion 44 is tilted in the right direction in an upper region in the drawing, and the dark portion 44 is tilted in the left direction in a lower region in the drawing. On the other hand, in a portion of the optically anisotropic layer 36*d* on the left side from the center, the dark portion 44 is tilted in the left direction in an upper region in the drawing, and the dark portion 44 is tilted in the right direction in a lower region in the drawing.

In the present invention, in a case where an angle formed between a line that connects a point of contact between each dark portions 44 and one surface of the optically anisotropic layer 36*d* and a point of contact between each dark portion 44 and the other surface thereof, and a line perpendicular to the main surface of the optically anisotropic layer 36*d*, is defined as the average tilt angle, the average tilt angle of the dark portion 44 gradually changes in the one in-plane direction (arrows $A_1$, $A_2$, $A_3$, and the like) in which the direction of the optical axis of the liquid crystal compound 40 changes while continuously rotating. Specifically, in the example shown in FIG. 14, the average tilt angle of the dark portion 44 in the vicinity of the center is about 0°, and the average tilt angle gradually increases from the center toward the outer side. That is, in the optically anisotropic layer 36*d* in the example shown in the drawing, as the single period Λ of the liquid crystal alignment pattern gradually decreases, the average tilt angle of the dark portion 44 gradually increases.

In the present invention, the description that the average tilt angle of the dark portion gradually changes is intended to indicate both a case where the average tilt angle continuously changes and a case where the average tilt angle changes stepwise.

It can also be said that such an optically anisotropic layer 36*d* has three regions (37*a*, 37*b*, 37*c*) in the thickness direction, and the tilt angles of the dark portions 44 at the same position in the plane direction in the regions are different.

Here, the cross-sectional SEM image of the optically anisotropic layer 36*d* shown in FIG. 14 at the radial center portion (the region portion indicated as A in FIG. 14) has such a view as shown in FIG. 13.

As shown in FIG. 13, in the center portion, in the lower region 37*c* in the thickness direction, the liquid crystal compound 40 is aligned to be twisted clockwise (to the right) from the upper side to the lower side in the drawing in the thickness direction.

On the other hand, in the middle region 37*b* in the thickness direction, the liquid crystal compound 40 is not twisted in the thickness direction, and the optical axes of the liquid crystal compounds 40 laminated in the thickness direction face the same direction. That is, it is preferable that the optical axes of the liquid crystal compounds 40 present at the same position in the plane direction face the same direction.

In addition, in the upper region 37*a* in the thickness direction, the liquid crystal compound 40 is aligned to be twisted counterclockwise (to the left) from the upper side to the lower side in the drawing in the thickness direction.

In the radial center portion of the optically anisotropic layer 36*d*, the states of twisting of the liquid crystal compounds 40 in the thickness direction are different from each other in the region 37*a*, the region 37*b*, and the region 37*c*. Therefore, as shown in FIG. 13, the bright portions 42 and the dark portions 44 in the SEM image are formed in a substantially C-shape.

In addition, in the example shown in FIG. 13, the thickness of the region 37*a* and the thickness of the region 37*c* are substantially the same, and the twisted angle of the thickness direction of the liquid crystal compound 40 in the region 37*a* and the twisted angle of the thickness direction of the liquid crystal compound 40 in the region 37*c* are substantially the same. Accordingly, in the dark portion 44 of the region 37*a* and the dark portion 44 of the region 37*c*, the tilt directions are opposite, and the tilt angles are the same. In the region 37*b*, the liquid crystal compounds 40 are not twisted in the thickness direction. Therefore, the dark portion 44 is not tilted. Accordingly, the average tilt angle of the dark portion 44 in the center portion of the optically anisotropic layer 36*a* is substantially 0°.

That is, it can be said that in the optically anisotropic layer 36*d*, the shapes of the bright portion 42 and the dark portion 44 are symmetrical with respect to the center line of the optically anisotropic layer 36*d* in the thickness direction in the cross section of the radial center portion.

Figure 15:
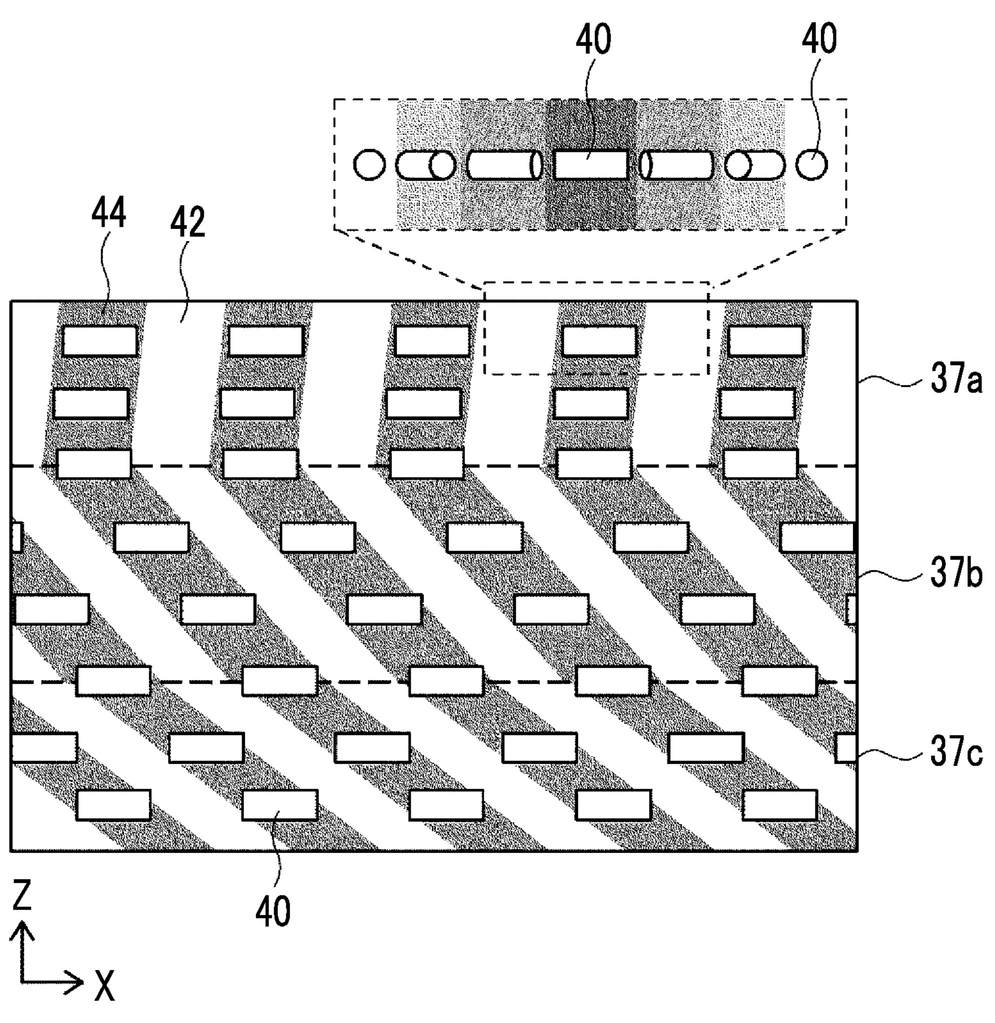
FIG. 15 is a partially enlarged view showing a region B of the optically anisotropic layer shown in FIG. 14.

On the other hand, the cross-sectional SEM image of the optically anisotropic layer 36*d* shown in FIG. 14 at the radial end part (the outer side portion, the region portion indicated as B in FIG. 14) has such a view as shown in FIG. 15.

In the outer side portion shown in FIG. 15, in the lower region 37*c* in the thickness direction, the liquid crystal compound 40 is aligned to be twisted clockwise (to the right) from the upper side to the lower side in the drawing in the thickness direction. In the outer side portion of the region 37*c*, the twisted angle of the thickness direction increases as compared with that in the center portion.

In addition, in the middle region 37*b* in the thickness direction, the liquid crystal compound 40 is aligned to be twisted clockwise (to the right) from the upper side to the lower side in the drawing in the thickness direction.

In addition, the twisted angle of the thickness direction in the region 37*c* and the twisted angle of the thickness direction in the region 37*b* are different. Accordingly, in the dark portion 44 of the region 37*c* and the dark portion 44 of the region 37*b*, the tilt directions are the same, and the tilt angles are different.

On the other hand, in the upper region 37*a* in the thickness direction, the liquid crystal compound 40 is aligned to be twisted counterclockwise (to the left) from the upper side to the lower side in the drawing in the thickness direction. Accordingly, the tilt direction of the region 37*a* of the dark portion 44 is opposite to that of the region 37*c* and the region 37*b*. In addition, in the outer side portion of the region 37*a*, the twisted angle of the thickness direction is smaller than that of the center portion. Therefore, the absolute value of the tilt angle of the dark portion 44 in the region 37*a* is smaller than the absolute value of the tilt angle of the dark portion 44 in the region 37*c*.

Accordingly, the average tilt angle of the dark portion 44 in the outer side portion of the optically anisotropic layer 36*d* is a value that is not 0°.

That is, it can be said that in the optically anisotropic layer 36*d*, the shapes of the bright portion 42 and the dark portion 44 are asymmetrical with respect to the center line of the optically anisotropic layer 36*d* in the thickness direction in the cross section of the radial end part.

In the example shown in FIG. 14, in the region 37*a*, the region 37*b*, and the region 37*c* of the optically anisotropic layer 36*d*, the single period Λ of the liquid crystal alignment pattern gradually decreases from the center toward the outer side. In addition, the right twist of the thickness direction in the region 37*c* increases from the center toward the outer side, the right twist of the thickness direction in the region 37*b* increases from the center toward the outer side, and the left twist of the thickness direction in the region 37*a* decreases from the center toward the outer side. As a result, it can be said that, in each of the regions, the twist of the thickness direction at the center can be imparted with the right twist toward the outer side. Due to such a configuration, the optically anisotropic layer 36*d* has a configuration in which, as shown in FIG. 14, shapes of the bright portions 42 and the dark portions 44 in a cross section of the radial center portion are symmetrical with respect to the center line of the optically anisotropic layer 36*d* in the thickness direction, and shapes of the bright portions 42 and the dark portions 44 in a cross section of the radial end part are asymmetrical with respect to the center line of the optically anisotropic layer 36*d* in the thickness direction.

In a case where the optically anisotropic layer has such a configuration, it is possible to suppress a decrease in diffraction efficiency even in a region in which the diffraction angle increases. This makes it possible to obtain a liquid crystal diffraction element in which the diffraction efficiency is high irrespective of diffraction angles and the amount of transmitted light is uniform. In addition, it is possible to reduce the wavelength dependence of the diffraction efficiency and diffract light with the same diffraction efficiency irrespective of wavelengths. In addition, it is possible to reduce the in-plane dependency of the diffraction efficiency.

Here, in the example shown in FIG. 14, the optically anisotropic layer 36*d* has a configuration in which two inflection points at which the tilt angle of each of the dark portions 44 changes are provided. However, the optically anisotropic layer 36*d* is not limited thereto, and each of the dark portions 44 may have a configuration in which one inflection point is provided or may have a configuration in which three or more inflection points are provided.

In addition, in the example shown in FIG. 14, the optically anisotropic layer 36*d* has a configuration in which the shapes of the bright portions 42 and the dark portions 44 in a cross section of the radial center portion are symmetrical with respect to the center line of the optically anisotropic layer 36*d* in the thickness direction, and shapes of the bright portions 42 and the dark portions 44 in a cross section of the radial end part are asymmetrical with respect to the center line of the optically anisotropic layer 36*d* in the thickness direction. However, the optically anisotropic layer **36*d* is not limited thereto and may have a configuration in which the shapes of the bright portions 42 and the dark portions 44 in a cross section of the radial center portion are asymmetrical in the thickness direction, and shapes of the bright portions 42 and the dark portions 44 in a cross section of the radial end part are asymmetrical with respect to the center line of the optically anisotropic layer 36*d*** in the thickness direction. It may be preferable to make the center portion asymmetrical so that a high diffraction efficiency is achieved both in the center portion and the end part. In addition, it is preferable to make the center portion asymmetric, for example, even in a case where the angle of the light incident into the center portion is not incident from the normal direction.

(Reflective-Type Optically Anisotropic Layer)

The optically anisotropic layer **36*b* that reflects and diffracts light will be described with reference to FIG. 16 and FIG. 17**.

Figure 16:
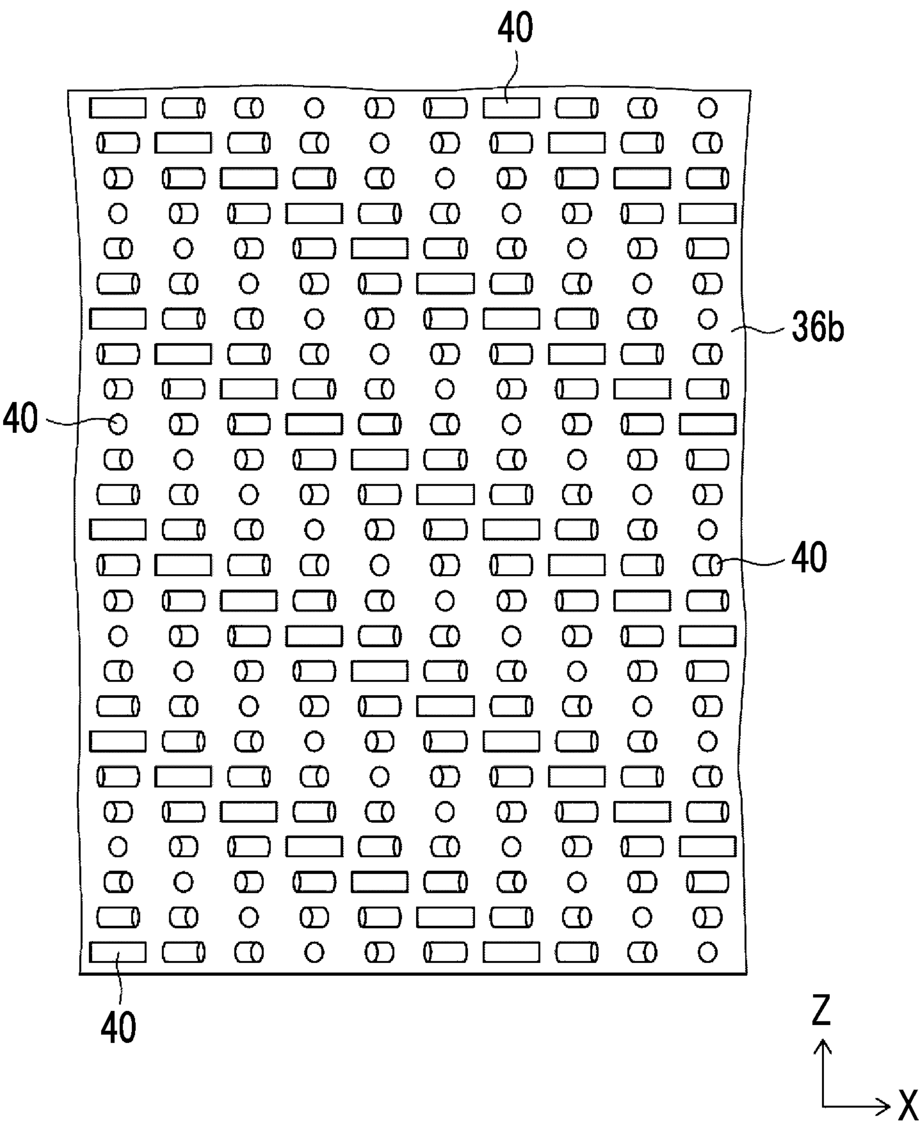
FIG. 16 is a view conceptually showing another example of the optically anisotropic layer included in the liquid crystal diffraction element according to the present invention.

FIG. 16 is a conceptual view of the optically anisotropic layer **36*b*. FIG. 17 is a schematic view showing an alignment state of the liquid crystal compound in a plane of the main surface of the optically anisotropic layer 36*b* shown in FIG. 16**.

Figure 17:
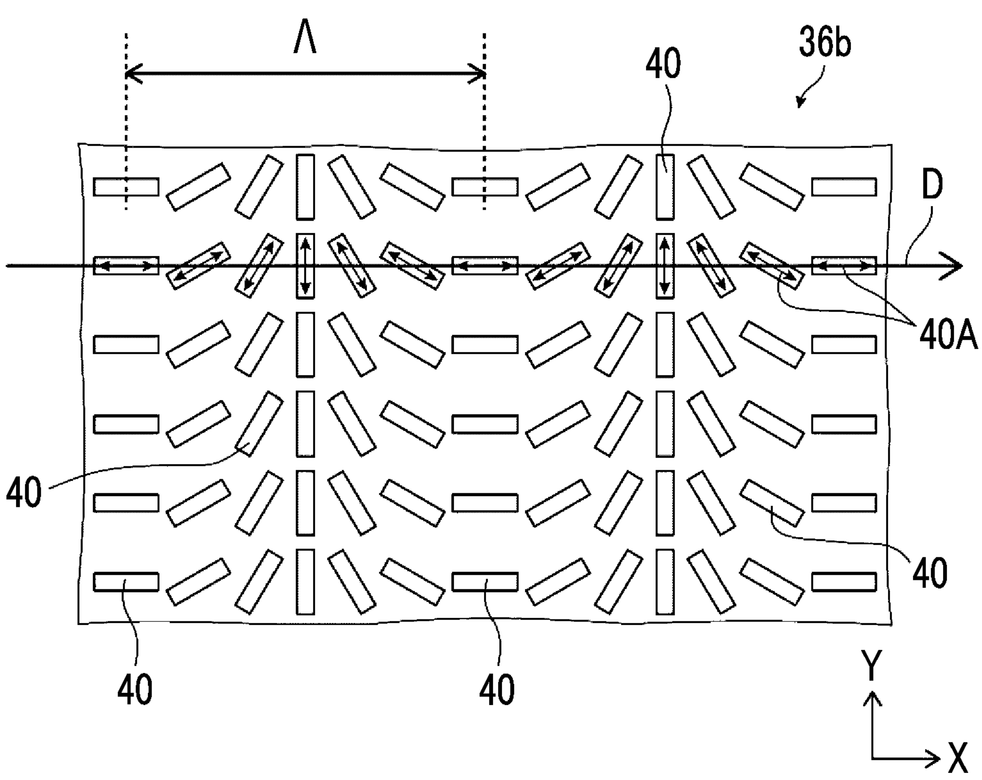
FIG. 17 is a plan view showing the optically anisotropic layer shown in FIG. 16.

As shown in FIG. 16 and FIG. 17, the optically anisotropic layer **36*b* is a layer in which the liquid crystal compound is cholesterically aligned in the thickness direction. In addition, FIG. 16 and FIG. 17** show examples in which the liquid crystal compound forming the cholesteric liquid crystal layer is a rod-like liquid crystal compound.

In the following description, the optically anisotropic layer **36*b*** will also be referred to as a cholesteric liquid crystal layer.

The optically anisotropic layer **36*b*** is a cholesteric liquid crystal layer that is obtained by immobilizing a cholesteric liquid crystalline phase and has a liquid crystal alignment pattern in which a direction of an optical axis derived from a liquid crystal compound changes while continuously rotating along at least one in-plane direction.

As conceptually shown in FIG. 16, the optically anisotropic layer **36*b* has a helical structure in which the liquid crystal compound 40 is helically turned and laminated as in a cholesteric liquid crystal layer obtained by immobilizing a typical cholesteric liquid crystalline phase. In the helical structure, a configuration in which the liquid crystal compound 40 is helically rotated once (rotated by 360°) and laminated is set as one helical pitch (helical pitch P), and plural pitches of the helically turned liquid crystal compound 40** are laminated.

As is well known, the cholesteric liquid crystalline phase exhibits selective reflectivity at a specific wavelength with respect to the circularly polarized light which is either levorotatory or dextrorotatory. Whether or not the reflected light is dextrorotatory circularly polarized light or levorotatory circularly polarized light is determined depending on a helical twisted direction (sense) of the cholesteric liquid crystalline phase. Regarding the selective reflection of the circularly polarized light by the cholesteric liquid crystalline phase, in a case where the helical twisted direction of the cholesteric liquid crystalline phase is dextrorotatory, the dextrorotatory circularly polarized light is reflected, and in a case where the helical twisted direction of the cholesteric liquid crystalline phase is levorotatory, the levorotatory circularly polarized light is reflected.

A turning direction of the cholesteric liquid crystalline phase can be adjusted by adjusting the kind of the liquid crystal compound that forms the cholesteric liquid crystal layer and/or the kind of the chiral agent to be added.

In addition, a half-width A) (nm) of a selective reflection range (circularly polarized light reflection range) in which selective reflection is exhibited depends on Δn of the cholesteric liquid crystalline phase and the helical pitch P and complies with a relationship of $\Delta\lambda=\Delta n\times P$. Therefore, the width of the selective reflection range can be controlled by adjusting Δn. An can be adjusted by adjusting the kind of the liquid crystal compound that forms the cholesteric liquid crystal layer and a mixing ratio thereof, and a temperature during alignment immobilization.

Accordingly, for the wavelength of the light that is reflected (diffracted) by the cholesteric liquid crystal layer, the selective reflection wavelength range of the cholesteric liquid crystal layer may be set as appropriate, for example, by adjusting the helical pitch P of the cholesteric liquid crystal layer.

The half-width of the reflection wavelength range is adjusted depending on the use application of the optically anisotropic layer **36*b*** and may be, for example, 10 to 500 nm and is preferably 20 to 300 nm and more preferably 30 to 100 nm.

As shown in FIG. 17, in the X-Y plane of the optically anisotropic layer **36*b*, the liquid crystal compounds 40 are arranged along the arrangement axes D, and on each of the arrangement axes D, the direction of the optical axis 40A of the liquid crystal compound 40 changes while continuously rotating in the one in-plane direction along the arrangement axis D. Since the liquid crystal alignment pattern of the example shown in FIG. 17 is the same as the liquid crystal alignment pattern shown in FIG. 7**, the description thereof will be omitted.

Figure 18:
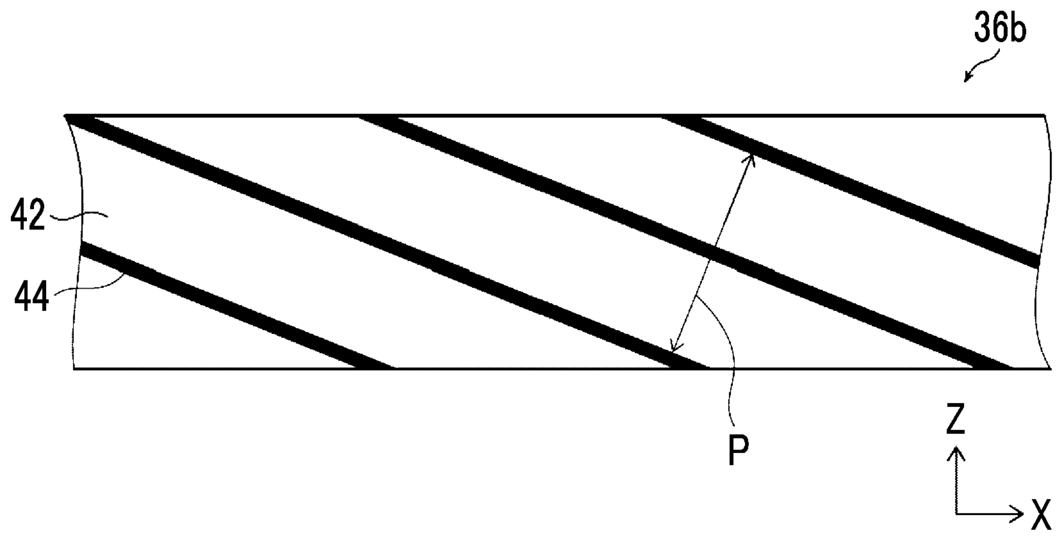
FIG. 18 is a conceptually showing an SEM image of the optically anisotropic layer shown in FIG. 16.

In a case where the cross section of the optically anisotropic layer **36*b* shown in FIG. 16, which is taken along the arrangement axis D, is observed with a scanning electron microscope (SEM), such an arrangement direction in which bright portions 42 and dark portions 44 are alternately arranged as shown in FIG. 18, a stripe pattern tilted at a predetermined angle with respect to the main surface (X-Y plane) is observed. In such an SEM cross section, an interval between a bright portion 42 and a bright portion 42 adjacent thereto or between a dark portion 44 and a dark portion 44 adjacent thereto in a normal direction of lines formed by the bright portions 42 or the dark portions 44 substantially matches with a ½ pitch. That is, as indicated by P in FIG. 18, two bright portions 42 and two dark portions 44** substantially match with one helical pitch (one helical turn), that is, the pitch P. In the following description, the description will be made without distinguishing the helical pitch from the pitch for the light and dark lines.

Hereinafter, the action of the diffraction due to the optically anisotropic layer **36*b*** will be described.

In a cholesteric liquid crystal layer of the related art, a helical axis derived from a cholesteric liquid crystalline phase is perpendicular to the main surface (X-Y plane), and a reflecting surface thereof is parallel to the main surface (X-Y plane). In addition, the optical axis of the liquid crystal compound is not tilted with respect to the main surface (X-Y plane). In other words, the optical axis is parallel to the main surface (X-Y plane). Accordingly, in a case where the X-Z plane of the cholesteric liquid crystal layer in the related art is observed with an SEM, an arrangement direction in which bright portions and dark portions are alternately arranged is perpendicular to the main surface (X-Y plane).

The cholesteric liquid crystalline phase has specular reflectivity. Therefore, in a case where light is incident from the normal direction into the cholesteric liquid crystal layer, the light is reflected in the normal direction.

Figure 19:
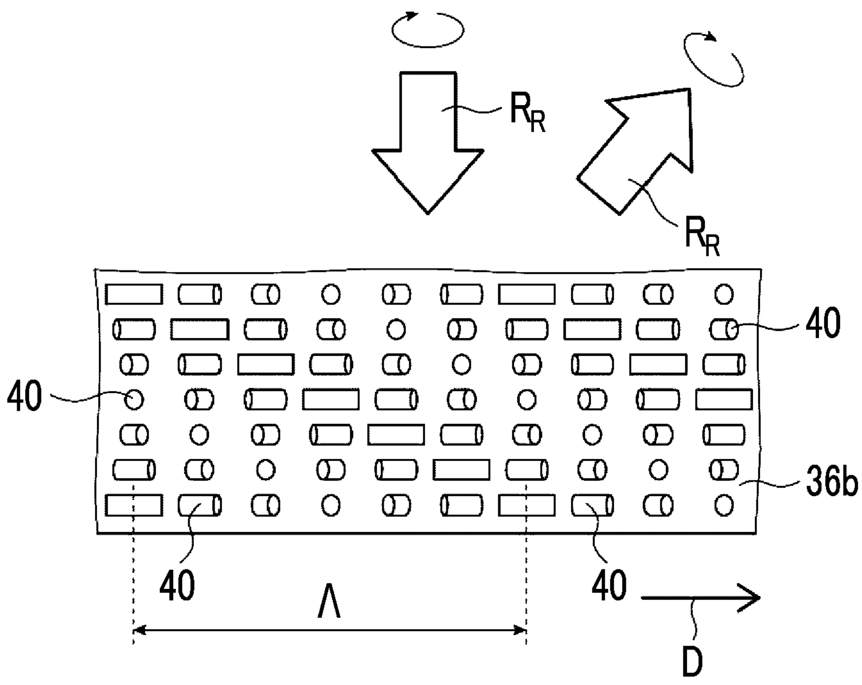
FIG. 19 is a conceptual view for describing an action of the optically anisotropic layer shown in FIG. 16.

On the other hand, the optically anisotropic layer 36*b* reflects the incident light to be tilted in the arrangement axis D direction with respect to the specular reflection. Hereinafter, the description will be made with reference to FIG. 19.

For example, it is assumed that the optically anisotropic layer 36*b* is a cholesteric liquid crystal layer that selectively reflects dextrorotatory circularly polarized light $R_R$ of red light. In this case, in a case where light is incident into the optically anisotropic layer 36*b*, the optically anisotropic layer 36*b* reflects only the dextrorotatory circularly polarized light $R_R$ of the red light and transmits the other light.

In the optically anisotropic layer 36*b*, the optical axis 40A of the liquid crystal compound 40 changes while rotating in the arrangement axis D direction (the one in-plane direction).

The liquid crystal alignment pattern formed in the optically anisotropic layer 36*b* is a pattern that is periodic in the arrangement axis D direction. Therefore, as conceptually shown in FIG. 19, the dextrorotatory circularly polarized light $R_R$ of the red light incident into the optically anisotropic layer 36*b* is reflected (diffracted) in a direction corresponding to the period of the liquid crystal alignment pattern, and the reflected dextrorotatory circularly polarized light $R_R$ of red light is reflected (diffracted) in a direction tilted with respect to the XY plane (the main surface of the cholesteric liquid crystal layer) in the arrangement axis D direction.

That is, the optically anisotropic layer 36*b* can be used as a diffraction element that reflects (diffracts) the incident light, in a direction different from the specular reflection.

In the optically anisotropic layer 36*b*, by appropriately setting the arrangement axis D direction as the one in-plane direction in which the optical axis 40A rotates, the reflection direction (azimuth direction) of light can be adjusted.

In addition, in a case where circularly polarized light having the same wavelength and the same turning direction is reflected, a reflection direction of the circularly polarized light can be reversed in a case of reversing the rotation direction of the optical axis 40A of the liquid crystal compound 40 toward the arrangement axis D direction.

That is, in FIG. 16 and FIG. 17, the rotation direction of the optical axis 40A toward the arrangement axis D direction is clockwise, and one circularly polarized light is reflected in a state where it is tilted in the arrangement axis D direction. In a case of setting the rotation direction of the optical axis 40A to be counterclockwise, the circularly polarized light is reflected in a state where it is tilted in a direction opposite to the arrangement axis D direction.

Further, in the optically anisotropic layer 36*b* having the same liquid crystal alignment pattern, the reflection direction is reversed by adjusting the helical turning direction of the liquid crystal compound 40, that is, the turning direction of circularly polarized light to be reflected.

For example, in a case where the helical turning direction is right-twisted, the liquid crystal layer selectively reflects dextrorotatory circularly polarized light and has the liquid crystal alignment pattern in which the optical axis 40A rotates clockwise in the arrangement axis D direction. As a result, the dextrorotatory circularly polarized light is reflected in a state where it is tilted in the arrangement axis D direction.

In addition, for example, in a case where the helical turning direction is left-twisted, the optically anisotropic layer 36*b* selectively reflects levorotatory circularly polarized light and has the liquid crystal alignment pattern in which the optical axis 40A rotates clockwise in the arrangement axis D direction. As a result, the levorotatory circularly polarized light is reflected in a state where it is tilted in a direction opposite to the arrangement axis D direction.

In the liquid crystal alignment pattern of the liquid crystal compound in the optically anisotropic layer 36*b*, the angle (diffraction angle) of the reflected light with respect to the incidence light changes depending on the length of the single period Λ, which is a length over which the direction of the optical axis of the liquid crystal compound rotates by 180°. Specifically, in the optically anisotropic layer 36*b* having the liquid crystal alignment pattern, as the single period Λ decreases, the angle of reflected light with respect to the incidence light increases. That is, as the single period Λ decreases, reflected light can be reflected in a state where it is largely tilted with respect to incidence light.

In addition, in the optically anisotropic layer 36*b* having the liquid crystal alignment pattern, the reflection angle (diffraction angle) of light varies depending on the wavelength of light to be reflected. Specifically, as the wavelength of light increases, the angle of reflected light with respect to incidence light increases.

In the present invention, the length of the single period Λ of the diffraction element is not limited and may be appropriately set depending on the desired diffraction angle or the like. The length of the single period Λ is preferably 0.1 to 10 μm, more preferably 0.15 to 2 μm, and still more preferably 0.2 to 1 m.

Such a reflective-type optically anisotropic layer 36*b* can be formed by adding a chiral agent to the liquid crystal composition in the formation of the transmissive-type optically anisotropic layer 36*a* described above. As described above, the helical pitch of the helical structure in the liquid crystal phase can be adjusted depending on the kind and content of the chiral agent. Accordingly, in a case of producing the reflective-type optically anisotropic layer 36*b*, it is sufficient to add, to the liquid crystal composition, such a kind and content of a chiral agent that the liquid crystal phase to be the optically anisotropic layer 36*b* has a cholesteric alignment.

It is noted that although the example shown in FIG. 16 shows a configuration in which, on the X-Z plane of the optically anisotropic layer 36*b*, the optical axis 40A of the liquid crystal compound 40 is aligned to be parallel to the main surface (X-Y plane), which is not limited thereto. For example, a configuration in which, on the X-Z plane of the optically anisotropic layer 36*b*, the optical axes 40A of the liquid crystal compound 40 are aligned to be tilted with respect to the main surface (X-Y plane) may be adopted. In addition, in the X-Z plane of the optically anisotropic layer 36*b*, the tilt angle of the liquid crystal compound 40 with respect to the main surface (X-Y plane) may be uniform in the thickness direction (Z direction), and a region in which the tilt angle of the liquid crystal compound 40 varies in the thickness direction may be provided.

In all of the above-described optically anisotropic layers, the rod-like liquid crystal compound is used as the liquid crystal compound. However, the present invention is not limited to this configuration, and a disk-like liquid crystal compound can also be used.

In the disk-like liquid crystal compound, the optical axis derived from the liquid crystal compound is defined as an axis perpendicular to a disk surface, that is so-called, a fast axis.

In addition, in the optically anisotropic layer of the liquid crystal diffraction element according to the embodiment of the present invention, the rod-like liquid crystal compound and the disk-like liquid crystal compound may be used in combination.

It is noted that in the example shown in FIG. 2 or the like, the optically anisotropic layer is configured to have the radial liquid crystal alignment pattern having a radial shape in which the one direction in which the direction of the optical axis derived from the liquid crystal compound changes while continuously rotating is provided in a radial shape directed from an inner side toward an outer side. However, the optically anisotropic layer is not limited thereto.

For example, a configuration in which the arrangement axis D of the liquid crystal alignment pattern of the optically anisotropic layer is provided in one direction may be adopted.

The liquid crystal diffraction element according to the embodiment of the present invention may refract visible light and may be configured to refract infrared rays and/or ultraviolet rays.

The liquid crystal diffraction element according to the embodiment of the present invention may be used as an optical element in combination with another optical layer. For example, the liquid crystal diffraction element according to the embodiment of the present invention may be used in combination with at least one of a retardation layer, a linear polarizer, a circularly polarizing plate, a reflection polarizer, a phase retardation modulation element, a hologram, a metasurface, or the like. In this case, it is preferable that each layer has a curved surface portion in response to the curved surface portion included in the optically anisotropic layer of the liquid crystal diffraction element.

Figure 20:
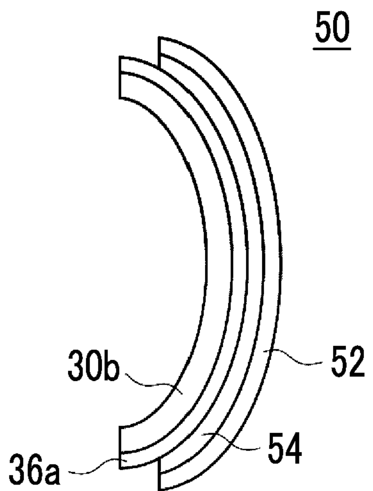
FIG. 20 is a view conceptually showing an example of an optical element having the liquid crystal diffraction element according to the present invention.

FIG. 20 is a view conceptually showing a position of an optical element having the liquid crystal diffraction element according to the embodiment of the present invention.

The optical element 50 shown in FIG. 20 includes a support 30*b*, the optically anisotropic layer 36*a*, a retardation layer 54, and a linear polarizer 52 in this order. The support 30*b* and the optically anisotropic layer 36*a* are liquid crystal diffraction elements according to the embodiment of the present invention and have the same configuration as the example shown in FIG. 3.

In a case of disposing the retardation layer 54 and the linear polarizer 52 from the optically anisotropic layer 36*a* side, the retardation layer 54 and the linear polarizer 52 act as a circularly polarizing plate with respect to the light transmitted through the optically anisotropic layer 36*a*.

A part of the circularly polarized light incident into the liquid crystal diffraction element (the optically anisotropic layer 36*a*) may transmit through the liquid crystal diffraction element (zero-order light) without being diffracted. The circularly polarized light that is not diffracted by the liquid crystal diffraction element may decrease the performance depending on the use application. On the other hand, in a case of using the liquid crystal diffraction element and the circularly polarizing plate in combination, the light (zero-order light) transmitted through the liquid crystal diffraction element without being diffracted can be reduced.

For example, the liquid crystal diffraction element and the circularly polarizing plate (in which a retardation layer and a linear polarizer are disposed in this order) will be described. In a case where dextrorotatory circularly polarized light is incident into the liquid crystal diffraction element, the incident dextrorotatory circularly polarized light is diffracted and emitted from the liquid crystal diffraction element. In addition, during the diffraction, the dextrorotatory circularly polarized light is converted into levorotatory circularly polarized light. The levorotatory circularly polarized light (that is, first-order light) that is diffracted by the liquid crystal diffraction element is converted into linearly polarized light by the retardation layer (¼ wave plate) of the circularly polarizing plate. The linearly polarized light converted by the retardation layer transmits through the linear polarizer and is emitted.

Here, in a case where a part of light is not diffracted by the liquid crystal diffraction element, a part of the dextrorotatory circularly polarized light incident into the liquid crystal diffraction element transmits through the liquid crystal diffraction element without being diffracted. In a case where the circularly polarizing plate is not provided, the dextrorotatory circularly polarized light that is not diffracted by the liquid crystal diffraction element linearly travels as it is. The dextrorotatory circularly polarized light that linearly travels is unnecessary depending on the use application, which decreases the performance.

On the other hand, as described above, a configuration in which the optical element includes the circularly polarizing plate can also be preferably used. In a case where the circularly polarizing plate is provided, dextrorotatory circularly polarized light (that is, zero-order light) that is not diffracted by the liquid crystal diffraction element is incident into and diffracted by the retardation layer of the circularly polarizing plate, is converted into linearly polarized light having a direction perpendicular to the above-described direction, and is incident into the linear polarizer and absorbed. That is, the dextrorotatory circularly polarized light that is not diffracted by the liquid crystal diffraction element is absorbed by the circularly polarizing plate. Accordingly, it is possible to transmit the desired first-order light due to the levorotatory circularly polarized light and reduce the dextrorotatory circularly polarized light that has not been diffracted. Therefore, a decrease in performance by unnecessary light (zero-order light) can be suppressed.

In addition, the optical element may have two or more layers of a retardation layer, a linear polarizer, and the like. For example, the layer configuration of the optical element may be a configuration in which a liquid crystal diffraction element, a first retardation layer, a linear polarizer, and a second retardation layer are included in this order. Alternatively, the layer configuration of the optical element may be a configuration in which a first linear polarizer, a first retardation layer, a liquid crystal diffraction element, a second retardation layer, and a second linear polarizer are included in this order. Alternatively, the layer configuration of the optical element may be a configuration in which a first linear polarizer, a first retardation layer, a liquid crystal diffraction element, a second retardation layer, a second linear polarizer, and a third retardation layer are included in this order.

<Polarizing Plate>

The linearly polarizing plate used in the present invention is not particularly limited as long as they are linearly polarizing plates having a function of allowing transmission of linearly polarized light in one polarization direction and absorbing linearly polarized light in another polarization direction. For example, a known linearly polarizing plate in the related art can be used. The linearly polarizing plate may be an absorptive-type linearly polarizing plate or a reflective-type linearly polarizing plate.

As the absorptive linearly polarizing plate, for example, an iodine-based polarizer, a dye-based polarizer using a dichroic dye, or a polyene polarizer that is an absorptive polarizer can be used. Examples of the iodine-based polarizer and the dye-based polarizer include a coating type polarizer and a stretching type polarizer, and both polarizers can be applied. In particular, a polarizer produced by absorbing iodine or a dichroic dye on polyvinyl alcohol and carrying out stretching is preferable.

In addition, examples of the method of obtaining a polarizer by carrying out stretching and dyeing on a laminated film in which a polyvinyl alcohol layer is formed on the base material include methods described in JP5143918B, JP5048120B, JP4691205B, JP4751481B, and JP4751486B, and known techniques relating to the polarizers can be used. The absorptive polarizer is particularly preferably a light-absorbing anisotropic layer obtained by aligning a dichroic coloring agent using the aligning properties of liquid crystal without carrying out stretching. The polarizer has many advantages in that, for example, the thickness can be significantly reduced to about 0.1 μm to 5 μm, cracking is not likely to occur or thermal deformation is small during folding as described in JP2019-194685A, even such a polarizing plate having a high transmittance of more than 50% has excellent durability as described in JP6483486B, and thermoformability is excellent.

As the reflective-type linearly polarizing plate, for example, such a film obtained by stretching a layer including two polymers or a wire grid polarizer described in JP2011-053705A can be used. From the viewpoint of brightness, the film obtained by stretching the layer including polymers is preferable. As the commercially available product, for example, a reflective polarizer (trade name: APF) manufactured by 3M or a wire grid polarizer (trade name: WGF) manufactured by Asahi Kasei Corporation can be suitably used. Alternatively, a reflective-type linearly polarizing plate including a combination of a cholesteric liquid crystal film and a λ/4 plate may be used.

<Retardation Plate>

The phase difference plate is a phase difference plate which converts the phase of the incident polarized light. The retardation plate is disposed such that a direction of a slow axis is adjusted depending on whether to convert incident polarized light into light similar to linearly polarized light or circularly polarized light. Specifically, it is sufficient to dispose the retardation plate such that an angle of a slow axis with respect to an absorption axis of a linearly polarizing plate disposed adjacent thereto is +45° or −45°.

The retardation plate that is used in the present invention may be a single layer type including one optically anisotropic layer or a multilayer type including two or more optically anisotropic layers having different slow axes. Examples of the multilayer type retardation plate include those described in WO13/137464A, WO2016/158300A, JP2014-209219A, JP2014-209220A, WO14/157079A, JP2019-215416A, and WO2019/160044A, WO2014-26266A, WO2022/030266A, WO2021/132624A, WO2021/033631A, WO2022/045185A, WO2022/045185A, WO19/160016A, and WO20/100813A, which are not limited thereto.

From the viewpoint of converting linearly polarized light into circularly polarized light or converting circularly polarized light into linearly polarized light, it is preferable that the retardation plate is a λ/4 plate.

The λ/4 plate is not particularly limited, and various known plates having a λ/4 function can be used. Specific examples of the λ/4 plate include those described in US2015/0277006A.

Specific examples of the aspect in which the λ/4 plate has a single layer structure include a stretched polymer film and a retardation film where an optically anisotropic layer having a λ/4 function is provided on a support. Examples of the aspect in which the λ/4 plate has a multi-layer structure include a broadband λ/4 plate in which a λ/4 plate and a λ/2 wave plate are laminated.

The thickness of the λ/4 plate is not particularly limited and is preferably 1 to 500 μm, more preferably 1 to 50 m, and still more preferably 1 to 5 μm.

It is preferable that the retardation plate that is used in the present invention has reverse wavelength dispersibility. In a case of having reverse wavelength dispersibility, a phase change in the retardation plate is ideal, and conversion between linearly polarized light and circularly polarized light is ideal.

<Circularly Polarizing Plate>

As the circularly polarizing plate, a combination of a retardation layer and a linear polarizer as described above may be used, or a reflective circular polarizer having a typical cholesteric liquid crystal layer may be used.

As is well known, the typical cholesteric liquid crystal layer has a helical structure in which the liquid crystal compound is helically turned and laminated. In the helical structure, a configuration in which the liquid crystal compound is helically rotated once (rotated by 360°) and laminated is set as single helical period (the helical period), and the helically turned liquid crystal compounds are laminated a plurality of periods.

The cholesteric liquid crystal layer reflects levorotatory circularly polarized light or dextrorotatory circularly polarized light in a specific wavelength range and allows the transmission of the other light depending on the length of the helical period and the helical turning direction (sense) of the liquid crystal compound. Accordingly, it can be used as a reflective circular polarizer that selectively reflects one circularly polarized light and transmits the other circularly polarized light.

[Image Display Apparatus and Head Mounted Display]

The image display apparatus according to the embodiment of the present invention includes the above-described liquid crystal diffraction element according to the embodiment of the present invention and a display panel.

In addition, in the image display apparatus, it is preferable that the display panel has at least a curved surface portion.

Such an image display apparatus including the liquid crystal diffraction element according to the embodiment of the present invention can be suitably used as an image display apparatus for a head mounted display.

Figure 21:
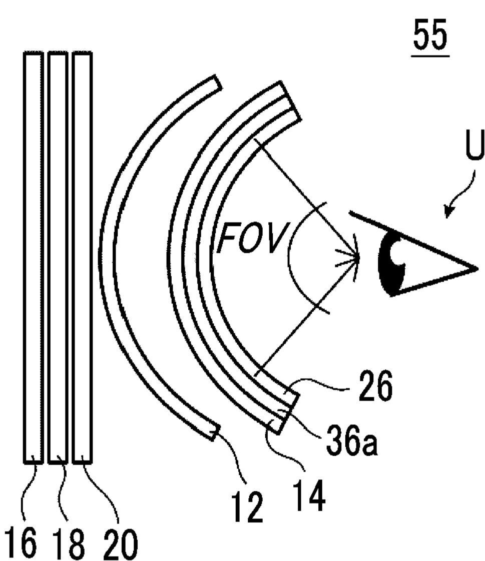
FIG. 21 is a view conceptually showing an example of an image display apparatus having the liquid crystal diffraction element according to the present invention.

FIG. 21 conceptually shows an example of an image display apparatus having the liquid crystal diffraction element according to the embodiment of the present invention.

An image display apparatus 55 shown in FIG. 21 includes a display panel 16, a linear polarizer 18, a retardation layer 20, a half mirror 12, a reflective circular polarizer 14, the optically anisotropic layer **36*a* (liquid crystal diffraction element), and a circularly polarizing plate 26 in this order. Such an image display apparatus 55** is suitably used in a head mounted display (HMID) that displays virtual reality (VR), augmented reality (AR), or the like.

The display panel 16 is a known image display panel (display). Examples of the image display panel include a liquid crystal display panel, an organic electroluminescent display device, a light emitting diode (LED) display device, a micro LED display device, a scan type display device in which a laser light source and a mirror of micro electro mechanical systems (MEMS) are combined. In the following description, the organic electroluminescent display device will also be referred to as "OLED". OLED is an abbreviation for "Organic Light Emitting Diode".

The linear polarizer 18 converts the light emitted by the display panel 16 into linearly polarized light. The linear polarizer 18 is a known linearly polarizing plate. In a case where the display panel 16 has a linear polarizer on the emission side as in the liquid crystal display panel, the linear polarizer included in the liquid crystal display panel is regarded as the linear polarizer 18.

The retardation layer 20 converts the linearly polarized light converted by the linear polarizer 18 into circularly polarized light. The retardation layer 20 is a known retardation layer. The retardation layer converts linearly polarized light into circularly polarized light or converts circularly polarized light into linearly polarized light and thus is basically a ¼ wave plate.

The half mirror 12 is an semi-transmissive and semi-reflective half mirror that reflects a part of incident light and allows transmission of the remaining light. In addition, as shown in FIG. 21, the half mirror 12 has a curved surface portion that is convexly curved toward the display panel 16.

The reflective circular polarizer 14 reflects, among the incident light, the circularly polarized light that has been converted in the retardation layer 20 and transmits the other circularly polarized light. That is, the circularly polarized light transmitted through the half mirror 12 without being reflected is reflected. In addition, as shown in FIG. 21, the reflective circular polarizer 14 has a curved surface portion that is convexly curved toward the display panel 16. It is noted that the reflective circular polarizer 14 may have a flat plate shape that does not have a curved surface portion.

The optically anisotropic layer **36*a* has the same configuration as that of the transmissive-type optically anisotropic layer 36*a* described above and diffracts the circularly polarized light in a polarized state, which is transmitted through the reflective circular polarizer 14**, to be diffused.

The circularly polarizing plate 26 is a circularly polarizing plate that transmits the circularly polarized light diffracted by the optically anisotropic layer **36*a* and shields circularly polarized light in a polarized state opposite to that of the circularly polarized light. The combination of the optically anisotropic layer 36*a* and the circularly polarizing plate 26 is the above-described optical element 50 shown in FIG. 20. Accordingly, the circularly polarizing plate 26 may consist of a retardation layer and a linear polarizer or may have a typical cholesteric liquid crystal layer. As described above, in a case of having the circularly polarizing plate 26, it is possible to shield unnecessary light (zero-order light) that has not been diffracted in the optically anisotropic layer 36*a*. It is noted that the image display apparatus 55 may have a configuration in which the circularly polarizing plate 26** is not provided.

The action of such an image display apparatus 55 will be described.

The display panel 16 emits light that is to be an image. In this case, light is emitted from each of points (each of pixels) of the display panel toward various directions. Among the light emitted by the display panel 16, a linearly polarized light component is transmitted through the linear polarizer 18. The linearly polarized light transmitted through the linear polarizer 18 is incident into the retardation layer 20 and converted into circularly polarized light. As an example, a case of being converted into dextrorotatory circularly polarized light will be described.

The light converted into circularly polarized light in the retardation layer 20 is incident into the half mirror 12, a part thereof is transmitted through the half mirror 12, and the rest thereof is reflected by the half mirror 12. The dextrorotatory circularly polarized light transmitted through the half mirror 12 is incident into the reflective circular polarizer 14. Since the reflective circular polarizer 14 reflects the circularly polarized light in a state of being converted in the retardation layer 20, that is, since it reflects the dextrorotatory circularly polarized light, the incident dextrorotatory circularly polarized light is reflected to be incident into the half mirror 12 again. In this case, since the reflective circular polarizer 14 has a shape that is convexly curved toward the half mirror 12, the reflected dextrorotatory circularly polarized light is reflected to be diffused.

A part of the dextrorotatory circularly polarized light reflected by the reflective circular polarizer 14 and then incident into the half mirror 12 is reflected by the half mirror 12, and the rest thereof is transmitted through the half mirror 12. Here, the circularly polarized light reflected by the half mirror 12 is converted into circularly polarized light in the opposite turning direction, which is levorotatory circularly polarized light in this example. In this case, since the half mirror 12 has a shape that is concavely curved toward the reflective circular polarizer 14, the reflected levorotatory circularly polarized light is reflected to be collected.

The levorotatory circularly polarized light reflected from the half mirror 12 is again incident into the reflective circular polarizer 14. Since the circularly polarized light (dextrorotatory circularly polarized light) reflected by the half mirror 12 is converted into circularly polarized light (levorotatory circularly polarized light) in the opposite turning direction, the circularly polarized light is transmitted through the reflective circular polarizer 14 without being reflected.

In this way, in a case where the light is reciprocated between the half mirror 12 and the reflective circular polarizer 14 to lengthen the optical path length, a projected image displayed by the display panel 16 is observed by the user U such that the projected image is located farther from the position of the display panel 16. As a result, the image display apparatus 55 can display the projected image displayed by the display panel 16 as a projected image of virtual reality (VR) or augmented reality (AR).

The levorotatory circularly polarized light transmitted through the reflective circular polarizer 14 is incident into the optically anisotropic layer **36*a*. The optically anisotropic layer 36*a*** diffracts the incident levorotatory circularly polarized light in a collecting direction.

A viewing angle (field of view: FOV), which is a region for displaying an image, is required to be wide in a head mounted display that displays virtual reality (VR), augmented reality (AR), or the like.

In a case where the image display apparatus 55 is configured to have the liquid crystal diffraction element according to the embodiment of the present invention, the light from the image display apparatus can be further collected, and thus, the viewing angle (field of view: FOV), which is a region for displaying an image, can be further widened. In this case, as described above, since the optically anisotropic layer **36*a*** can reduce unnecessary light (zero-order light) that has not been diffracted, it is possible to suppress the generation of a ghost image even in a case where the viewing angle (FOV) is widened.

In addition, In a case where the image display apparatus 55 is configured to have the liquid crystal diffraction element according to the embodiment of the present invention, it is also possible to improve the chromatic aberration generated in an optical element including the half mirror 12 and the reflective circular polarizer 14. It is possible to suppress the occurrence of the chromatic aberration in a case of appropriately carrying out diffusion or collection with the liquid crystal diffraction element in response to the chromatic aberration generated in an optical element including the half mirror 12 and the reflective circular polarizer 14. In a case where light is collected by the liquid crystal diffraction element to suppress chromatic aberration, the viewing angle (FOV) can also be widened.

Figure 22:
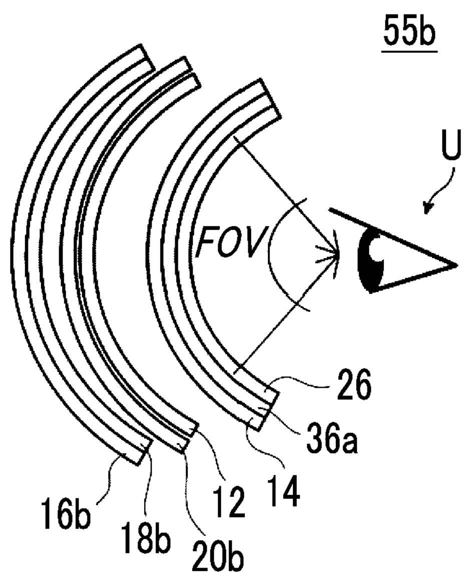
FIG. 22 is a view conceptually showing another example of the image display apparatus having the liquid crystal diffraction element according to the present invention.

Here, in the example shown in FIG. 21, the display panel 16 and the linear polarizer 18 have a flat plate shape; however, the shape thereof is not limited thereto. As in the image display apparatus 55*b* shown in FIG. 22, the display panel 16*b* may be configured to have a curved surface portion that is concave toward the half mirror 12 side, and the linear polarizer 18 may be configured to have a curved surface portion that is convex toward the display panel 16*b* side.

In a case of adopting a configuration in which the display panel 16*b* has a curved surface portion that is concave toward the half mirror 12 side, it is possible to improve the aberration (spherical aberration, distortion, or the like) generated in an optical element including the half mirror 12 and the reflective circular polarizer 14, the brightness distribution of the displayed image, and the like.

In addition, in the example shown in FIG. 21, a configuration in which the half mirror 12 and the reflective circular polarizer 14 are disposed in this order from the display panel 16 side is adopted. However, the configuration is not limited thereto, and a configuration in which the reflective circular polarizer 14 and the half mirror 12 are disposed in this order from the display panel 16 side may be adopted.

In addition, in the example shown in FIG. 21, a configuration in which the reflective circular polarizer 14 is provided and the retardation layer 20 is provided between the linear polarizer 18 and the half mirror 12 is adopted. However, the configuration thereof is limited thereto, and for example, a configuration in which a reflective linear polarizer is provided instead of the reflective circular polarizer 14. In this case, the retardation layer is preferably disposed between the half mirror 12 and the reflective linear polarizer.

Hereinabove, the liquid crystal diffraction element, the image display apparatus, and the head mounted display according to the embodiments of the present invention have been described in detail. However, the present invention is not limited to the above-described examples, and various improvements and modifications can be made within a range not departing from the scope of the present invention.

EXAMPLES

Hereinafter, the characteristics of the present invention will be described more specifically with reference to Examples. Materials, chemicals, used amounts, material amounts, ratios, treatment details, treatment procedures, and the like shown in the following examples can be appropriately changed within a range not departing from the scope of the present invention. Accordingly, the scope of the present invention should not be interpreted restrictively by the following specific examples.

Comparative Example 1

<Production of Liquid Crystal Diffraction Element>

(Support)

A flat plate-shaped glass substrate was prepared as the support.

(Formation of Alignment Film)

The following coating liquid for forming an alignment film was applied onto the support by spin coating. The support on which the coating film of the coating liquid for forming an alignment film had been formed was dried on a hot plate of 60° C. for 60 seconds to form an alignment film.

Coating liquid for forming alignment film

| | |
|---|---|
| Material A for photo alignment | 1.00 part by mass |
| Water | 16.00 parts by mass |
| Butoxyethanol | 42.00 parts by mass |
| Propylene glycol monomethyl ether | 42.00 parts by mass |

Material A for photo alignment

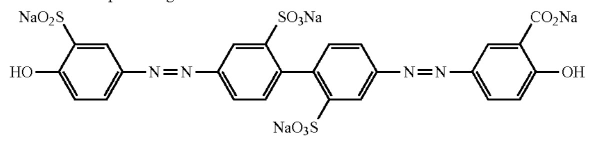

(Exposure of Alignment Film)

The radial alignment film was exposed using the exposure device shown in FIG. 9 to form an alignment film P-1 having an alignment pattern.

In the exposure device, a laser that emits laser light having a wavelength (325 nm) was used as the laser. The exposure amount of the interference light was 1,000 mJ/cm$^2$. It is noted that by using the exposure device shown in FIG. 9, the single period of the alignment pattern was set to be gradually decreased from the center toward the outer direction.

(Formation of Optically Anisotropic Layer)

As the liquid crystal composition forming the optically anisotropic layer, the following composition A-1 was prepared.

Composition A-1

| | |
|---|---|
| Liquid crystal compound L-1 | 100.00 parts by mass |
| Polymerization initiator (IRGACURE-OXE 01, manufactured by BASF SE) | 1.00 part by mass |
| Leveling agent T-1 | 0.08 parts by mass |
| Methyl ethyl ketone | 1050.00 parts by mass |

Liquid crystal compound L-1

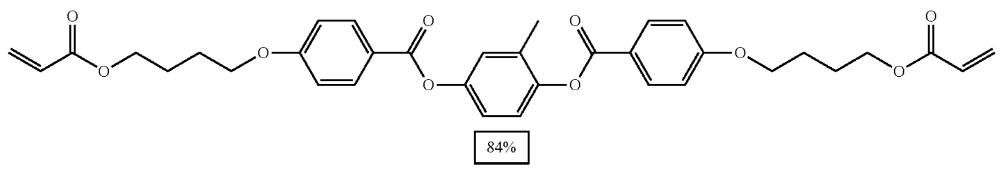 [SMILES: C=CC(=O)OCCCCOc1ccc(C(=O)Oc2ccc(OC(=O)c3ccc(OCCCCOC(=O)C=C)cc3)c(C)c2)cc1]

84%

-continued

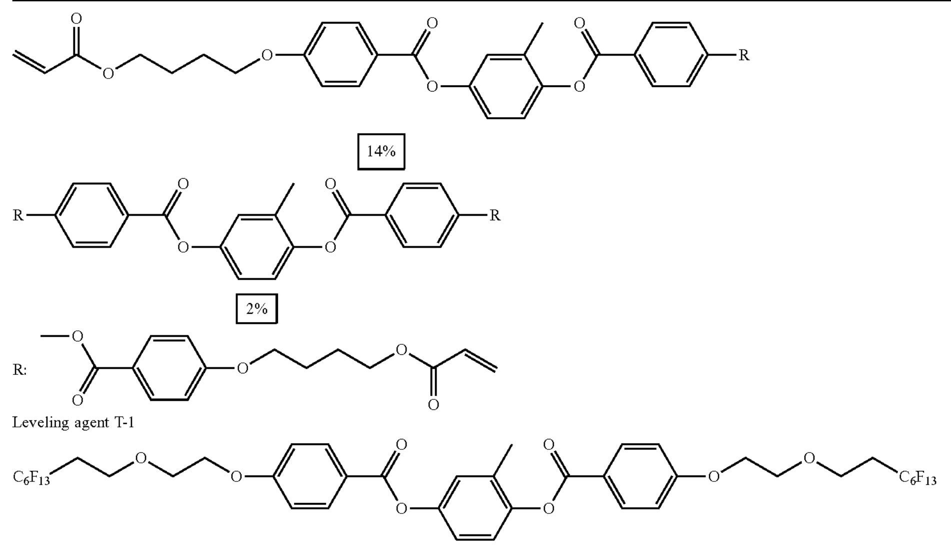

14%

2%

Leveling agent T-1

The optically anisotropic layer was formed by subjecting the composition A-1 to multilayer coating on the alignment film P-1. The multilayer coating refers to repeating a procedure in which, first, the composition A-1 is applied for a first layer on an alignment film and heated, followed by curing with ultraviolet rays to produce a liquid crystal immobilized layer, and then, for a second and subsequent layers, this liquid crystal immobilized layer is subjected to multiple coating by the application of the composition A-1, heating and curing with ultraviolet rays are carried out in the same manner. Due to the formation by the multilayer coating, even in a case where the total thickness of the optically anisotropic layer is large, the alignment direction of the alignment film is reflected from a lower surface of the optically anisotropic layer to an upper surface thereof.

First, the following composition A-1 was applied for the first liquid crystal layer onto the alignment film P-1 to form a coating film, the coating film was heated to 80° C. using a hot plate, the coating film was irradiated with ultraviolet rays having a wavelength of 365 nm at an irradiation dose of 300 $mJ/cm^2$ using a high-pressure mercury lamp in a nitrogen atmosphere. As a result, the alignment of the liquid crystal compound was immobilized.

For the second and subsequent liquid crystal layers, this liquid crystal immobilized layer was subjected to multiple coating and heated under the same conditions as described above, followed by curing with ultraviolet rays to produce a liquid crystal immobilized layer. In this way, the multiple coating was repeated until the total thickness reached a desired film thickness to obtain an optically anisotropic layer, whereby a liquid crystal diffraction element was produced.

A complex refractive index Δn of the cured layer of a liquid crystal composition A-1 was obtained by applying the liquid crystal composition A-1 a support with an alignment film for retardation measurement that was prepared separately, aligning the director of the liquid crystal compound to be parallel to the base material, irradiating the liquid crystal compound with ultraviolet irradiation for immobilization to obtain a liquid crystal immobilized layer (cured layer), and measuring the retardation value and the film thickness of the liquid crystal immobilized layer. An can be calculated by dividing the retardation value by the film thickness. The retardation value was measured at a desired wavelength using Axoscan (manufactured by Axometrix Inc.), and the film thickness was measured using a scanning electron microscope (SEM).

Finally, in the optically anisotropic layer, it was confirmed with a polarization microscope that $\Delta n_{550}$ of liquid crystal× thickness (Re(550)) is 275 nm and such a periodically aligned surface which is radial as shown in FIG. 2 is obtained. In the liquid crystal alignment pattern of the optically anisotropic layer, the single period over which the optical axis of the liquid crystal compound rotated by 180° was such that the single period at a position at a distance of about 3 mm from the center was 10 m and the single period at a position at a distance of 15 mm from the center was 2 μm, which provided a liquid crystal alignment pattern in which the period decreased toward the outer direction. In addition, the twisted angle of the optically anisotropic layer in the thickness direction was 0°. Hereinafter, unless specified otherwise, "$\Delta n_{550}$×d" and the like were measured as described above.

Example 1

<Production of Liquid Crystal Diffraction Element>

(Support)

As a support, a resin base material "TECHNOLLOY C001" (polycarbonate/poly methyl methacrylate (PMMA) laminated base material, thickness: 75 μm) manufactured by SUMIKA ACRYL Co., Ltd. was prepared.

(Formation of Alignment Film)

A corona treatment was carried out on the support, and then the following coating liquid for forming an alignment film was applied by spin coating. The support on which the coating film of the coating liquid for forming an alignment film had been formed was dried on a hot plate of 60° C. for 60 seconds to form an alignment film.

Coating liquid for forming alignment film

| | |
|---|---|
| Material A for photo alignment | 1.00 part by mass |
| Water | 16.00 parts by mass |

-continued

| | |
|---|---|
| Butoxyethanol | 42.00 parts by mass |
| Propylene glycol monomethyl ether | 42.00 parts by mass |

Material A for photo alignment

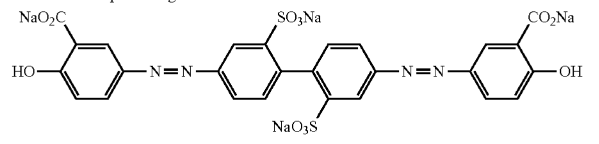

With reference to JP2012-116094A, the support with the photo-alignment film described above was subjected to vacuum molding to be along the convex surface of a plano-convex lens (made of optical glass, curvature radius of convex surface: 100 mm) having a diameter of 40 mm and a focal length of 200 mm. Then, the support with the photo-alignment film was peeled from the lens to obtain a photo-alignment film having a curved surface.

(Exposure of Alignment Film)

The alignment film was exposed in the same manner to form an alignment film P-2 having a radial alignment pattern, except that the lens was changed to an exposure lens having a different focal length in Comparative Example 1 and the distance between the lens and the alignment film was changed. In this case, the center position of the radial alignment pattern was set to be on the same optical axis as the center of the plano-convex lens used for forming the curved surface. In addition, the formed alignment pattern was set to be such an alignment pattern that the single period at a position at a distance of about 3 mm from the center of the optical axis was 14 m and the single period at a position at a distance of 15 mm from the center of the optical axis was 2.7 m, which provided a period that decreased toward the outer direction.

In the exposure device, a laser that emits laser light having a wavelength (325 nm) was used as the laser. The exposure amount of the interference light was 1,000 mJ/cm$^2$. It is noted that by using the exposure device shown in FIG. 9, the single period of the alignment pattern was set to be gradually decreased from the center toward the outer direction.

(Formation of Optically Anisotropic Layer)

The above-described photo-alignment film having a curved surface that had been subjected to the alignment treatment was subjected to spray coating with the composition A-1 of Comparative Example 1 by using a coater "rCoater" manufactured by ASAHI SUNAC CORPORATION.

First, the following composition A-1 was applied for the first liquid crystal layer onto the alignment film P-2 to form a coating film, the coating film was heated to 80° C. using a hot plate, the coating film was irradiated with an ultraviolet ray having a wavelength of 365 nm at an irradiation dose of 300 mJ/cm$^2$ using a high-pressure mercury lamp in a nitrogen atmosphere. As a result, the alignment of the liquid crystal compound was immobilized.

For the second and subsequent liquid crystal layers, this liquid crystal immobilized layer was subjected to multiple coating and heated under the same conditions as described above, followed by curing with ultraviolet rays to produce a liquid crystal immobilized layer. In this way, the multiple coating was repeated until the total thickness reached a desired film thickness to obtain an optically anisotropic layer, whereby a liquid crystal diffraction element was produced.

Finally, in the optically anisotropic layer, it was confirmed with a polarization microscope that $\Delta n_{550}$ of liquid crystal× thickness (Re(550)) is 275 nm and such a periodically aligned surface which is radial as shown in FIG. 2 is obtained. It is noted that in the liquid crystal alignment pattern of the optically anisotropic layer, the single period over which the optical axis of the liquid crystal compound rotated by 180° provided a liquid crystal alignment pattern in which the period decreased from the center toward the outer direction. In addition, the twisted angle of the optically anisotropic layer in the thickness direction was 0°.

Example 2

<Production of Liquid Crystal Diffraction Element>

(Formation of Alignment Film)

An alignment film was formed on a support in the same manner as in Example 1, followed by vacuum molding to form a convex curved surface, and then exposure was carried out to form an alignment film P-2 having a radial alignment pattern.

(Formation of Optically Anisotropic Layer)

As a liquid crystal composition forming a first region of the optically anisotropic layer, the following composition B-1 was prepared.

Composition B-1

| | |
|---|---|
| Liquid crystal compound L-1 | 100.00 parts by mass |
| Chiral agent C-1 | 0.32 parts by mass |
| Polymerization initiator (IRGACURE-OXE 01, manufactured by BASF SE) | 1.00 part by mass |
| Leveling agent T-1 | 0.08 parts by mass |
| Methyl ethyl ketone | 1050.00 parts by mass |

Chiral agent C-1

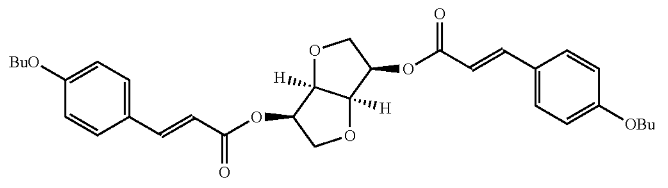

-continued

Leveling agent T-1

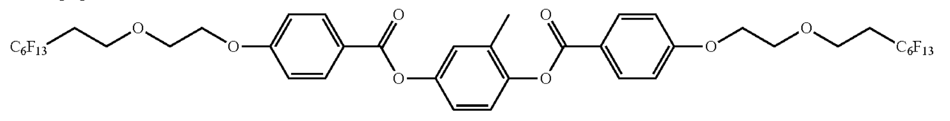

A first region of the optically anisotropic layer was formed in the same manner as in Example 1, except that the film thickness was adjusted using the composition B-1.

Finally, in the first region of the optically anisotropic layer, it was confirmed with a polarization microscope that $\Delta n_{550}$ of liquid crystal×thickness (Re(550)) is 275 nm and such a periodically aligned surface which is radial as shown in FIG. 2 is obtained. It is noted that in the liquid crystal alignment pattern of this first region, the single period over which the optical axis of the liquid crystal compound rotated by 180° provided a liquid crystal alignment pattern in which the period decreased from the center toward the outer direction. In addition, the twisted angle of the first region in the thickness direction was 70° in a counterclockwise direction (−70°).

As a liquid crystal composition forming a second region of the optically anisotropic layer, the following composition B-2 was prepared.

Composition B-2

| | |
|---|---|
| Liquid crystal compound L-1 | 100.00 parts by mass |
| Chiral agent C-2 | 0.18 parts by mass |
| Polymerization initiator (IRGACURE-OXE 01, manufactured by BASF SE) | 1.00 part by mass |
| Leveling agent T-1 | 0.08 parts by mass |
| Methyl ethyl ketone | 1050.00 parts by mass |

Chiral agent C-2

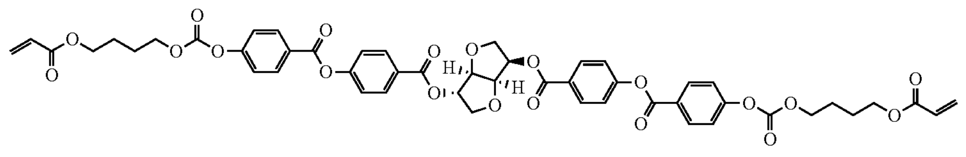 [SMILES: C=CC(=O)OCCCCOC(=O)Oc1ccc(C(=O)Oc2ccc(C(=O)O[C@H]3CO[C@H]4[C@@H]3OC[C@H]4OC(=O)c3ccc(OC(=O)c4ccc(OC(=O)OCCCCOC(=O)C=C)cc4)cc3)cc2)cc1]

A second region of the optically anisotropic layer was formed in the same manner as in the first region of the optically anisotropic layer, except that the composition B-2 was used and the film thickness was adjusted.

Finally, in the second region of the optically anisotropic layer, it was confirmed with a polarization microscope that $\Delta n_{550}$ of liquid crystal×thickness (Re(550)) is 275 nm and such a periodically aligned surface which is radial as shown in FIG. 2 is obtained. It is noted that the liquid crystal alignment pattern of this second region was such a liquid crystal alignment pattern that the period decreased toward the outer direction. In addition, the twisted angle of the second region in the thickness direction was 70° in a clockwise direction.

Figure 23:
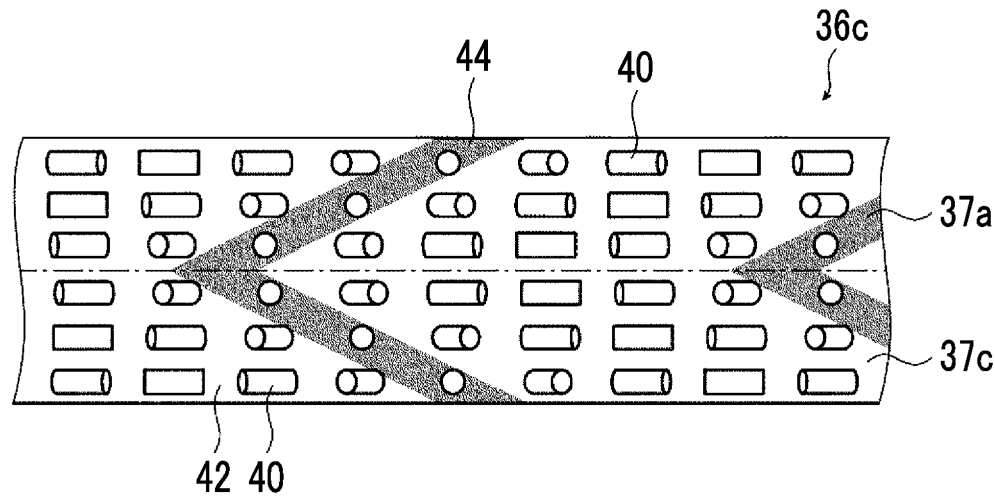
FIG. 23 is a view conceptually showing another example of the optically anisotropic layer.

In a case where a cross section of the produced optically anisotropic layer was observed with an SEM, bright portions and dark portions had a shape shown in FIG. 23. That is, the dark portion had one inflection point.

Example 3

<Production of Liquid Crystal Diffraction Element>

(Formation of Alignment Film)

An alignment film was formed on a support in the same manner as in Example 1, followed by vacuum molding to form a convex curved surface, and then exposure was carried out to form an alignment film P-2 having a radial alignment pattern.

(Formation of Optically Anisotropic Layer)

As a liquid crystal composition forming the first region of the optically anisotropic layer, the following composition D-1.

Composition D-1

| | |
|---|---|
| Liquid crystal compound L-1 | 100.00 parts by mass |
| Chiral agent C-3 | 0.23 parts by mass |
| Chiral agent C-4 | 0.82 parts by mass |
| Polymerization initiator (IRGACURE-OXE 01, manufactured by BASF SE) | 1.00 part by mass |
| Leveling agent T-1 | 0.08 parts by mass |
| Methyl ethyl ketone | 1050.00 parts by mass |

Chiral agent C-3

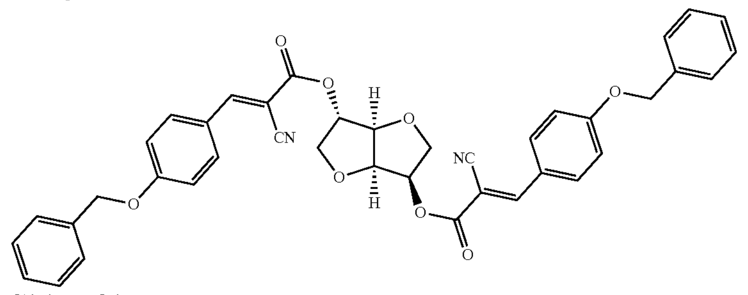

Chiral agent C-4

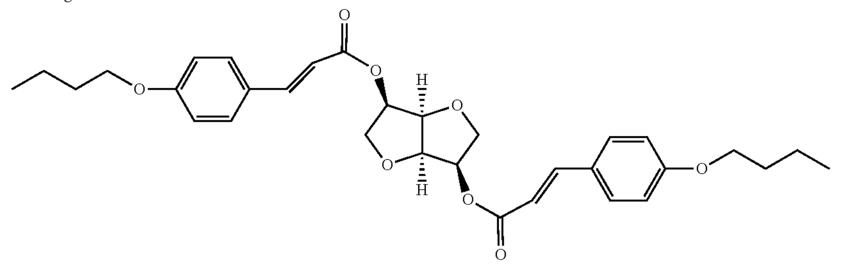

As a liquid crystal composition for forming the second region of the optically anisotropic layer, a composition D-2 was prepared by changing, in the composition D-1, the amount of the chiral agent C-3 to 0.54 parts by mass and changing the amount of the chiral agent C-4 to 0.62 parts by mass.

As a liquid crystal composition for forming the third region of the optically anisotropic layer, a composition D-3 was prepared by changing, in the composition D-1, the amount of the chiral agent C-3 to 0.48 parts by mass and changing the amount of the chiral agent C-4 not to be added.

The first to third regions of the optically anisotropic layer were formed in the same manner as in Example 1, except that the film thicknesses were adjusted using the compositions D-1, D-2, and D-3, respectively.

Finally, in the first region of the optically anisotropic layer, it was confirmed with a polarization microscope that $\Delta n_{550}$ of liquid crystal×thickness (Re(550)) is 160 nm and such a periodically aligned surface which is radial as shown in FIG. 2 is obtained. It is noted that in the liquid crystal alignment pattern of this first region, the single period over which the optical axis of the liquid crystal compound rotated by 180° provided a liquid crystal alignment pattern in which the period decreased from the center toward the outer direction. In addition, the twisted angle of the first region in the thickness direction was 80° in a counterclockwise direction (−80°).

Finally, in the second region of the optically anisotropic layer, it was confirmed with a polarization microscope that $\Delta n_{550}$ of liquid crystal×thickness (Re(550)) is 335 nm and such a periodically aligned surface which is radial as shown in FIG. 2 is obtained. It is noted that in the liquid crystal alignment pattern of this second region, the single period over which the optical axis of the liquid crystal compound rotated by 180° provided a liquid crystal alignment pattern in which the period decreased from the center toward the outer direction. In addition, the twisted angle in the second thickness direction was 0°.

Finally, in the third region of the optically anisotropic layer, it was confirmed with a polarization microscope that $\Delta n_{550}$ of liquid crystal×thickness (Re(550)) is 160 nm and such a periodically aligned surface which is radial as shown in FIG. 2 is obtained. It is noted that in the liquid crystal alignment pattern of this third region, the single period over which the optical axis of the liquid crystal compound rotated by 180° provided a liquid crystal alignment pattern in which the period decreased from the center toward the outer direction. In addition, the twisted angle of the third region in the thickness direction was 800 (twisted angle: 80°) in a clockwise direction.

The optically anisotropic layer was formed in the manner described above.

In a case where a cross section of the produced optically anisotropic layer was observed with an SEM, bright portions and dark portions had a shape shown in FIG. 13. That is, the dark portion had two inflection points.

Example 4

<Production of Liquid Crystal Diffraction Element>

(Formation of Alignment Film)

An alignment film was formed in the same manner as in Example 1, followed by vacuum molding to form a convex curved surface, and then exposure was carried out to form an alignment film P-2 having a radial alignment pattern.

(Formation of Optically Anisotropic Layer)

As liquid crystal compositions for forming the first to third optically anisotropic layers, the compositions D-1, D-2, and D-3 were prepared in the same manner as in Example 3.

In the formation of the first region of the optically anisotropic layer, first, the above-described composition D-1 was applied for the first layer onto the alignment film P-2, the coating film was heated to 80° C. on a hot plate, and then the coating film was irradiated with an ultraviolet ray having a wavelength of 365 nm using a LED-ultraviolet ray (UV) exposure device. At this time, the coating film was irradiated while changing the irradiation dose of the ultraviolet rays in a plane. Specifically, the irradiation dose in a plane was changed such that the irradiation dose increased from the center portion toward an end part, whereby the coating film was irradiated. Then, the coating film heated on a hot plate at 80° C. was irradiated with an ultraviolet ray having a wavelength of 365 nm at an irradiation dose of 300 $mJ/cm^2$ using a high-pressure mercury lamp in a nitrogen atmosphere. As a result, the alignment of the liquid crystal compound was immobilized.

For the second and subsequent liquid crystal layers, this liquid crystal immobilized layer was subjected to multiple coating to produce a liquid crystal immobilized layer under the same conditions as described above. In this way, the multiple coating was repeated until the total thickness reached a desired film thickness to form the first region of the optically anisotropic layer.

Finally, in the first region of the optically anisotropic layer, it was confirmed with a polarization microscope that $\Delta n_{550}$ of liquid crystal×thickness (Re(550)) is 160 nm and such a periodically aligned surface which is radial as shown in FIG. 2 is obtained. It is noted that in the liquid crystal alignment pattern of the optically anisotropic layer, the single period over which the optical axis of the liquid crystal compound rotated by 180° provided a liquid crystal alignment pattern in which the period decreased from the center toward the outer direction. In addition, regarding the twisted angle of the optically anisotropic layer in the thickness direction, the twisted angle at a position at a distance of about 3 mm from the center was 800 in a counterclockwise direction (−80°), and the twisted angle increased from the center toward the outer direction.

The first region in which the twisted angle changed in a plane was formed in the manner described above.

Next, the composition D-2 was subjected to multilayer coating on the first region of the optically anisotropic layer to form a second region of the optically anisotropic layer.

The first layer of the second region of the optically anisotropic layer was formed in the same manner, except that the composition D-2 was applied onto the first region of the optically anisotropic layer, and in the production of the first region of the optically anisotropic layer in Example 4, the irradiation dose of ultraviolet rays with which the coating film was irradiated from the center portion toward the end part was changed such that the total thickness was a desired film thickness.

For the second and subsequent liquid crystal layers, this liquid crystal immobilized layer was subjected to multiple coating to produce a liquid crystal immobilized layer under the same conditions as described above. In this way, the multiple coating was repeated until the total thickness reached a desired film thickness to form the second region of the optically anisotropic layer.

Finally, in the second region of this optically anisotropic layer, it was confirmed with a polarization microscope that $\Delta n_{550}$ of liquid crystal×thickness (Re(550)) is 335 nm and such a periodically aligned surface which is radial as shown in FIG. 2 is obtained. It is noted that in the liquid crystal alignment pattern of this second region, the single period over which the optical axis of the liquid crystal compound rotated by 180° provided a liquid crystal alignment pattern in which the period decreased from the center toward the outer direction. In addition, regarding the twisted angle of the second region in the thickness direction, the twisted angle at a position at a distance of about 3 mm from the center was 0°, and the twisted angle increased from the center toward the outer direction.

The second region in which the twisted angle changed in a plane was formed in the manner described above.

Next, the composition D-3 was subjected to multilayer coating on the second region of the optically anisotropic layer to form a third region of the optically anisotropic layer.

The first layer of the third region of the optically anisotropic layer was formed in the same manner, except that the composition D-3 was applied onto the second region of the optically anisotropic layer, and in the production of the first region of the optically anisotropic layer in Example 4, the irradiation dose of ultraviolet rays with which the coating film was irradiated from the center portion toward the end part was changed such that the total thickness was a desired film thickness.

For the second and subsequent liquid crystal layers, this liquid crystal immobilized layer was subjected to multiple coating to produce a liquid crystal immobilized layer under the same conditions as described above. In this way, the multiple coating was repeated until the total thickness reached a desired film thickness to form the third region of the optically anisotropic layer.

Finally, in the third region of this optically anisotropic layer, it was confirmed with a polarization microscope that $\Delta n_{550}$ of liquid crystal×thickness (Re(550)) is 160 nm and such a periodically aligned surface which is radial as shown in FIG. 2 is obtained. It is noted that in the liquid crystal alignment pattern of this third region, the single period over which the optical axis of the liquid crystal compound rotated by 180° provided a liquid crystal alignment pattern in which the period decreased from the center toward the outer direction. In addition, regarding the twisted angle of the third region in the thickness direction, the twisted angle at a position at a distance of about 3 mm from the center was 800 (twisted angle: 80°) in a clockwise direction, and the twisted angle decreased from the center toward the outer direction.

The first to third regions of the optically anisotropic layer were formed in the manner described above.

In a case where a cross section of the produced optically anisotropic layer was observed with an SEM, bright portions and dark portions had a shape shown in FIG. 14. That is, the dark portion had two inflection points and the average tilt angle was substantially 0° at the center and increased from the center toward the outer direction.

Example 5

<Production of Liquid Crystal Diffraction Element>

(Support)

As a support, a resin base material "TECHNOLLOY C001" (polycarbonate/poly methyl methacrylate (PMMA) laminated base material, thickness: 75 μm) manufactured by SUMIKA ACRYL Co., Ltd. was prepared.

(Formation of Alignment Film)

A corona treatment was carried out on the support, and the following coating liquid for forming an alignment film was applied by spin coating. The support on which the coating film of the coating liquid for forming an alignment film had been formed was dried on a hot plate of 60° C. for 60 seconds to form an alignment film.

Coating liquid for forming alignment film

| | |
|---|---|
| Material A for photo alignment | 1.00 part by mass |
| Water | 16.00 parts by mass |
| Butoxyethanol | 42.00 parts by mass |
| Propylene glycol monomethyl ether | 42.00 parts by mass |

(Exposure of Alignment Film)

The alignment film was exposed in the same manner to form an alignment film P-3 having a radial alignment pattern, except that the lens was changed to an exposure lens having a different focal length in Comparative Example 1 and the distance between the lens and the alignment film was changed.

In the exposure device, a laser that emits laser light having a wavelength (325 nm) was used as the laser. The exposure amount of the interference light was 1,000 mJ/cm$^2$. It is noted that by using the exposure device shown in FIG. 9, the single period of the alignment pattern was set to be gradually decreased from the center toward the outer direction. The formed alignment pattern was set to be such an alignment pattern that the single period at a position at a distance of about 3 mm from the center of the optical axis was 14 m and the single period at a position at a distance of 15 mm from the center of the optical axis was 2.7 m, which provided a period that decreased toward the outer direction.

(Formation of Optically Anisotropic Layer)

In the same manner as in Comparative Example 1, the composition A-1 was applied onto the alignment film P-3 to immobilize the alignment of the liquid crystal compound to form an optically anisotropic layer, thereby producing a liquid crystal diffraction element.

With reference to JP2012-116094A, the support with the optically anisotropic layer described above was subjected to vacuum molding to be along the convex surface of a plano-convex lens (made of optical glass, curvature radius of convex surface: 100 mm) having a diameter of 40 mm and a focal length of 200 mm. Then, the support with the optically anisotropic layer was peeled to obtain an optically anisotropic layer having a curved surface.

Finally, in the optically anisotropic layer, it was confirmed with a polarization microscope that $\Delta n_{550}$ of liquid crystal at center of curved surface×thickness (Re(550)) is 275 nm and such a periodically aligned surface which is radial as shown in FIG. 2 is obtained. It is noted that in the liquid crystal alignment pattern of the optically anisotropic layer, the single period over which the optical axis of the liquid crystal compound rotated by 180° provided a liquid crystal alignment pattern in which the period decreased from the center toward the outer direction. In addition, the twisted angle of the optically anisotropic layer at the center of the curved surface in the thickness direction was 0°.

Example 6

<Production of Liquid Crystal Diffraction Element>

(Formation of Alignment Film)

The alignment film P-3 was formed on the support in the same manner as in Example 5.

(Formation of Optically Anisotropic Layer)

The composition B-1 and the composition B-2 were prepared in the same manner as in Example 2.

The first region of the optically anisotropic layer and the second region of the optically anisotropic layer were formed in the same manner as in the optically anisotropic layer in Example 5, except that the film thicknesses were adjusted using the compositions B-1 and B-2, respectively.

With reference to JP2012-116094A, the support with the optically anisotropic layer described above was subjected to vacuum molding to be along the convex surface of a plano-convex lens (made of optical glass, curvature radius of convex surface: 100 mm) having a diameter of 40 mm and a focal length of 200 mm. Then, the support with the optically anisotropic layer was peeled from the lens to obtain an optically anisotropic layer having a curved surface.

Finally, in the first region of the optically anisotropic layer, it was confirmed with a polarization microscope that $\Delta n_{550}$ of liquid crystal at center of curved surface×thickness (Re(550)) is 275 nm and such a periodically aligned surface which is radial as shown in FIG. 2 is obtained. It is noted that in the liquid crystal alignment pattern of this first region, the single period over which the optical axis of the liquid crystal compound rotated by 180° provided a liquid crystal alignment pattern in which the period decreased from the center toward the outer direction. In addition, the twisted angle of the first region at the center of the curved surface in the thickness direction was 700 in a counterclockwise direction (−70°).

Finally, in the second region of the optically anisotropic layer, it was confirmed with a polarization microscope that $\Delta n_{550}$ of liquid crystal at center of curved surface×thickness (Re(550)) is 275 nm and such a periodically aligned surface which is radial as shown in FIG. 2 is obtained. It is noted that the liquid crystal alignment pattern of this second region was such a liquid crystal alignment pattern that the period decreased toward the outer direction. In addition, the twisted angle of the second region at the center of the curved surface in the thickness direction was 70° (twisted angle: 70°) in a clockwise direction.

As a result of observing a cross section of the produced optically anisotropic layer at the center of the curved surface with an SEM, bright portions and dark portions had such a shape shown in FIG. 23. That is, the dark portion had one inflection point.

Example 7

<Production of Liquid Crystal Diffraction Element>

(Formation of Alignment Film)

The alignment film P-3 was formed on the support in the same manner as in Example 5.

(Formation of Optically Anisotropic Layer)

the compositions D-1, D-2, and D-3 were prepared in the same manner as in Example 3.

The first region of the optically anisotropic layer, the second region of the optically anisotropic layer, and the third region of the optically anisotropic layer were formed in the same manner as in the optically anisotropic layer in Example 5, except that the film thicknesses were adjusted using the compositions D-1, D-2, and D-3 respectively.

With reference to JP2012-116094A, the support with the optically anisotropic layer described above was subjected to vacuum molding to be along the convex surface of a plano-convex lens (made of optical glass, curvature radius of convex surface: 100 mm) having a diameter of 40 mm and a focal length of 200 mm. Then, the support with the optically anisotropic layer was peeled from the lens to obtain an optically anisotropic layer having a curved surface.

Finally, in the first region of the optically anisotropic layer, it was confirmed with a polarization microscope that $\Delta n_{550}$ of liquid crystal at center of curved surface×thickness (Re(550)) is 160 nm and such a periodically aligned surface which is radial as shown in FIG. 2 is obtained. It is noted that in the liquid crystal alignment pattern of this first region, the single period over which the optical axis of the liquid crystal compound rotated by 180° provided a liquid crystal alignment pattern in which the period decreased from the center toward the outer direction. In addition, the twisted angle of the first region at the center of the curved surface in the thickness direction was 800 in a counterclockwise direction (−80°).

Finally, in the second region of the optically anisotropic layer, it was confirmed with a polarization microscope that $\Delta n_{550}$ of liquid crystal at center of curved surface×thickness (Re(550)) is 335 nm and such a periodically aligned surface which is radial as shown in FIG. 2 is obtained. It is noted that in the liquid crystal alignment pattern of this second region, the single period over which the optical axis of the liquid crystal compound rotated by 180° provided a liquid crystal alignment pattern in which the period decreased from the center toward the outer direction. In addition, the twisted angle of the second region at the center of the curved surface in the thickness direction was 0°.

Finally, in the third region of the optically anisotropic layer, it was confirmed with a polarization microscope that $\Delta n_{550}$ of liquid crystal at center of curved surface×thickness (Re(550)) is 160 nm and such a periodically aligned surface which is radial as shown in FIG. 2 is obtained. It is noted that in the liquid crystal alignment pattern of this third region, the single period over which the optical axis of the liquid crystal compound rotated by 180° provided a liquid crystal alignment pattern in which the period decreased from the center toward the outer direction. In addition, the twisted angle of the third region at the center of the curved surface in the thickness direction was 800 (twisted angle: 80°) in a clockwise direction.

The optically anisotropic layer was formed in the manner described above.

As a result of observing a cross section of the produced optically anisotropic layer at the center of the curved surface with an SEM, bright portions and dark portions had such a shape shown in FIG. 13. That is, the dark portion had two inflection points.

Example 8

<Production of Liquid Crystal Diffraction Element>

(Formation of Alignment Film)

The alignment film P-3 was formed on the support in the same manner as in Example 5.

(Formation of Optically Anisotropic Layer)

the compositions D-1, D-2, and D-3 were prepared in the same manner as in Example 3.

In the formation of the first region of the optically anisotropic layer, first, the above-described composition D-1 was applied for the first layer onto the alignment film P-2, the coating film was heated to 80° C. on a hot plate, and then the coating film was irradiated with an ultraviolet ray having a wavelength of 365 nm using a LED-ultraviolet ray (UV) exposure device. At this time, the coating film was irradiated while changing the irradiation dose of the ultraviolet rays in a plane. Specifically, the irradiation dose in a plane was changed such that the irradiation dose increased from the center portion toward an end part, whereby the coating film was irradiated. Then, the coating film heated on a hot plate at 80° C. was irradiated with an ultraviolet ray having a wavelength of 365 nm at an irradiation dose of 300 mJ/cm$^2$ using a high-pressure mercury lamp in a nitrogen atmosphere. As a result, the alignment of the liquid crystal compound was immobilized.

For the second and subsequent liquid crystal layers, this liquid crystal immobilized layer was subjected to multiple coating to produce a liquid crystal immobilized layer under the same conditions as described above. In this way, the multiple coating was repeated until the total thickness reached a desired film thickness to form the first region of the optically anisotropic layer.

The second region of the optically anisotropic layer and the third region of the optically anisotropic layer were formed in the same manner as in the optically anisotropic layer in Example 5, except that the film thicknesses were adjusted using the compositions D-2 and D-3, respectively.

With reference to JP2012-116094A, the support with the optically anisotropic layer described above was subjected to vacuum molding to be along the convex surface of a plano-convex lens (made of optical glass, curvature radius of convex surface: 100 mm) having a diameter of 40 mm and a focal length of 200 mm. Then, the support with the optically anisotropic layer was peeled from the lens to obtain an optically anisotropic layer having a curved surface.

Finally, in the first region of the optically anisotropic layer, it was confirmed with a polarization microscope that $\Delta n_{550}$ of liquid crystal at center of curved surface×thickness (Re(550)) is 160 nm and such a periodically aligned surface which is radial as shown in FIG. 2 is obtained. It is noted that in the liquid crystal alignment pattern of the optically anisotropic layer, the single period over which the optical axis of the liquid crystal compound rotated by 180° provided a liquid crystal alignment pattern in which the period decreased from the center toward the outer direction. In addition, regarding the twisted angle of the optically anisotropic layer in the thickness direction, the twisted angle at the center of the curved surface was 800 in a counterclockwise direction (−80°), and the twisted angle increased from the center toward the outer direction.

Finally, in the second region of the optically anisotropic layer, it was confirmed with a polarization microscope that $\Delta n_{550}$ of liquid crystal at center of curved surface×thickness (Re(550)) is 335 nm and such a periodically aligned surface which is radial as shown in FIG. 2 is obtained. It is noted that in the liquid crystal alignment pattern of this second region, the single period over which the optical axis of the liquid crystal compound rotated by 180° provided a liquid crystal alignment pattern in which the period decreased from the center toward the outer direction. In addition, regarding the twisted angle of the second region in the thickness direction, the twisted angle at the center of the curved surface was 0°, and the twisted angle increased from the center toward the outer direction. The second region in which the twisted angle changed in a plane was formed in the manner described above.

Finally, in the third region of the optically anisotropic layer, it was confirmed with a polarization microscope that $\Delta n_{550}$ of liquid crystal at center of curved surface×thickness (Re(550)) is 160 nm and such a periodically aligned surface which is radial as shown in FIG. 2 is obtained. It is noted that in the liquid crystal alignment pattern of this third region, the single period over which the optical axis of the liquid crystal compound rotated by 180° provided a liquid crystal alignment pattern in which the period decreased from the center toward the outer direction. In addition, regarding the twisted angle of the third region in the thickness direction, the twisted angle at the center of the curved surface was 800 (twisted angle: 80°) in a clockwise direction, and the twisted angle decreased from the center toward the outer direction.

As a result of observing a cross section of the produced optically anisotropic layer at the center of the curved surface with an SEM, bright portions and dark portions had such a shape shown in FIG. 14. That is, the dark portion had two inflection points and the average tilt angle was substantially 0° at the center and increased from the center toward the outer direction.

Example 9

<Production of Liquid Crystal Diffraction Element>

(Formation of Alignment Film)

The alignment film P-3 was formed on the support in the same manner as in Example 5.

(Formation of Optically Anisotropic Layer)

The first to third regions of the optically anisotropic layer were formed in the same manner as in Example 7, except that in Example 7, the liquid crystal compound L-1 was changed to the following liquid crystal compound L-2, the adding amounts of the chiral agent C-3, the chiral agent C-4, the methyl ethyl ketone, the leveling agent T-1, and the methyl ethyl ketone were appropriately changed, and the film thickness of the optically anisotropic layer was adjusted.

Liquid Crystal Compound L-2

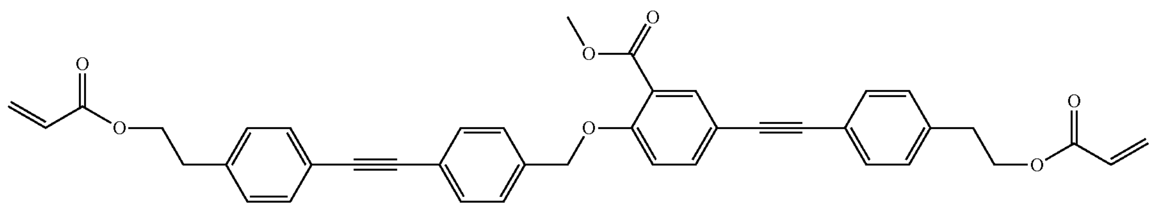 [SMILES: C=CC(=O)OCCc1ccc(C#Cc2ccc(COc3ccc(C#Cc4ccc(CCOC(=O)C=C)cc4)cc3C(=O)OC)cc2)cc1]

With reference to JP2012-116094A, the support with the optically anisotropic layer described above was subjected to vacuum molding to be along the convex surface of a plano-convex lens (made of optical glass, curvature radius of convex surface: 100 mm) having a diameter of 40 mm and a focal length of 200 mm. Then, the support with the optically anisotropic layer was peeled from the lens to obtain an optically anisotropic layer having a curved surface.

Finally, in the first region of the optically anisotropic layer, it was confirmed with a polarization microscope that $\Delta n_{550}$ of liquid crystal at center of curved surface×thickness (Re(550)) is 160 nm and such a periodically aligned surface which is radial as shown in FIG. 2 is obtained. It is noted that in the liquid crystal alignment pattern of this first region, the single period over which the optical axis of the liquid crystal compound rotated by 180° provided a liquid crystal alignment pattern in which the period decreased from the center toward the outer direction. In addition, the twisted angle of the first region at the center of the curved surface in the thickness direction was 80° in a counterclockwise direction (−80°).

Finally, in the second region of the optically anisotropic layer, it was confirmed with a polarization microscope that $\Delta n_{550}$ of liquid crystal at center of curved surface×thickness (Re(550)) is 335 nm and such a periodically aligned surface which is radial as shown in FIG. 2 is obtained. It is noted that in the liquid crystal alignment pattern of this second region, the single period over which the optical axis of the liquid crystal compound rotated by 180° provided a liquid crystal alignment pattern in which the period decreased from the center toward the outer direction. In addition, the twisted angle of the second region at the center of the curved surface in the thickness direction was 0°.

Finally, in the third region of the optically anisotropic layer, it was confirmed with a polarization microscope that $\Delta n_{550}$ of liquid crystal at center of curved surface×thickness (Re(550)) is 160 nm and such a periodically aligned surface which is radial as shown in FIG. 2 is obtained. It is noted that in the liquid crystal alignment pattern of this third region, the single period over which the optical axis of the liquid crystal compound rotated by 180° provided a liquid crystal alignment pattern in which the period decreased from the center toward the outer direction. In addition, the twisted angle of the third region at the center of the curved surface in the thickness direction was 800 (twisted angle: 80°) in a clockwise direction.

As a result of observing a cross section of the produced optically anisotropic layer at the center of the curved surface with an SEM, bright portions and dark portions had such a shape shown in FIG. 13. That is, the dark portion had two inflection points.

Example 10

<Production of Liquid Crystal Diffraction Element>

(Formation of Alignment Film)

The alignment film P-3 was formed on the support in the same manner as in Example 5.

(Formation of Optically Anisotropic Layer)

Optically anisotropic layers of the first to third regions were formed in the same manner as in Example 7, except that in Example 7, the liquid crystal compound L-1 was changed to the following liquid crystal compound L-3, the adding amounts of the chiral agents C-3, the chiral agent C-4, and the leveling agent T-1 were appropriately changed, the heating temperature of the coating film during the formation of the optically anisotropic layer was changed to 55° C., and the film thicknesses of the optically anisotropic layers was adjusted.

Liqui Crystal Compound L-3

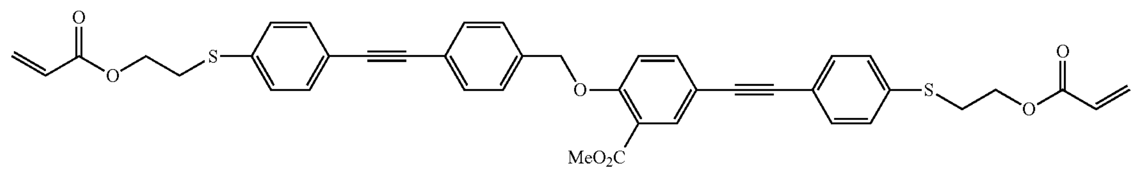 [SMILES: C=CC(=O)OCCSc1ccc(C#Cc2ccc(COc3ccc(C#Cc4ccc(SCCOC(=O)C=C)cc4)cc3C(=O)OC)cc2)cc1]

With reference to JP2012-116094A, the support with the optically anisotropic layer described above was subjected to vacuum molding to be along the convex surface of a plano-convex lens (made of optical glass, curvature radius of convex surface: 100 mm) having a diameter of 40 mm and a focal length of 200 mm. Then, the support with the optically anisotropic layer was peeled from the lens to obtain an optically anisotropic layer having a curved surface.

Finally, in the first region of the optically anisotropic layer, it was confirmed with a polarization microscope that $\Delta n_{550}$ of liquid crystal at center of curved surface×thickness (Re(550)) is 160 nm and such a periodically aligned surface which is radial as shown in FIG. 2 is obtained. It is noted that in the liquid crystal alignment pattern of this first region, the single period over which the optical axis of the liquid crystal compound rotated by 180° provided a liquid crystal alignment pattern in which the period decreased from the center toward the outer direction. In addition, the twisted angle of the first region at the center of the curved surface in the thickness direction was 80° in a counterclockwise direction (−80°).

Finally, in the second region of the optically anisotropic layer, it was confirmed with a polarization microscope that $\Delta n_{550}$ of liquid crystal at center of curved surface×thickness (Re(550)) is 335 nm and such a periodically aligned surface which is radial as shown in FIG. 2 is obtained. It is noted that in the liquid crystal alignment pattern of this second region, the single period over which the optical axis of the liquid crystal compound rotated by 180° provided a liquid crystal alignment pattern in which the period decreased from the center toward the outer direction. In addition, the twisted angle of the second region at the center of the curved surface in the thickness direction was 0°.

Finally, in the third region of the optically anisotropic layer, it was confirmed with a polarization microscope that $\Delta n_{550}$ of liquid crystal at center of curved surface×thickness (Re(550)) is 160 nm and such a periodically aligned surface which is radial as shown in FIG. 2 is obtained. It is noted that in the liquid crystal alignment pattern of this third region, the single period over which the optical axis of the liquid crystal compound rotated by 180° provided a liquid crystal alignment pattern in which the period decreased from the center toward the outer direction. In addition, the twisted angle of the third region at the center of the curved surface in the thickness direction was 800 (twisted angle: 80°) in a clockwise direction.

As a result of observing a cross section of the produced optically anisotropic layer at the center of the curved surface with an SEM, bright portions and dark portions had such a shape shown in FIG. 13. That is, the dark portion had two inflection points.

It is noted that $\Delta n_{550}$ of the optically anisotropic layer (liquid crystal compound) of each of Comparative Example 1 and Examples 1 to 8 was 0.15, $\Delta n_{550}$ of the optically anisotropic layer of Example 9 was 0.25, and $\Delta n_{550}$ of the optically anisotropic layer of Example 10 was 0.32.

Examples 11 to 16

<Production of Liquid Crystal Diffraction Element>

(Support)

A flat plate-shaped glass substrate was prepared as the support.

(Formation of Alignment Film)

The following coating liquid for forming an alignment film was applied onto the support by spin coating. The support on which the coating film of the coating liquid for forming an alignment film had been formed was dried on a hot plate of 60° C. for 60 seconds to form an alignment film.

Coating liquid for forming alignment film

| | |
|---|---|
| Material A for photo alignment | 1.00 part by mass |
| Water | 16.00 parts by mass |
| Butoxyethanol | 42.00 parts by mass |
| Propylene glycol monomethyl ether | 42.00 parts by mass |

(Exposure of Alignment Film)

The alignment film was exposed in the same manner to form an alignment film P-4 having a radial alignment pattern, except that the lens was changed to an exposure lens having a different focal length in Comparative Example 1 and the distance between the lens and the alignment film was changed.

In the exposure device, a laser that emits laser light having a wavelength (325 nm) was used as the laser. The exposure amount of the interference light was 1,000 mJ/cm$^2$. It is noted that by using the exposure device shown in FIG. 9, the single period of the alignment pattern was set to be gradually decreased from the center toward the outer direction. The formed alignment pattern was set to be such an alignment pattern that the single period at a position at a distance of about 3 mm from the center of the optical axis was 14 m and the single period at a position at a distance of 15 mm from the center of the optical axis was 2.7 m, which provided a period that decreased toward the outer direction.

(Formation of Optically Anisotropic Layer)

An optically anisotropic layer was formed in the same manner as in Examples 5 to 10, except that the alignment film P-4 was used.

<Production of UV Adhesive>

The following UV adhesive composition was prepared.

UV Adhesive Composition

| | |
|---|---|
| CEL2021P (manufactured by Daicel Corporation) | 70 parts by mass |
| 1,4-butanediol diglycidyl ether | 20 parts by mass |
| 2-ethylhexyl glycidyl ether | 10 parts by mass |
| CPI-100P | 2.25 parts by mass |

CPI-100P

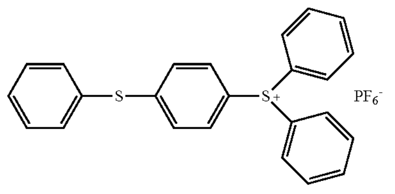

Using the prepared UV adhesive, a resin base material "TECHNOLLOY C001" (polycarbonate/poly methyl methacrylate (PMMA) laminated base material, thickness: 75 μm) manufactured by SUMIKA ACRYL Co., Ltd. was bonded to the surface of the optically anisotropic layer. Then, the alignment film and the optically anisotropic layer were peeled to produce a support with an optically anisotropic layer in which the resin base material/the adhesive layer/the optically anisotropic layer were disposed in this order. The thickness of the UV adhesive layer was 3 m.

With reference to JP2012-116094A, the support with the optically anisotropic layer described above was subjected to vacuum molding to be along the convex surface of a plano-convex lens (made of optical glass, curvature radius of convex surface: 100 mm) having a diameter of 40 mm and a focal length of 200 mm. Then, the support with the optically anisotropic layer was peeled from the lens to obtain an optically anisotropic layer having a curved surface.

Liquid crystal diffraction elements of Examples 11 to 16 were produced in the manner described above.

Examples 17 to 22

<Production of Liquid Crystal Diffraction Element>

(Support)

As a support, a resin base material "TECHNOLLOY C001" (polycarbonate/poly methyl methacrylate (PMMA) laminated base material, thickness: 75 μm) manufactured by SUMIKA ACRYL Co., Ltd. was prepared.

With reference to JP2012-116094A, the support was subjected to vacuum molding to be along the convex surface of a plano-convex lens (made of optical glass, curvature radius of convex surface: 100 mm) having a diameter of 40 mm and a focal length of 200 mm. Then, the support was peeled off from the lens.

(Formation of Alignment Film)

The above-described support having a curved surface, which had been obtained by subjecting a support to a corona treatment, was subjected to spray coating with the same coating liquid for forming alignment film as that in Comparative Example 1 by using a coater "rCoater" manufactured by ASAHI SUNAC CORPORATION.

The support on which the coating film of the coating liquid for forming an alignment film had been formed was dried with a heater of 60° C. for 60 seconds to form an alignment film.

(Exposure of Alignment Film)

The alignment film was exposed in the same manner to form an alignment film P-5 having a radial alignment pattern, except that the lens was changed to an exposure lens having a different focal length in Comparative Example 1 and the distance between the lens and the alignment film was changed.

In the exposure device, a laser that emits laser light having a wavelength (325 nm) was used as the laser. The exposure amount of the interference light was 1,000 mJ/$cm^2$. It is noted that by using the exposure device shown in FIG. 9, the single period of the alignment pattern was set to be gradually decreased from the center toward the outer direction. The formed alignment pattern was set to be such an alignment pattern that the single period at a position at a distance of about 3 mm from the center of the optical axis was 14 m and the single period at a position at a distance of 15 mm from the center of the optical axis was 2.7 m, which provided a period that decreased toward the outer direction.

(Formation of Optically Anisotropic Layer)

The above-described photo-alignment film having a curved surface that had been subjected to the alignment treatment was subjected to spray coating with the same liquid crystal composition as those in Examples 5 to 10 by using a coater "rCoater" manufactured by ASAHI SUNAC CORPORATION, thereby obtaining an optically anisotropic layer having a curved surface.

Liquid crystal diffraction elements of Examples 17 to 22 were produced in the manner described above.

Examples 23 to 26

(Formation and Exposure of Alignment Film)

An alignment film was formed and exposed in the same manner as in Examples 7 to 10, except for the alignment pattern. In this case, the formed alignment pattern was set to be such an alignment pattern that the single period at a position at a distance of about 3 mm from the center of the optical axis was 45 m and the single period at a position at a distance of 15 mm from the center of the optical axis was 8.2 m, which provided a period that decreased toward the outer direction.

<Production of Liquid Crystal Diffraction Element>

The first to third regions of the optically anisotropic layer were formed in the same manner as in Examples 7 to 10.

With reference to JP2012-116094A, the support with the optically anisotropic layer described above was subjected to vacuum molding to be along the convex surface of a plano-convex lens (made of optical glass, curvature radius of convex surface: 32 mm) having a diameter of 50 mm and a focal length of 70 mm, thereby obtaining an optically anisotropic layer having a curved surface.

Liquid crystal diffraction elements of Examples 23 to 26 were produced in the manner described above.

Examples 27 to 30

(Formation and Exposure of Alignment Film)

An alignment film was formed and exposed in the same manner as in Examples 7 to 10, except for the alignment pattern. In this case, the formed alignment pattern was set to be such an alignment pattern that the single period at a position at a distance of about 3 mm from the center of the optical axis was 18 m and the single period at a position at a distance of 15 mm from the center of the optical axis was 3.6 m, which provided a period that decreased toward the outer direction.

<Production of Liquid Crystal Diffraction Element>

The first to third regions of the optically anisotropic layer were formed in the same manner as in Examples 7 to 10.

With reference to JP2012-116094A, the support with the optically anisotropic layer described above was subjected to vacuum molding to be along the convex surface of a plano-convex lens (made of optical glass, curvature radius of convex surface: 55 mm) having a diameter of 50 mm and a focal length of 120 mm, thereby obtaining an optically anisotropic layer having a curved surface.

Liquid crystal diffraction elements of Examples 27 to 30 were produced in the manner described above.

Examples 31 to 34

(Formation and Exposure of Alignment Film)

An alignment film was formed and exposed in the same manner as in Examples 7 to 10, except for the alignment pattern. In this case, the formed alignment pattern was set to be such an alignment pattern that the single period at a position at a distance of about 3 mm from the center of the optical axis was 16 m and the single period at a position at a distance of 15 mm from the center of the optical axis was 3.1 m, which provided a period that decreased toward the outer direction.

<Production of Liquid Crystal Diffraction Element>

The first to third regions of the optically anisotropic layer were formed in the same manner as in Examples 7 to 10.

With reference to JP2012-116094A, the support with the optically anisotropic layer described above was subjected to vacuum molding to be along the convex surface of a plano-convex lens (made of optical glass, curvature radius of convex surface: 69 mm) having a diameter of 50 mm and a focal length of 150 mm, thereby obtaining an optically anisotropic layer having a curved surface.

Liquid crystal diffraction elements of Examples 31 to 34 were produced in the manner described above.

Examples 35 to 38

(Formation and Exposure of Alignment Film)

An alignment film was formed and exposed in the same manner as in Examples 7 to 10, except for the alignment pattern. In this case, the formed alignment pattern was set to be such an alignment pattern that the single period at a position at a distance of about 3 mm from the center of the optical axis was 12 m and the single period at a position at a distance of 15 mm from the center of the optical axis was 2.3 m, which provided a period that decreased toward the outer direction.

<Production of Liquid Crystal Diffraction Element>

The first to third regions of the optically anisotropic layer were formed in the same manner as in Examples 7 to 10.

With reference to JP2012-116094A, the support with the optically anisotropic layer described above was subjected to vacuum molding to be along the convex surface of a plano-convex lens (made of optical glass, curvature radius of convex surface: 184 mm) having a diameter of 50 mm and a focal length of 400 mm, thereby obtaining an optically anisotropic layer having a curved surface.

Liquid crystal diffraction elements of Examples 35 to 38 were produced in the manner described above.

Examples 39 to 42

(Formation and Exposure of Alignment Film)

An alignment film was formed and exposed in the same manner as in Examples 7 to 10, except for the alignment pattern. In this case, the formed alignment pattern was set to be such an alignment pattern that the single period at a position at a distance of about 3 mm from the center of the optical axis was 11 m and the single period at a position at a distance of 15 mm from the center of the optical axis was 2.1 m, which provided a period that decreased toward the outer direction.

<Production of Liquid Crystal Diffraction Element>

The first to third regions of the optically anisotropic layer were formed in the same manner as in Examples 7 to 10.

With reference to JP2012-116094A, the support with the optically anisotropic layer described above was subjected to vacuum molding to be along the convex surface of a plano-convex lens (made of optical glass, curvature radius of convex surface: 552 mm) having a diameter of 50 mm and a focal length of 1200 mm, thereby obtaining an optically anisotropic layer having a curved surface.

Liquid crystal diffraction elements of Examples 39 to 42 were produced in the manner described above.

Examples 43 to 46

(Formation and Exposure of Alignment Film)

An alignment film was formed and exposed in the same manner as in Examples 13 to 16, except for the alignment pattern. In this case, the formed alignment pattern was set to be such an alignment pattern that the single period at a position at a distance of about 3 mm from the center of the optical axis was 45 μm and the single period at a position at a distance of 15 mm from the center of the optical axis was 8.2 m, which provided a period that decreased toward the outer direction.

<Production of Liquid Crystal Diffraction Element>

The first to third regions of the optically anisotropic layer were formed in the same manner as in Examples 13 to 16, and the optically anisotropic layer was transferred to a resin base material to produce a support with an optically anisotropic layer in which the resin base material/the adhesive layer/the optically anisotropic layer were disposed in this order.

With reference to JP2012-116094A, the support with the optically anisotropic layer described above was subjected to vacuum molding to be along the convex surface of a plano-convex lens (made of optical glass, curvature radius of convex surface: 32 mm) having a diameter of 50 mm and a focal length of 70 mm, thereby obtaining an optically anisotropic layer having a curved surface.

Liquid crystal diffraction elements of Examples 43 to 46 were produced in the manner described above.

Examples 47 to 50

(Formation and Exposure of Alignment Film)

An alignment film was formed and exposed in the same manner as in Examples 13 to 16, except for the alignment pattern. In this case, the formed alignment pattern was set to be such an alignment pattern that the single period at a position at a distance of about 3 mm from the center of the optical axis was 18 m and the single period at a position at a distance of 15 mm from the center of the optical axis was 3.6 m, which provided a period that decreased toward the outer direction.

<Production of Liquid Crystal Diffraction Element>

The first to third regions of the optically anisotropic layer were formed in the same manner as in Examples 13 to 16, and the optically anisotropic layer was transferred to a resin base material to produce a support with an optically anisotropic layer in which the resin base material/the adhesive layer/the optically anisotropic layer were disposed in this order.

With reference to JP2012-116094A, the support with the optically anisotropic layer described above was subjected to vacuum molding to be along the convex surface of a plano-convex lens (made of optical glass, curvature radius of convex surface: 55 mm) having a diameter of 50 mm and a focal length of 120 mm, thereby obtaining an optically anisotropic layer having a curved surface.

Liquid crystal diffraction elements of Examples 47 to 50 were produced in the manner described above.

Examples 51 to 54

(Formation and Exposure of Alignment Film)

An alignment film was formed and exposed in the same manner as in Examples 13 to 16, except for the alignment pattern. In this case, the formed alignment pattern was set to be such an alignment pattern that the single period at a position at a distance of about 3 mm from the center of the optical axis was 16 m and the single period at a position at a distance of 15 mm from the center of the optical axis was 3.1 m, which provided a period that decreased toward the outer direction.

<Production of Liquid Crystal Diffraction Element>

The first to third regions of the optically anisotropic layer were formed in the same manner as in Examples 13 to 16, and the optically anisotropic layer was transferred to a resin base material to produce a support with an optically anisotropic layer in which the resin base material/the adhesive layer/the optically anisotropic layer were disposed in this order.

With reference to JP2012-116094A, the support with the optically anisotropic layer described above was subjected to vacuum molding to be along the convex surface of a plano-convex lens (made of optical glass, curvature radius of convex surface: 69 mm) having a diameter of 50 mm and a focal length of 150 mm, thereby obtaining an optically anisotropic layer having a curved surface.

Liquid crystal diffraction elements of Examples 51 to 54 were produced in the manner described above.

Examples 55 to 58

(Formation and Exposure of Alignment Film)

An alignment film was formed and exposed in the same manner as in Examples 13 to 16, except for the alignment pattern. In this case, the formed alignment pattern was set to be such an alignment pattern that the single period at a position at a distance of about 3 mm from the center of the optical axis was 12 m and the single period at a position at a distance of 15 mm from the center of the optical axis was 2.3 m, which provided a period that decreased toward the outer direction.

<Production of Liquid Crystal Diffraction Element>

The first to third regions of the optically anisotropic layer were formed in the same manner as in Examples 13 to 16, and the optically anisotropic layer was transferred to a resin base material to produce a support with an optically anisotropic layer in which the resin base material/the adhesive layer/the optically anisotropic layer were disposed in this order.

With reference to JP2012-116094A, the support with the optically anisotropic layer described above was subjected to vacuum molding to be along the convex surface of a plano-convex lens (made of optical glass, curvature radius of convex surface: 184 mm) having a diameter of 50 mm and a focal length of 400 mm, thereby obtaining an optically anisotropic layer having a curved surface.

Liquid crystal diffraction elements of Examples 55 to 58 were produced in the manner described above.

Examples 59 to 62

(Formation and Exposure of Alignment Film)

An alignment film was formed and exposed in the same manner as in Examples 13 to 16, except for the alignment pattern. In this case, the formed alignment pattern was set to be such an alignment pattern that the single period at a position at a distance of about 3 mm from the center of the optical axis was 11 m and the single period at a position at a distance of 15 mm from the center of the optical axis was 2.1 m, which provided a period that decreased toward the outer direction.

<Production of Liquid Crystal Diffraction Element>

The first to third regions of the optically anisotropic layer were formed in the same manner as in Examples 13 to 16, and the optically anisotropic layer was transferred to a resin base material to produce a support with an optically anisotropic layer in which the resin base material/the adhesive layer/the optically anisotropic layer were disposed in this order.

With reference to JP2012-116094A, the support with the optically anisotropic layer described above was subjected to vacuum molding to be along the convex surface of a plano-convex lens (made of optical glass, curvature radius of convex surface: 552 mm) having a diameter of 50 mm and a focal length of 1200 mm, thereby obtaining an optically anisotropic layer having a curved surface.

Liquid crystal diffraction elements of Examples 59 to 62 were produced in the manner described above.

Examples 63 to 66

<Production of Liquid Crystal Diffraction Element>

As a support, a plano-convex lens (made of optical glass, curvature radius of convex surface: 100 mm) having a diameter of 40 mm and a focal length of 200 mm was prepared.

An alignment film and an optically anisotropic layer were formed in the same manner as in Examples 19 to 22, except that the support was used.

Liquid crystal diffraction elements of Examples 63 to 66 were produced in the manner described above.

Evaluation

Evaluation of Wavelength Dependence of Emission Angle

In a case where light was incident into the produced liquid crystal diffraction element from the front (direction with an angle of 0° with respect to the normal line), the emission angle of emitted light was evaluated.

Specifically, laser light having an output center wavelength at each of 450 nm, 532 nm, and 650 nm was emitted from a light source and allowed to be incident into the produced liquid crystal diffraction element from the support side to be parallel to the optical axis of the lens shape of the liquid crystal diffraction element (optically anisotropic layer). The incidence position was set to a position spaced apart by 15 mm from the center of the optical axis in a direction perpendicular to the optical axis. In the emitted light from the liquid crystal diffraction element, the emission angle of the diffracted light (first-order light) diffracted in a desired direction was measured using a photodetector. It is noted that laser light was allowed to be vertically incident into the circularly polarizing plate corresponding to the wavelength of the laser light to be converted into circularly polarized light, which was subsequently incident into the produced liquid crystal diffraction element, and the evaluation was carried out. In a case where the emission angles of the first-order light are measured for each of the above three wavelengths, and a difference between the maximum angle and the minimum angle among the three angles is calculated, it is preferable that the difference is small, that is, the wavelength dependence is small. The smaller the wavelength dependence, the smaller the chromatic aberration.

<Evaluation of Diffraction Efficiency>

In a case where light was incident into the produced liquid crystal diffraction element from the front (direction with an angle of 0° with respect to the normal line), the intensity of emitted light was evaluated.

Specifically, laser light having an output center wavelength at each of 450 nm, 532 nm, and 650 nm was emitted from a light source and allowed to be vertically incident into the produced liquid crystal diffraction element from the support side to be parallel to the optical axis of the lens shape of the liquid crystal diffraction element (optically anisotropic layer). The incidence positions were set to a position spaced apart by 3 mm and a position spaced apart by 15 mm from the center of the optical axis in a direction perpendicular to the optical axis. In the emitted light from the liquid crystal diffraction element, the intensities of the diffracted light (first-order light) diffracted in a desired direction and zero-order light (emitted in the same direction as the traveling direction of incidence light) emitted in the other directions were measured using a photodetector. It is noted that laser light was allowed to be vertically incident into the circularly polarizing plate corresponding to the wavelength of the laser light to be converted into circularly polarized light, which was subsequently incident into the produced liquid crystal diffraction element, and the evaluation was carried out. The diffraction efficiency of the three wavelengths was measured at each of the above two positions, and the values obtained by arithmetically averaging the six values of the diffraction efficiency were compared.

The wavelength dependence of the emission angle of the liquid crystal diffraction element of each of the produced in Examples 1 to 66 was small as compared with that of the liquid crystal diffraction element produced in Comparative Example 1. In addition, the liquid crystal diffraction element of each of the produced in Examples 1 to 66 had a high diffraction efficiency compared with the liquid crystal diffraction element produced in Comparative Example 1.

In addition, the liquid crystal diffraction element of Example 2 had a small wavelength dependence of the diffraction efficiency as compared with the liquid crystal diffraction element of Example 1, and the liquid crystal diffraction element of Example 3 had a further small wavelength dependence of the diffraction efficiency.

The liquid crystal diffraction element of Example 4 had a high diffraction efficiency and a small in-plane dependency as compared with the liquid crystal diffraction element of Example 3. In addition, in this Example, a liquid crystal diffraction element having a small difference in diffraction efficiency between the position of 3 mm and the position of 15 mm was regarded as having a small in-plane dependency.

The liquid crystal diffraction element of Example 6 had a small wavelength dependence of the diffraction efficiency as compared with the liquid crystal diffraction element of Example 5, and the liquid crystal diffraction element of Example 7 had a further small wavelength dependence of the diffraction efficiency.

The liquid crystal diffraction element of Example 8 had a high diffraction efficiency and a small in-plane dependency as compared with the liquid crystal diffraction element of Example 7.

The liquid crystal diffraction element of Example 9 had a high diffraction efficiency and a small in-plane dependency as compared with the liquid crystal diffraction element of Example 7, and the liquid crystal diffraction element of Example 10 had a further high diffraction efficiency and a further small in-plane dependency.

The liquid crystal diffraction element of Example 12 had a small wavelength dependence of the diffraction efficiency as compared with the liquid crystal diffraction element of Example 11, and the liquid crystal diffraction element of Example 13 had a further small wavelength dependence of the diffraction efficiency.

The liquid crystal diffraction element of Example 14 had a high diffraction efficiency and a small in-plane dependency as compared with the liquid crystal diffraction element of Example 13.

The liquid crystal diffraction element of Example 15 had a high diffraction efficiency and a small in-plane dependency as compared with the liquid crystal diffraction element of Example 13, and the liquid crystal diffraction element of Example 16 had a further high diffraction efficiency and a further small in-plane dependency.

The liquid crystal diffraction element of Example 18 had a small wavelength dependence of the diffraction efficiency as compared with the liquid crystal diffraction element of Example 17, and the liquid crystal diffraction element of Example 19 had a further small wavelength dependence of the diffraction efficiency.

The liquid crystal diffraction element of Example 20 had a high diffraction efficiency and a small in-plane dependency as compared with the liquid crystal diffraction element of Example 19.

The liquid crystal diffraction element of Example 21 had a high diffraction efficiency and a small in-plane dependency as compared with the liquid crystal diffraction element of Example 19, and the liquid crystal diffraction element of Example 22 had a further high diffraction efficiency and a further small in-plane dependency.

The liquid crystal diffraction element of Example 24 had a high diffraction efficiency and a small in-plane dependency as compared with the liquid crystal diffraction element of Example 23.

The liquid crystal diffraction element of Example 25 had a high diffraction efficiency and a small in-plane dependency as compared with the liquid crystal diffraction element of Example 23, and the liquid crystal diffraction element of Example 26 had a further high diffraction efficiency and a further small in-plane dependency.

The liquid crystal diffraction element of Example 28 had a high diffraction efficiency and a small in-plane dependency as compared with the liquid crystal diffraction element of Example 27.

The liquid crystal diffraction element of Example 29 had a high diffraction efficiency and a small in-plane dependency as compared with the liquid crystal diffraction element of Example 27, and the liquid crystal diffraction element of Example 30 had a further high diffraction efficiency and a further small in-plane dependency.

The liquid crystal diffraction element of Example 32 had a high diffraction efficiency and a small in-plane dependency as compared with the liquid crystal diffraction element of Example 31.

The liquid crystal diffraction element of Example 33 had a high diffraction efficiency and a small in-plane dependency as compared with the liquid crystal diffraction element of Example 31, and the liquid crystal diffraction element of Example 34 had a further high diffraction efficiency and a further small in-plane dependency.

The liquid crystal diffraction element of Example 36 had a high diffraction efficiency and a small in-plane dependency as compared with the liquid crystal diffraction element of Example 35.

The liquid crystal diffraction element of Example 37 had a high diffraction efficiency and a small in-plane dependency as compared with the liquid crystal diffraction element of Example 35, and the liquid crystal diffraction element of Example 38 had a further high diffraction efficiency and a further small in-plane dependency.

The liquid crystal diffraction element of Example 40 had a high diffraction efficiency and a small in-plane dependency as compared with the liquid crystal diffraction element of Example 39.

The liquid crystal diffraction element of Example 41 had a high diffraction efficiency and a small in-plane dependency as compared with the liquid crystal diffraction element of Example 39, and the liquid crystal diffraction element of Example 42 had a further high diffraction efficiency and a further small in-plane dependency.

The liquid crystal diffraction element of Example 44 had a high diffraction efficiency and a small in-plane dependency as compared with the liquid crystal diffraction element of Example 43.

The liquid crystal diffraction element of Example 45 had a high diffraction efficiency and a small in-plane dependency as compared with the liquid crystal diffraction element of Example 43, and the liquid crystal diffraction element of Example 46 had a further high diffraction efficiency and a further small in-plane dependency.

The liquid crystal diffraction element of Example 48 had a high diffraction efficiency and a small in-plane dependency as compared with the liquid crystal diffraction element of Example 47.

The liquid crystal diffraction element of Example 49 had a high diffraction efficiency and a small in-plane dependency as compared with the liquid crystal diffraction element of Example 47, and the liquid crystal diffraction element of Example 50 had a further high diffraction efficiency and a further small in-plane dependency.

The liquid crystal diffraction element of Example 52 had a high diffraction efficiency and a small in-plane dependency as compared with the liquid crystal diffraction element of Example 51.

The liquid crystal diffraction element of Example 53 had a high diffraction efficiency and a small in-plane dependency as compared with the liquid crystal diffraction element of Example 51, and the liquid crystal diffraction element of Example 54 had a further high diffraction efficiency and a further small in-plane dependency.

The liquid crystal diffraction element of Example 56 had a high diffraction efficiency and a small in-plane dependency as compared with the liquid crystal diffraction element of Example 55.

The liquid crystal diffraction element of Example 57 had a high diffraction efficiency and a small in-plane dependency as compared with the liquid crystal diffraction element of Example 55, and the liquid crystal diffraction element of Example 58 had a further high diffraction efficiency and a further small in-plane dependency.

The liquid crystal diffraction element of Example 60 had a high diffraction efficiency and a small in-plane dependency as compared with the liquid crystal diffraction element of Example 59.

The liquid crystal diffraction element of Example 61 had a high diffraction efficiency and a small in-plane dependency as compared with the liquid crystal diffraction element of Example 59, and the liquid crystal diffraction element of Example 62 had a further high diffraction efficiency and a further small in-plane dependency.

The liquid crystal diffraction element of Example 64 had a high diffraction efficiency and a small in-plane dependency as compared with the liquid crystal diffraction element of Example 63.

The liquid crystal diffraction element of Example 65 had a high diffraction efficiency and a small in-plane dependency as compared with the liquid crystal diffraction element of Example 63, and the liquid crystal diffraction element of Example 66 had a further high diffraction efficiency and a further small in-plane dependency.

Example 67

<Production of Liquid Crystal Diffraction Element>

(Support)

A flat plate-shaped glass substrate was prepared as the support.

(Formation of Alignment Film)

Each alignment film was formed in the same manner as in Example 13.

(Exposure of Alignment Film)

The alignment film P-4 having a radial alignment pattern was formed in the same manner as in Example 13.

In the exposure device, a laser that emits laser light having a wavelength (325 nm) was used as the laser. The exposure amount of the interference light was 1,000 mJ/$cm^2$. It is noted that by using the exposure device shown in FIG. 9, the single period of the alignment pattern was set to be gradually decreased from the center toward the outer direction.

(Formation of Optically Anisotropic Layer)

An optically anisotropic layer was formed in the same manner as in Example 13.

<Production of UV Adhesive>

A UV adhesive composition was prepared in the same manner as in Example 13.

Using the prepared UV adhesive, a resin base material "TECHNOLLOY C001" (polycarbonate/poly methyl methacrylate (PMMA) laminated base material, thickness: 75 μm) manufactured by SUMIKA ACRYL Co., Ltd. was bonded to the surface of the optically anisotropic layer. Then, the alignment film and the optically anisotropic layer were peeled to produce a liquid crystal diffraction element in which the resin base material/the adhesive layer/the optically anisotropic layer were disposed in this order. The thickness of the UV adhesive layer was 3 m.

<Production of Retardation Plate>

A film having a cellulose acylate film, an alignment film, and an optically anisotropic layer C was obtained using the same method described in paragraph [0259] of WO2022/050321A. The optically anisotropic layer C was the positive A plate (retardation plate), and the thickness of the positive A plate was controlled such that Re(550) was 138 nm.

<Production of Polarizing Plate>

A polarizing plate (laminate 1B) was produced with reference to paragraphs [0270] to [0283] of WO2022/050321A. It is noted that for clarification, the optically anisotropic layer of the laminate 1B will be hereinafter referred to as an "optically anisotropic layer B".

<Production of Laminate for Forming Optical Element>

The optically anisotropic layer side of the liquid crystal diffraction element was bonded to the surface of the optically anisotropic layer C of the produced retardation plate by using the UV adhesive prepared above. Thereafter, the alignment film and the optically anisotropic layer C were peeled to produce a laminate A in which the resin base material/the adhesive layer/the optically anisotropic layer/the adhesive layer/the optically anisotropic layer C were disposed in this order. The thickness of the UV adhesive layer was 3 m.

The optically anisotropic layer C side of the laminate A was bonded to the surface of the optically anisotropic layer B of the produced laminate 1B by using the UV adhesive prepared above. In this case, the retardation plate and the linearly polarizing plate were disposed such that a relative angle between a slow axis of the retardation plate and an absorption axis of the linearly polarizing plate was 45°. Thereafter, the alignment film and the optically anisotropic layer B were peeled to produce a laminate for forming an optical element, in which the resin base material/the adhesive layer/the optically anisotropic layer/the adhesive layer/the optically anisotropic layer C/the adhesive layer/the optically anisotropic layer B were disposed in this order. The thickness of the UV adhesive layer was 3 μm.

<Production of Optical Element>

With reference to JP2012-116094A, the above-described laminate for forming an optical element was subjected to vacuum molding so that a resin base material was in contact on a convex surface side of a plano-convex lens (made of optical glass, curvature radius of convex surface: 100 mm) having a diameter of 40 mm and a focal length of 200 mm and was along the convex surface. Then, the laminate for forming an optical element was peeled from the lens to obtain an optical element having a curved surface.

Example 68

An optical element was produced in the same manner as in Example 67, except that the liquid crystal diffraction element of Example 67 was produced in the same manner as in Example 16.

Example 69

An optical element was produced in the same manner as in Example 67, except that the liquid crystal diffraction element of Example 67 was produced in the same manner as in Example 17.

Evaluation

The intensity of emitted light was evaluated in a case where the light was incident into the produced optical element from the front (direction with an angle of 0° with respect to the normal line).

Specifically, laser light having output center wavelengths at 405 nm, 450 nm, 532 nm, and 650 nm was emitted from a light source and allowed to be vertically incident into the apex part of the convex surface of the produced optical element. In the emitted light from the liquid crystal diffraction element, the intensities of the diffracted light (first-order light) diffracted in a desired direction and zero-order light emitted in the other directions were measured using a photodetector. Laser light was allowed to be vertically incident into the circularly polarizing plate corresponding to the wavelength of the laser light to be converted into circularly polarized light, the circularly polarized light was incident from the liquid crystal diffraction element side of the produced optical element, and the evaluation was carried out.

It was confirmed that, in the optical elements produced in Examples 67 to 69, the intensity of the zero-order light can be significantly reduced at any wavelength, and the contrast ratio (the intensity ratio of first-order light/zero-order light) is improved before bonding the retardation plate to the polarizing plate, that is, as compared with Examples 13, 16, and 17.

From the above results, the effects of the present invention are clear.

EXPLANATION OF REFERENCES

10*a* to 10*e*: liquid crystal diffraction element
12: half mirror
14: reflective circular polarizer
16, 16*b*: display panel
18,18*b*: linear polarizer
20: retardation layer
26: circularly polarizing plate
30, 30*b*, 30*c*: support
32: alignment film
36, 36*a* to 36*d*: optically anisotropic layer
37*a* to 37*c*: region
40: liquid crystal compound
40A: optical axis
42: bright portion
44: dark portion
50: optical element
52: linear polarizer
54: retardation layer
60, 80: exposure device
62,82: laser
64, 84: light source
65: λ/2 plate
68: beam splitter
70A, 70B, 90A, 90B: mirror
72A, 72B, 96: λ/4 plate
86, 94: polarization beam splitter
92: lens
R: red light
G: green light
B: blue light
A, $A_1$, $A_2$: single period
D, $A_1$ to $A_4$: arrangement axis
R: region
M: laser light
MA, MB: beam
MP: P polarized light
MS: S polarized light
$P_O$: linearly polarized light
$P_R$: dextrorotatory circularly polarized light
$P_L$: levorotatory circularly polarized light α: intersecting angle
$L_1$, $L_2$, $L_4$, $L_5$: light
P: helical pitch
$R_R$: dextrorotatory circularly polarized light
$R_L$: levorotatory circularly polarized light
U: user

What is claimed is:

1. A liquid crystal diffraction element comprising:

an optically anisotropic layer that is formed of a liquid crystal composition containing a liquid crystal compound, wherein the optically anisotropic layer has a liquid crystal alignment pattern in which a direction of an optical axis derived from the liquid crystal compound changes while continuously rotating along at least one in-plane direction, the optically anisotropic layer has at least a curved surface portion, and the at least one in-plane direction in which the direction of the optical axis derived from the liquid crystal compound changes while continuously rotating in the liquid crystal alignment pattern is parallel to a curved direction of the curved surface portion.

2. The liquid crystal diffraction element according to claim 1, wherein in an image captured by observing a cross section of the optically anisotropic layer with a scanning electron microscope, the cross sections being cut in a thickness direction along the one in-plane direction, the optically anisotropic layer has bright portions and dark portions, which extend from one main surface to the other main surface, and has a region in which in the thickness direction, the dark portions are tilted with respect to the main surface.

3. The liquid crystal diffraction element according to claim 1, wherein in an image captured by observing a cross section of the optically anisotropic layer with a scanning electron microscope, the cross sections being cut in a thickness direction along the one in-plane direction, the optically anisotropic layer has bright portions and dark portions, which extend from one main surface to the other main surface, and the dark portions have one or more inflection points of angle.

4. The liquid crystal diffraction element according to claim 1, wherein in an image captured by observing a cross section of the optically anisotropic layer with a scanning electron microscope, the cross sections being cut in a thickness direction along the one in-plane direction, the optically anisotropic layer has bright portions and dark portions, which extend from one main surface to the other main surface, and the dark portions have two or more inflection points of angle.

5. The liquid crystal diffraction element according to claim 1, wherein in a case where a length over which the direction of the optical axis derived from the liquid crystal compound in the liquid crystal alignment pattern rotates by 180° in a plane is set as a single period, regions in which lengths of the single periods are different from each other are provided in a plane direction.

6. The liquid crystal diffraction element according to claim 5, wherein a region in which the length of the single period in the liquid crystal alignment pattern gradually changes along the one in-plane direction is provided.

7. The liquid crystal diffraction element according to claim 3, wherein in an image captured by observing a cross section of the optically anisotropic layer with a scanning electron microscope, the cross sections being cut in a thickness direction along the one in-plane direction, the optically anisotropic layer has bright portions and dark portions, which extend from one main surface to the other main surface, and has regions in which tilt directions of the dark portions of the optically anisotropic layer are different from each other in a plane direction.

8. The liquid crystal diffraction element according to claim 3, wherein a region in which an average tilt angle of the dark portion gradually changes along the one in-plane direction is provided.

9. The liquid crystal diffraction element according to claim 3, wherein in a case where a length over which the direction of the optical axis derived from the liquid crystal compound in the liquid crystal alignment pattern rotates by 180° in a plane is set as a single period, a region in which an average tilt angle of the dark portion increases as the length of the single period decreases is provided in a plane direction.

10. The liquid crystal diffraction element according to claim 1, wherein in the liquid crystal alignment pattern of the optically anisotropic layer, the one direction in which the direction of the optical axis derived from the liquid crystal compound changes while continuously rotating is provided in a radial shape directed from an inner side toward an outer side.

11. The liquid crystal diffraction element according to claim 10, wherein in an image captured by observing a cross section of the optically anisotropic layer with a scanning electron microscope, the cross sections being cut in a thickness direction along the one in-plane direction, the optically anisotropic layer has bright portions and dark portions, which extend from one main surface to the other main surface, and in the optically anisotropic layer, shapes of the bright portions and the dark portions in a cross section of a radial center portion are symmetrical with respect to the center line of the optically anisotropic layer in the thickness direction, and shapes of the bright portions and the dark portions in a cross section of a radial end part are asymmetrical with respect to the center line of the optically anisotropic layer in the thickness direction.

12. The liquid crystal diffraction element according to claim 10, wherein in an image captured by observing a cross section of the optically anisotropic layer with a scanning electron microscope, the cross sections being cut in a thickness direction along the one in-plane direction, the optically anisotropic layer has bright portions and dark portions, which extend from one main surface to the other main surface, and in the optically anisotropic layer, shapes of the bright portions and the dark portions in a cross section of a radial center portion are asymmetrical with respect to the center line of the optically anisotropic layer in the thickness direction, and shapes of the bright portions and the dark portions in a cross section of a radial end part are asymmetrical with respect to the center line of the optically anisotropic layer in the thickness direction.

13. The liquid crystal diffraction element according to claim 1, wherein in the optically anisotropic layer, the liquid crystal compound is cholesterically aligned in a thickness direction.

14. The liquid crystal diffraction element according to claim 1, wherein a refractive index difference $\Delta n_{550}$ associated with a refractive index anisotropy of the optically anisotropic layer is 0.2 or more.

15. The liquid crystal diffraction element according to claim 1, wherein at least a part of the optically anisotropic layer in a plane has the curved surface portion having a curvature radius of 20 mm to 2,500 mm.

16. The liquid crystal diffraction element according to claim 1, wherein the liquid crystal diffraction element consists of a substrate having at least a curved surface portion and the optically anisotropic layer which is disposed on a substrate and has a curved surface portion along the curved surface portion of the substrate.

17. The liquid crystal diffraction element according to claim 16, wherein the substrate, an alignment film, and the optically anisotropic layer are disposed in this order.

18. The liquid crystal diffraction element according to claim 16, wherein the substrate, an adhesive layer, and the optically anisotropic layer are disposed in this order.

19. An optical element comprising:

the liquid crystal diffraction element according to claim 1; and a retardation layer having at least a curved surface portion.

20. The optical element according to claim 19, wherein the retardation layer has a $\lambda/4$ phase difference.

21. An optical element comprising:

a linear polarizer having at least a curved surface portion, and the liquid crystal diffraction element according to claim 1.

22. The optical element according to claim 21, comprising in the following order:

the liquid crystal diffraction element;

a retardation layer; and the linear polarizer.

23. The optical element according to claim 21, comprising in the following order:

the liquid crystal diffraction element;

a first retardation layer;

the linear polarizer; and a second retardation layer.

24. The optical element according to claim 21, comprising in the following order:

a first linear polarizer;

a first retardation layer;

the liquid crystal diffraction element;

a second retardation layer; and a second linear polarizer.

25. The optical element according to claim 21, comprising in the following order:

a first linear polarizer;

a first retardation layer;

the liquid crystal diffraction element;

a second retardation layer;

a second linear layer; and a third retardation layer.

26. An image display apparatus comprising:

the liquid crystal diffraction element according to claim 1; and a display panel.

27. The image display apparatus according to claim 26, wherein the display panel has at least a curved surface portion.

28. A head mounted display comprising:

the image display apparatus according to claim 26.

29. The liquid crystal diffraction element according to claim 1, wherein the liquid crystal diffraction element comprises a substrate having at least a curved surface portion and the optically anisotropic layer which is disposed on the substrate and has a curved surface portion along the curved surface portion of the substrate, the curved surface portion of the substrate is a convex curved surface or a concave curved surface, in the liquid crystal alignment pattern of the optically anisotropic layer, the one direction in which the direction of the optical axis derived from the liquid crystal compound changes while continuously rotating is provided in a radial shape directed from an inner side toward an outer side.

30. A liquid crystal diffraction element comprising:

an optically anisotropic layer that is formed of a liquid crystal composition containing a liquid crystal compound, wherein the optically anisotropic layer has a liquid crystal alignment pattern in which a direction of an optical axis derived from the liquid crystal compound changes while continuously rotating along at least one in-plane direction, the optically anisotropic layer has at least a curved surface portion, and at least a part of the optically anisotropic layer in a plane has the curved surface portion having a curvature radius of 20 mm to 2,500 mm.

31. The liquid crystal diffraction element according to claim 30, wherein the liquid crystal diffraction element comprises a substrate having at least a curved surface portion and the optically anisotropic layer which is disposed on the substrate and has a curved surface portion along the curved surface portion of the substrate, the curved surface portion of the substrate is a convex curved surface or a concave curved surface, in the liquid crystal alignment pattern of the optically anisotropic layer, the one direction in which the direction of the optical axis derived from the liquid crystal compound changes while continuously rotating is provided in a radial shape directed from an inner side toward an outer side.

* * * * *